(12) United States Patent
Shushakov et al.

(10) Patent No.: US 8,275,270 B2
(45) Date of Patent: Sep. 25, 2012

(54) HIGH-SENSITIVITY, HIGH-RESOLUTION DETECTOR DEVICES AND ARRAYS

(75) Inventors: Dmitry A. Shushakov, Moscow (RU); Vitaly E. Shubin, Moscow (RU)

(73) Assignee: Amplification Technologies Inc., Brooklyn, NY (US)

( * ) Notice: Subject to any disclaimer, the term of this patent is extended or adjusted under 35 U.S.C. 154(b) by 0 days.

(21) Appl. No.: 13/038,327

(22) Filed: Mar. 1, 2011

(65) Prior Publication Data
US 2011/0198615 A1  Aug. 18, 2011

Related U.S. Application Data

(60) Division of application No. 11/450,025, filed on Jun. 9, 2006, now Pat. No. 7,899,339, which is a continuation-in-part of application No. 11/080,019, filed on Mar. 14, 2005, now Pat. No. 7,085,502, which is a continuation of application No. 10/208,530, filed on Jul. 30, 2002, now Pat. No. 6,885,827.

(60) Provisional application No. 60/689,417, filed on Jun. 10, 2005, provisional application No. 60/691,931, filed on Jun. 17, 2005.

(51) Int. Cl.
*H04B 10/06* (2006.01)
*H01L 31/107* (2006.01)
(52) U.S. Cl. .......... 398/202; 257/186; 257/438
(58) Field of Classification Search .......... 398/202; 257/186, 438
See application file for complete search history.

(56) References Cited

U.S. PATENT DOCUMENTS

| | | | | |
|---|---|---|---|---|
| 6,127,692 A * | 10/2000 | Sugawa et al. | ................... | 257/30 |
| 6,624,453 B2 * | 9/2003 | Banghart et al. | ............... | 257/223 |
| 7,271,405 B2 * | 9/2007 | Krishna et al. | ................... | 257/21 |
| 2003/0165314 A1 * | 9/2003 | Nagarajan et al. | ............ | 385/131 |
| 2004/0245592 A1 * | 12/2004 | Harmon et al. | ............... | 257/438 |
| 2005/0230706 A1 * | 10/2005 | Yagyu et al. | ................... | 257/186 |
| 2006/0081874 A1 * | 4/2006 | Francis et al. | ................ | 257/186 |
| 2006/0175529 A1 * | 8/2006 | Harmon et al. | ............... | 250/207 |
| 2008/0135831 A1 * | 6/2008 | Taylor et al. | .................... | 257/24 |

* cited by examiner

*Primary Examiner* — Nathan Curs
(74) *Attorney, Agent, or Firm* — Frommer Lawrence & Haug LLP

(57) ABSTRACT

Avalanche amplification structures including electrodes, an avalanche region, a quantifier, an integrator, a governor, and a substrate arranged to detect a weak signal composed of as few as several electrons are presented. Quantifier regulates the avalanche process. Integrator accumulates a signal charge. Governor drains the integrator and controls the quantifier. Avalanche amplifying structures include: normal quantifier, reverse bias designs; normal quantifier, normal bias designs; lateral quantifier, normal bias designs; changeable quantifier, normal bias, adjusting electrode designs; normal quantifier, normal bias, adjusting electrode designs; and lateral quantifier, normal bias, annular integrator designs. Avalanche amplification structures are likewise arranged to provide arrays of multi-channel devices. The described invention is expected to be used within photodetectors, electron amplifiers, chemical and biological sensors, and chemical and biological chips with lab-on-a-chip applications. Structures have immediately applicability to devices critical to homeland defense.

24 Claims, 45 Drawing Sheets

HIGH-SENSITIVITY, HIGH-RESOLUTION DETECTOR DEVICES AND ARRAYS

CROSS REFERENCE TO RELATED APPLICATIONS

This application is a divisional of U.S. patent application Ser. No. 11/450,025, filed Jun. 9, 2006, now U.S. Pat. No. 7,899,339, which is a continuation-in-part of U.S. patent application Ser. No. 11/080,019, filed Mar. 14, 2005, which is a continuation of U.S. patent application Ser. No. 10/208,530, filed Jul. 30, 2002, now U.S. Pat. No. 6,885,827, and further claims the benefit of U.S. Provisional Applications Nos. 60/689,417, filed Jun. 10, 2005, and 60/691,931, filed Jun. 17, 2005, all of which are incorporated herein by reference in their entirety.

FEDERALLY SPONSORED RESEARCH OR DEVELOPMENT

None.

BACKGROUND OF INVENTION

1. Field of the Invention

The present invention relates to single-channel and multi-channel detectors capable of recording low-level signals which may include as few as several electrons. Specifically, the invention is an amplifying avalanche device wherein amplification is realized via a multi-layered, solid-state intelligent amplifier design. Structures have immediately applicability to devices critical to homeland defense.

2. Background

The detection and recording of low-level signals is particularly challenging to sensor devices. For example, the sensitivity, selectivity, operational range, and arrayed arrangements of such devices require precision detection of signals comprising as few as several electrons.

One widespread approach for detecting and recording low-level signals includes charge-sensitive amplifiers on field-effect transistors having a threshold sensitivity of a few dozen electrons, as described by Albert J. P. Theuwissen in *Solid-State Imaging with Charge-Coupled Device*, published by Kluwer in 1995 (ISBN 0-7923-3456-6).

Another approach includes output video signal amplifiers in a charge coupled device ensuring nearly the same sensitivity as charge-sensitive amplifiers on field-effect transistors.

Yet another approach to sensing weak electrical signals is the use of avalanche amplification or multiplication of signal carriers, which generally is the most sensitive and high-speed method of amplification. Avalanche-type devices include those described by F. Capasso in *Physics of Avalanche Photodiodes in Semiconductors and Semimetals*, published by Academic Press in 1985 Vol. 22.

Avalanche amplification is based on impact ionization arising in a strong electric field, wherein the signal carriers accelerating in an electric field ionize the atoms of the working medium of the amplifier, thus resulting in multiplication (e.g., duplication) of the signal carriers. At a high multiplication factor, however, it is difficult to stabilize the avalanche amplification operating point. Additionally, the internal (excessive) noise level and response time grow rapidly with an increasing multiplication factor. As such, traditional avalanche photodiodes use a rather low multiplication factor, M, typically less than $10^3$, which prevents the detection and recording of signals consisting of several electrons in a wide band.

Avalanche multiplication has also been applied to recording individual ionizing particles using a Geiger-Muller counter, as described by Ekstrom in U.S. Pat. No. 4,303,861. A particle entering such a device initiates an avalanche-like process of multiplication of the signal carriers up to a necessary recording level. More recently, this principle has been successfully used for recording single charge carriers in semiconductor avalanche-type photodiodes. This Geiger-Muller principle of amplification, however, does not allow for distinguishing between signals within one or several input charge carriers (i.e., it does not provide high resolution for a number of charge carriers).

Shushakov et al. in U.S. Pat. No. 6,885,827 describes and claims a system and method for the detection of an input signal by distributing the input signal into independent signal components which are independently amplified, thus uniquely enabling a high amplification factor, low noise, and rapid response speed. The invention includes several steps. A signal is allocated on individual channels of a multi-channel threshold amplifier in such a manner that each channel has only one elementary electric charge. Each channel of the amplifier converts the single electron at the input into a calibrated charge packet at the output. Summation of the output signals of each channel allows the measurement of the value of the few electron electric signals communicated to the input of a discrete amplifier with high accuracy. The calibrated amplification of a single electron at each channel of the discrete amplifier is provided. In addition to a threshold avalanche amplifier, each channel is equipped with an integrator to accumulate an amplified charge signal packet. After receiving a required charge packet, an integrator communicates with a quantifier through a governor, which turns the channel OFF. A governor is used to control the potential of the quantifier and to drain the charge from the integrator for the purpose of transferring the channel back to its initial state.

It may be appreciated, therefore, that there remains a need for further advancements and improvements thus enabling the detection of weak signals. Accordingly, what is required are amplifying avalanche structures, compatible with the system and method provided by Shushakov et al. in U.S. Pat. No. 6,885,827, capable of further advancing and improving the detection of weak signals.

SUMMARY OF THE INVENTION

An object of the present invention is to provide amplifying avalanche structures compatible with the system and method provided by Shushakov et al. in U.S. Pat. No. 6,885,827 and capable of further advancing and improving the detection of weak signals.

In accordance with the present invention, various embodiments of the amplifying avalanche structure are disclosed operating based on the principles described by Shushakov et al. The present invention includes transparent and non-transparent electrodes, avalanche region, quantifier, integrator, governor, and substrate arranged to detect a weak signal composed of as few as several electrons. Avalanche amplifying structures include: normal quantifier, reverse bias designs; normal quantifier, normal bias designs; lateral quantifier, normal bias designs; changeable quantifier, normal bias, adjusting electrode designs; normal quantifier, normal bias, adjusting electrode designs; and lateral quantifier, normal bias, annular integrator designs. Amplifying structures are likewise arranged to form multi-channel devices.

In accordance with several embodiments of the invention, the amplifying avalanche structure operating in the Geiger mode includes two electrodes, an avalanche region, an integrator for the accumulation of a signal charge, a quantifier for turning the avalanche process ON and OFF, and a governor for draining the charge from the integrator consisting of a semiconductor structure disposed on a planar substrate, in which the governor and integrator are disposed sequentially behind one of the electrodes, the avalanche region adjoins the edge periphery of the integrator area in such a manner that there is no electric contact between the avalanche region and the governor, and the quantifier is provided by the integrator surface adjoining the avalanche region. The governor may be composed of the same semiconductor material as the avalanche region but with less doping or having a wider band gap. The substrate on the lower side of the amplifying avalanche structure may be a highly doped layer having the same type of conductivity and composed of the same semiconductor material as the avalanche region. The substrate may also be composed of a semiconductor material of the same conductivity type as, but less doped than, the avalanche region material. On the lower contact side, the substrate may have a highly doped contact layer of the same conductivity type as the avalanche region.

In accordance with other embodiments of the invention, the contact to the avalanche region can be effected through an electrode disposed on the back or bottom side of the substrate or through an electrode disposed on the upper side of the substrate.

In accordance with other embodiments of the invention, the entire upper surface of the amplifying avalanche structure may be covered with a dielectric layer, except for the areas on which the governor is disposed.

In accordance with other embodiments of the invention, the dielectric layer is disposed on the upper surfaces of the integrator and avalanche region, and the electrode contacting the governor layer occupies the entire upper surface of the avalanche structure or the governor with upper electrode is disposed along the surface of the avalanche structure.

In accordance with other embodiments of the invention, the upper electrode may be disposed along the entire surface of the avalanche structure and the electrode may be transparent.

In accordance with other embodiments of the invention, the amplifying avalanche structure may include a signal-transport layer disposed along one side of the avalanche region and composed of the same semiconductor material and conductivity type with at most as much doping as the avalanche region or having a narrower band gap than the avalanche region. The substrate and all layers may be composed of the same semiconductor material, examples including Si, SiC, GaN, GaAs and GaP.

In accordance with other embodiments of the invention, the amplifying avalanche structure may have an additional conductive contact area disposed between the integrator and the governor in such a manner that it has no direct electric contact with the avalanche region and a blocking layer on the upper surfaces of the integrator and avalanche region having no electric contact with the upper electrode contacting the governor. The dielectric layer may be applied onto the entire upper surface of the blocking layer and the upper electrode contacting the governor can occupy the entire upper surface of the avalanche structure. The blocking layer may be composed of a semiconductor material of the same conductivity type and have at most as much doping as the avalanche region. The blocking layer may be composed of a semiconductor material of the opposite conductivity type and have less doping than the avalanche region. The substrate and all layers may be composed of the same semiconductor material, examples including Si, SiC, GaN, GaAs and GaP.

In accordance with other embodiments of the invention, the avalanche amplifying structure operating in the Geiger mode disposed along a planar substrate includes two electrodes, a governor disposed between the substrate and the upper first electrode, an integrator disposed on the side periphery of the governor, and an avalanche region disposed on the external side periphery of the integrator wherein the quantifier is performed by the integrator surface adjoining the avalanche region. The substrate is made of a material with the same conductance type as the avalanche region, but with a higher resistivity. The amplifying structure may include a dielectric layer disposed along the upper surfaces of the integrator and avalanche region, and the upper first electrode contacting the governor layer covers the entire upper surface of the avalanche structure. The amplifying structure on the upper surfaces of the integrator and avalanche region may include a blocking layer comprised of a semiconductor with the same conductance type as the avalanche region, but with a higher resistivity. No electric contact is permitted by the blocking electrode with the upper electrode in contact with the governor.

In accordance with other embodiments of the invention, the amplifying avalanche structure operating in the Geiger mode includes two electrodes, an avalanche region, an integrator for the accumulation of a signal charge, a quantifier for turning the avalanche process ON and OFF, and a governor for draining the charge from the integrator, in which the governor and integrator are disposed sequentially behind one of the electrodes, the avalanche region adjoins the edge periphery of the integrator to avoid electric contact by the avalanche region with the governor, and the quantifier is provided by the integrator surface adjoining the avalanche region including a third electrode disposed on the dielectric layer contacting the avalanche region. The substrate may be composed of a semiconductor material with the same conductivity type, but less doped, than the avalanche region material. Furthermore, a conductive contact area may be disposed between the integrator and the governor so as to avoid direct electric contact with the avalanche region and between the surfaces of the integrator and the avalanche region, on the one side, and the dielectric layer, on the other side, a blocking layer may be disposed of a semiconductor material of the same conductivity type as that of the avalanche region but with a lower doping impurity concentration.

In accordance with other embodiments of the invention, the amplifying avalanche structure operating in the Geiger mode may include an avalanche region, an integrator for the accumulation of a signal charge, a quantifier for turning the avalanche process ON and OFF, and a governor for draining the charge from the integrator and controlling the quantifier disposed on a heavily doped substrate between two electrodes, on which there are disposed layers of an avalanche region composed of a material with the same conductivity type but having a higher resistivity. The integrator may be composed of a heavily doped semiconductor material having a conductivity opposite that of the substrate, a governor of a high-impedance semiconductor material, and the quantifier provided at the interface between the avalanche region and integrator. The integrator may have a low conductance in directions parallel to the substrate plane. The substrate and all layers of the amplifying avalanche structure, except the governor, may be composed of the same semiconductor material. The governor layer may be composed of the same material or of a material having a wider band gap than that of which the other layers and the substrate are composed. The amplifying avalanche structure may include a signal-transport layer capable of generating free charge carriers and transporting the charges into the avalanche region. The substrate and all layers may be composed of the same semiconductor material, examples including Si, SiC, GaN, GaAs and GaP.

In accordance with other embodiments of the invention, the avalanche amplifying structure operating in the Geiger mode includes a planar laminated semiconductor structure mounted on a substrate between two electrodes, in which the layers of the avalanche region and governor capable of draining the charge from the integrator and controlling the quantifier are disposed sequentially one after another, and the function of the integrator capable of accumulating a signal charge and the function of the quantifier for turning the avalanche process ON and OFF are performed at the interface between the avalanche region and the governor. The interface between the avalanche region and governor may have a low conductance in directions parallel to the substrate plane.

In accordance with other embodiments of the invention, the avalanche amplifying structure operating in the Geiger mode may consist of a planar laminated semiconductor structure, disposed between two electrodes on a heavily doped substrate on which there are arranged in succession the layers of the avalanche region composed of a semiconductor with the type of conductance opposite that of the substrate, and a governor composed of a high impedance semiconductor material so that the quantifier is provided at the interface between the substrate and avalanche region, and the integrator is provided at the interface between the avalanche region and governor.

In accordance with other embodiments of the invention, the avalanche amplifying structure operating in the Geiger mode may consist of a planar laminated semiconductor structure, disposed between two electrodes on a heavily doped substrate, on which there are arranged in succession the layers of a governor composed of a high-impedance semiconductor material, an integrator composed of a heavily doped material with the same conductance type as the substrate material, and an avalanche region composed of a semiconductor having the conductance type opposite that of the substrate so that the quantifier is provided at the interface between the avalanche region and the integrator. All layers and the substrate may be composed of the same semiconductor material or all layers, except for the governor, may be composed of the same semiconductor material, and the governor layer composed of a material having a wider band gap than the other layers and substrate. A signal-transport layer may be disposed between the upper electrode and the avalanche region and capable of generating free charge carriers and transporting the charges into the avalanche region. All layers, except for signal-transport layer, may be composed of the same semiconductor material, whereas the signal-transport layer may be composed of a narrower band gap semiconductor material or a high-resistance semiconductor material with the same conductance type as the avalanche region. The substrate and all layers may be composed of the same semiconductor material, examples including Si, SiC, GaN, GaAs and GaP.

The ensuing disclosure is set forth to first describe various illustrative individual or single structures which may be used in a standalone manner or may be integrated into matrixes of a discrete amplifier. That is, in principle, each individual structure can be used as a self-contained functional device similar to a Geiger avalanche photodiode, or single photon avalanche diodes (SAPDs), or internal discrete amplifier, but are also particularly well suited for integration to provide a multi-channel internal discrete amplifier, or multi-channel Geiger mode amplifier, or multi-channel SAPD array.

Following the disclosure of illustrative embodiments of the basic, discrete amplifying structures, including illustrative claims corresponding to such and additional structures, there is described various illustrative embodiments of multi-channel discrete amplifiers based on arrays of such illustrative discrete device structures.

It will be appreciated by those skilled in the art that the description herein, including the disclosure provided by the illustrative claims section, is illustrative and explanatory of this invention, but is not intended to be restrictive thereof or limiting of the advantages which can be achieved by this invention. Thus, the drawings constituting illustrate various preferred embodiments of the invention, and, together with the description and illustrative claims, serve to explain the principles of this invention. Further, the illustrative claims are not intended as limiting the scope of the invention as conceived, contemplated, and intended by the inventors, but are set forth to provide additional understanding and disclosure of the subject matter embraced by the present invention. In this respect, these illustrative claims are shown together with, and refer to, illustrative embodiments that they embrace, and such juxtaposition and referencing of the illustrative claims and drawings is not intended to limit the claims to the embodiment, nor the scope of the invention to the illustrative claims recited herein.

It is, therefore, understood by those skilled in the art that the embodiments and alternative implementations and variations described herein are merely illustrative of the present invention, which is not limited thereto. For instance, in accordance with an illustrative non-limiting feature of the various embodiments, these devices may be completely homogeneous semiconductor devices, such as being based entirely on silicon. Those skilled in the art understand, however, that these devices may be implemented with other materials, including compound semiconductors, and need not be homogeneous, but may include heterogeneous components. More specifically, by way of example, although the ensuing illustrative embodiments each use monocrystalline silicon as the semiconductor material throughout the device, those skilled in the art understand that other monocrystalline, polycrystalline, elemental, and/or compound semi-conducting materials may be used to implement one or more component(s), layer (s), or part(s) of the discrete devices and/or arrays. Similarly, while the ensuing illustrative embodiments employ homojunctions and hetero-junctions, metal-semiconductor junctions may be employed to achieve the desired functionality. For instance, the governor may be implemented via a wider band gap material, while the signal transport region has a lower band gap material than the other layers. Furthermore, various other insulating and conductive (e.g., metal) materials may be employed other than those explicitly described herein, as understood by those skilled in the art.

Accordingly, although the herein disclosure of illustrative embodiments of the present invention, as well as various illustrative modifications and features thereof, provides many specificities, these enabling details should not be construed as limiting the scope of the invention, and it will be readily understood by those persons skilled in the art that the present invention is susceptible to many modifications, adaptations, variations, and equivalent implementations without departing from this scope and without diminishing its attendant advantages. It is further noted that the terms and expressions have been used as terms of description and not terms of limitation. There is no intention to use the terms or expressions to exclude any equivalents of features shown and described or portions thereof. It is therefore intended that the present invention is not limited to the disclosed embodiments but should be defined in accordance with the claims that will be presented in any non-provisional applications claiming the benefit of this provisional application.

The present invention provides several advantages over the related arts. The invention facilitates self-contained highly sensitive instruments for recording and counting individual electrons and photons. The invention is applicable to single and multi-channel devices. The invention uniquely enables the construction of detectors having a high amplification factor, low noise, and rapid response speed.

DESCRIPTION OF THE DRAWINGS

Additional aspects, features, and advantages of the invention will be understood and will become more readily apparent when the invention is considered in the light of the following description made in conjunction with the accompanying drawings, wherein.

DESCRIPTION OF THE INVENTION

Figure 1A:
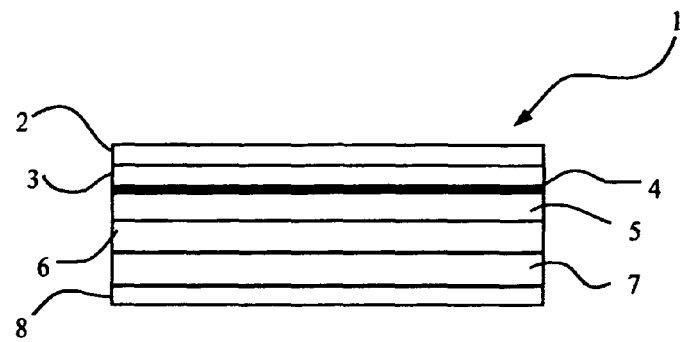
FIG. 1A-1C are schematic cross-section views for several illustrative embodiments of the present invention comprising an avalanche amplifying structure with a reverse-bias direction of avalanche showing the positional relationship of electrodes, avalanche region, quantifier, integrator, governor, substrate, and optional signal transport layer.

This application is based upon and claims priority under 35 U.S.C. §119(e) from U.S. Provisional Applications No. 60/689,417 filed Jun. 10, 2005 and No. 60/691,931 filed Jun. 17, 2005, entitled "High Sensitivity, High Resolution Detector Devices and Arrays", the contents of which are hereby incorporated in their entirety by reference thereto.

Where possible, reference numerals as used herein below correspond to reference numerals as used in U.S. Pat. No. 6,885,827 B2, and in U.S. patent application Ser. No. 11/080,019, filed Mar. 14, 2005, both entitled "High Sensitivity, High Resolution Detection of Signals," each of which have the same inventive entity and are subject to common ownership as the instant application, and each of which is herein incorporated in its entirety by reference thereto.

The description below includes single channel devices identified as (1) normal quantifier, reverse bias designs, (2) normal quantifier, normal bias designs, (3) lateral quantifier, normal bias designs, and (4) changeable quantifier, normal bias designs. The designs describe and claimed herein may be arranged into a variety of array configurations providing an infinite number of array designs. Various embodiments are shown with a light 26 impinging at least one electrode. Low doping is generally understood to mean less than $10^{15}$ cm$^{-3}$ and heavily doped or high doping means more than $10^{17}$ cm$^{-3}$. Devices described herein are manufactured via methods understood in the art.

By way of background, functionality of the governor is provided by its higher impedance in comparison to the avalanche layer. The high impedance is achieved by various approaches, described in U.S. Pat. No. 6,885,827, including low doping level, a material with low mobility for carriers, or with artificially reduced mobility by special treatments. The potential bathers between the governor layer and adjoining layers are also used to achieve the desired impedance. The barrier height is regulated by the doping within the governor and adjoining layers. If the adjoining layer is metal, the barrier may be regulated by its work function.

The governor functions to govern or regulate the potential of the quantifier which then transfers this potential to the electric field, thus switching the threshold amplifier to ON or OFF state and to drain accumulated charge from the integrator so as to return the integrator to its initial state.

The high imaging part of impedance (due to the element inductance, shifting current phase relative to the voltage phase) provides the desired functionality of the governor meaning the governor has very low conductivity for a short time while the signal carrier is multiplied, thus all of the generated charge is accumulated effectively nearly without drain. On the other hand, after a short time (delay) the conductance becomes high (equal to the real part of impedance) allowing the accumulated charge to drain and quick return to the initial state.

The high imaging part of impedance is provided by material properties (low mobility of carriers) or the presence of potential barriers between the governor and adjoining layers. Material properties lead to a current delay relative to the applied voltage. Low mobility may be achieved by ion implantation (and other special treatments) or may be a property of the material itself. The barrier prevents the accumulated charge (i.e., electrons) from the integrator to flow to the governor immediately and the second barrier at the other side of the governor for the other type of carriers (i.e., holes).

Single Channel Devices—Normal Quantifier, Reverse Bias

Referring now to FIG. 1A, a single channel element is shown for one embodiment of the avalanche amplifying structure 1 operating in the Geiger mode with a reverse-bias supplied voltage. The avalanche amplifying structure 1 is a generally planar structure including a first electrode 2, an avalanche region 3, a quantifier 4, an integrator 5, a governor 6, a substrate 7, and a second electrode 8 arranged and contacting in the order described. The avalanche region 3 includes a plurality of semiconductor layers with a conductance opposite that of a heavily doped substrate 7. The governor 6 is a weakly doped semiconductor material whereby the quantifier 4 is provided at the interface between the integrator 5 and avalanche region 3. Likewise, the integrator 5 is provided between the governor 6 and avalanche region 3.

Figure 1B:
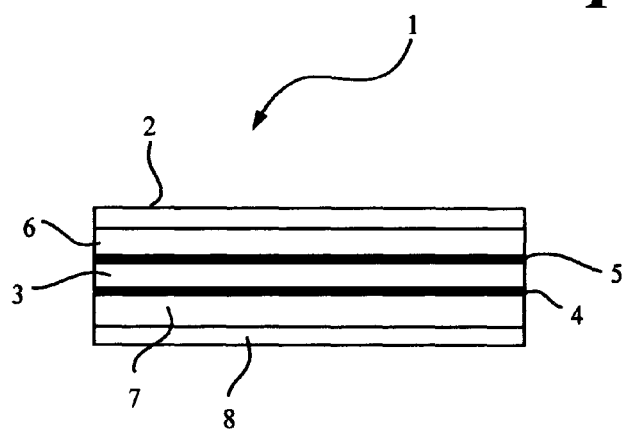

Referring now to FIG. 1B, an alternate embodiment of the reverse-bias avalanche amplifying structure 1 operating in the Geiger mode is shown including a first electrode 2, a governor 6, an integrator 5, an avalanche region 3, a quantifier 4, a substrate 7, and a second electrode 8 in the order described. The avalanche region 3 includes a plurality of semiconductor layers with a conductance opposite that of a heavily doped substrate 7. The quantifier 4 is provided at the interface between the substrate 7 and avalanche region 3. The integrator 5 is provided at the interface between the governor 6 and avalanche region 3.

Figure 1C:
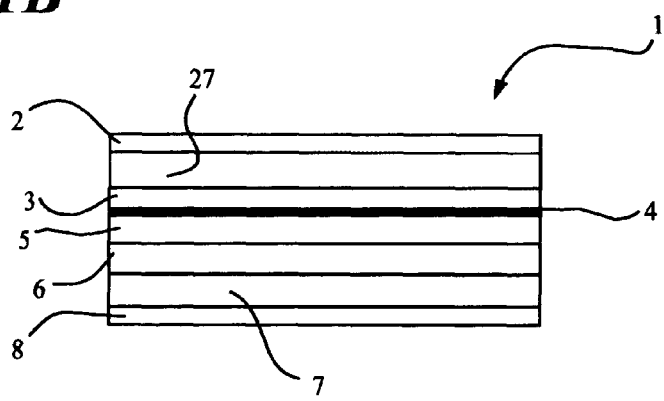

Referring now to FIG. 1C, an other alternate embodiment of a reverse-bias avalanche amplifying structure 1 operating in the Geiger mode is shown wherein a signal transport layer 27 is provided between the first electrode 2 and the avalanche region 3 shown in FIG. 1A. The quantifier 4 is provided at the interface between the integrator 5 and avalanche region 3.

A variety of materials are applicable to the avalanche region 3, quantifier 4, integrator 5, governor 6, substrate 7 and signal transport layer 27 in FIGS. 1A-1C. For example, each layer may be composed of the same or different semiconductor materials, examples including Si, SiC, GaN, GaAs, and GaP, which are doped to provide the desired electrical properties. In other embodiments, the governor 6 may be composed of a material having a band gap wider than that of the other layers. In yet other embodiments, the signal transport layer 27 may be composed of a material having a band gap narrower than the other layers. In still other embodiments, the first electrode 2 and/or second electrode 8 may be composed of a conductive metal or light transmissive and conductive material, examples including without limitation transparent ITO and Al-doped ZnO. Furthermore, the avalanche region 3, quantifier 4, integrator 5, governor 6, and substrate 7 and signal transport layer 27 may include two or more layers arranged to form a laminated structure with or without inclusions or regions with yet other non-doped and doped semiconductor materials. Layers and devices may include planar and non-planar shapes. Likewise, the sectional views may represent structures of planar and/or diametric extent. The SiO$_2$ layer may be composed of other comparable materials.

Figure 2A:
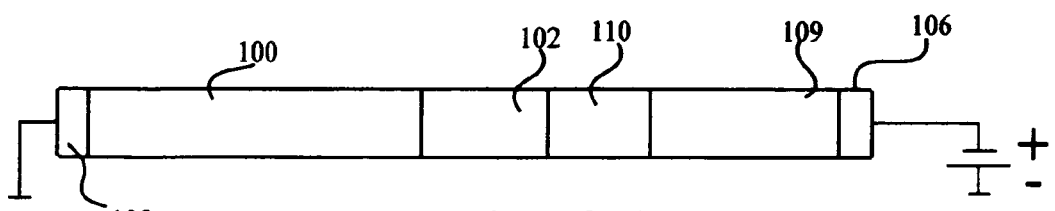
FIG. 2A shows a sequence of material layers corresponding to the structure of FIG. 1A.

Referring now to FIG. 2A, a sequence of material layers are shown to correspond with one exemplary embodiment of the avalanche amplifying structure 1 shown in FIG. 1A. The device includes a transparent electrode 105, a p-Si layer 100, n$^+$-Si layer 102, a i-Si layer 110, an n$^+$-Si layer 109 and an electrode 106. The electrode 106, preferably a metal, is electrically connected to a power supply having a positive voltage $U_{sup}$ and the transparent electrode 105 is electrically connected to ground.

Figure 2B:
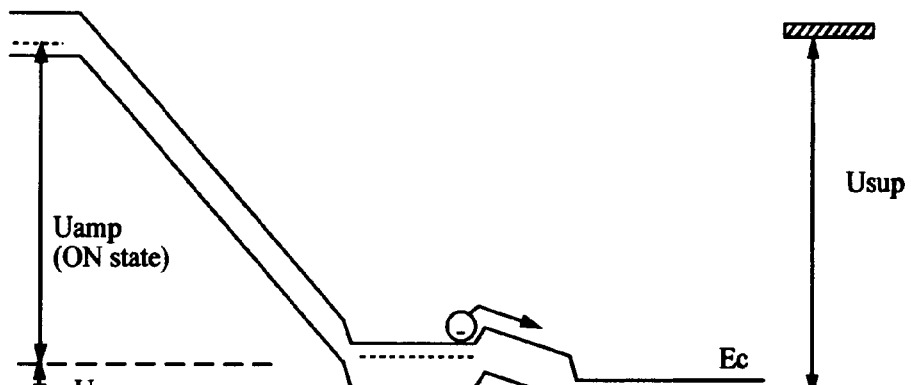
FIGS. 2B-2C depict energy band diagrams corresponding to the material layer structure shown in FIG. 2A during various operational conditions of the amplifier.
Figure 2C:
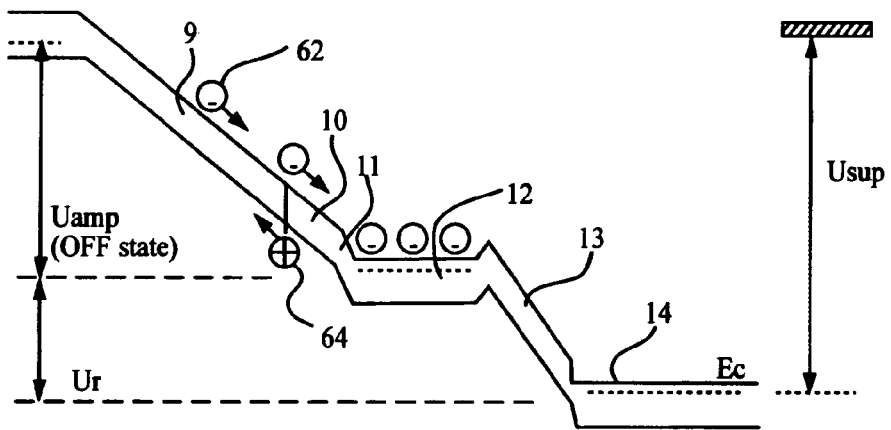

Referring now to FIGS. 2B-2C, band diagrams are provided to illustrate the function of the device in FIG. 2A. FIG. 2B shows the initial state of the device, before the appearance of a signal carrier, such that a positive voltage $U_{sup}$ is applied to the electrode 106, the n$^+$-Si layer 109 has the potential of the electrode 106, and the heavily-doped n$^+$-Si layer 102 is discharged and operating as a floated electrode to acquire nearly the same potential as the n$^+$-Si layer 109. In this example, nearly all of the voltage is applied to the p-Si layer 100. The voltage should be sufficient so that the voltage drop in the p-Si layer 100 ($U_{amp}$) exceeds the avalanche breakdown value in the ON state. In this example, the p-Si layer 100 is an avalanche threshold or Geiger mode amplifier. It is seen from FIG. 2B that the voltage applied to amplifier ($U_{amp}$) is equal to $U_{sup}-U_r$, where $U_r$ results from a small voltage drop in the i-Si layer 110. If $U_r$ is initially too high, it will decrease over time because of the field-enhanced thermoemission or discharging current associated with electrons from the n$^+$-Si layer 102 to the n$^+$-Si layer 109 over the potential barrier shown in FIG. 2B. The i-Si layer 110 may be composed of an i-type, weakly doped p-type, or weakly doped n-type semiconductor material. Doping within the i-Si layer 110 regulates the potential barrier height between the governor and adjoining layers. The n$^+$-Si layer 102, which corresponds to the integrator 5 in FIG. 1A, discharges in the absence of charging current from the p-Si layer 100, until its potential is nearly equal to the potential of the electrode 106.

Referring now to FIG. 2C, when a free carrier (electron) appears in the high field area of the p-Si layer 100, it initiates the over breakdown avalanche multiplication producing new electron 62 and hole 64 pairs by a zone-zone impact ionization process. Avalanche electron current quickly increases in time and becomes larger than the flow-out current from the n$^+$-Si layer 102 and electrons 62 generated within the p-Si layer 100 quickly charge the integrator 5 or n$^+$-Si layer 102. The described behavior decreases the voltage drop within the amplifier or the p-Si layer 100 and turns off the avalanche process so that the amplifier is switched to the OFF state.

The voltage drop on the amplifier is associated with the voltage rise in the i-Si layer 110 or governor 6, causing redistribution of the supplied voltage between amplifier and governor 6. The governor 6 induces a delay in the discharge of the integrator 5, shifting current phase in time with respect to the avalanche current. This delay is sufficient to terminate the avalanche process within the amplifier.

While not intending to be bound by theory, the discharge delay may have one or more physical causes dependent on the device state, as well as the design and properties of the governor 6. For example, initially, when the voltage $U_r$ is low, thermoemission or discharge current is small in comparison to the avalanche or charging current to the integrator 5. When $U_r$ increases, the dominant reason may include the self-limitation of the out-flow current by space-charge effects, the finite time of flight of free-carriers through the governor 6, the lower mobility of carriers within the governor 6 in comparison to those in the amplifier, or other physical mechanisms that limit current discharge or shift its phase in comparison to the avalanche current. The minimal delay time sufficient to turn the amplifier to the OFF state is estimated to be in the range of about 10-400 picoseconds, depending on the device design and desired gain, thus representing the number of elementary charges accumulated within the integrator 5 in response to one signal carrier.

After the amplifier is switched to the OFF state, charging current to integrator 5 becomes zero and the integrator 5 discharges through governor 6, the amplifier is switched back to the ON state, and the device returns to the initial state shown in FIG. 2B.

The result from the avalanche multiplication charge accumulated within the integrator 5 may be read out through the mutual capacitance of the heavily-doped n$^+$-Si layer 102 and n$^+$-Si layer 109 divided by the i-Si layer 110 (capacitive reader) or by detecting the integrator 5 discharge current through governor 6 or current reader. Both read out approaches lead to the appearance of charge in the electrode 106 corresponding to charge accumulated within the integrator 5.

Figure 2D:
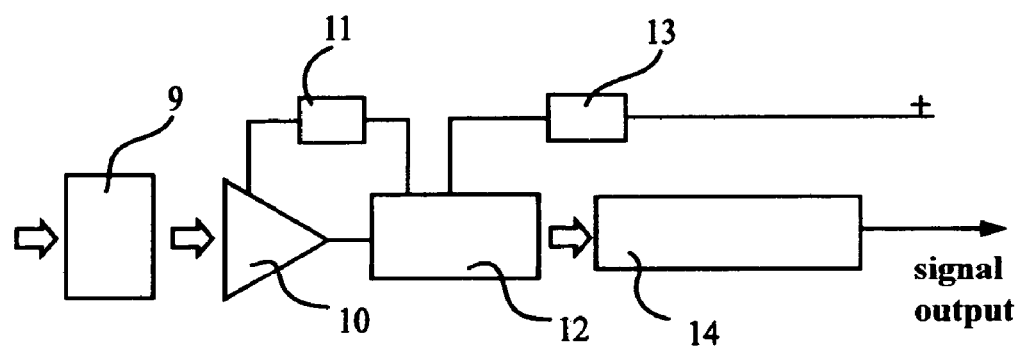
FIG. 2D depicts functional components of the avalanche amplifying structure shown in FIG. 1A.

Referring now to FIG. 2D, the functional scheme of the discrete amplifier is shown with reference to the corresponding physical representation of the device in FIG. 2A. The functional scheme is shown including a transporter 9, a threshold amplifier 10, a quantifier 11, an integrator 12, a governor 13, and a reader 14.

The transporter 9 corresponds to a portion of the p-Si layer 100, where the electric field is not-zero. Free electrons collide within the transporter 9 and are delivered to the input of the threshold amplifier 10.

The threshold amplifier 10 corresponds to a portion of the p-Si layer 100, where the electric field is sufficient for impact ionization in the ON state. Voltage drop within the p-Si layer 100 exceeds the breakdown voltage, thus allowing the threshold amplifier 10 to operate in the Geiger mode.

The quantifier 11 corresponds to the interface between the p-Si layer 100 and the n$^+$-Si layer 102. The potential of the quantifier 11 regulates the avalanche process (electric field strength) in the threshold amplifier 10. For a planar quantifier 11, the transfer constant is equal to one. For non-planar designs, transfer constants greater than one are possible based upon the curvature of the design which causes field concentrations so that the maximal field becomes higher for the same electric potential. The quantifier 11 functions to transfer the integrator 12 potential to the field strength which defines the avalanche intensity. The transfer constant may be defined as the reaction or increase of the field intensity with respect to the increase of the potential.

The integrator 12 is shown within the n$^+$-Si layer 102 as it accumulates current from the threshold amplifier 10 and regulates the potential of the quantifier 11.

The governor 13 is shown within the i-Si layer 110, since it regulates the discharge current from the integrator 12 and delays discharge to turn the threshold amplifier 10 to the OFF state, as well as returning the device to its initial state after amplification of a charge carrier.

The reader 14, a capacitive variant, has a capacity comprised by the n$^+$-Si layer 102, the i-Si layer 110, and the n$^+$-Si layer 109. As such, the charge accumulated within the integrator 12 induces the appearance of the opposite sign charge in the n$^+$-Si layer 109 and on the second electrode 106, electrically coupled thereto.

The band diagrams in FIGS. 2B-2C further show the p-Si layer 100 with an un-depleted region close to the first electrode 105. A typical p-Si layer 100 is 5-6 µm wide having a resistivity of 4 Ohm-cm. In alternate embodiments, the width of the p-Si layer 100 may less than the depleted region width so that the electric field reaches the interface between the p-Si layer 100 and the first electrode 105, thus allowing photocarriers generated by light close to the interface to be gathered effectively. In some embodiments, it may be desired to prevent electron injection from the electrode 105 into the p-Si layer 100 when the electric field reaches the interface. As such, the electrode 105 may have a Shottky barrier for electrons or a p$^+$ region placed between the electrode 105 and the p-Si layer 100.

It is readily apparent from the description above that the present invention operates as a Geiger counter, using a new internal scheme of quenching integrated within the device which differs from both active and passive quenching known within the art. Active quenching requires external or integrated active electronics which is not provided by the functionality described above. Passive quenching requires a resistor or a resistive layer which is not provided by the functionality described above.

FIGS. 3, 5, and 6A-6B refer to specific embodiments of the illustrative devices.

Figure 3:
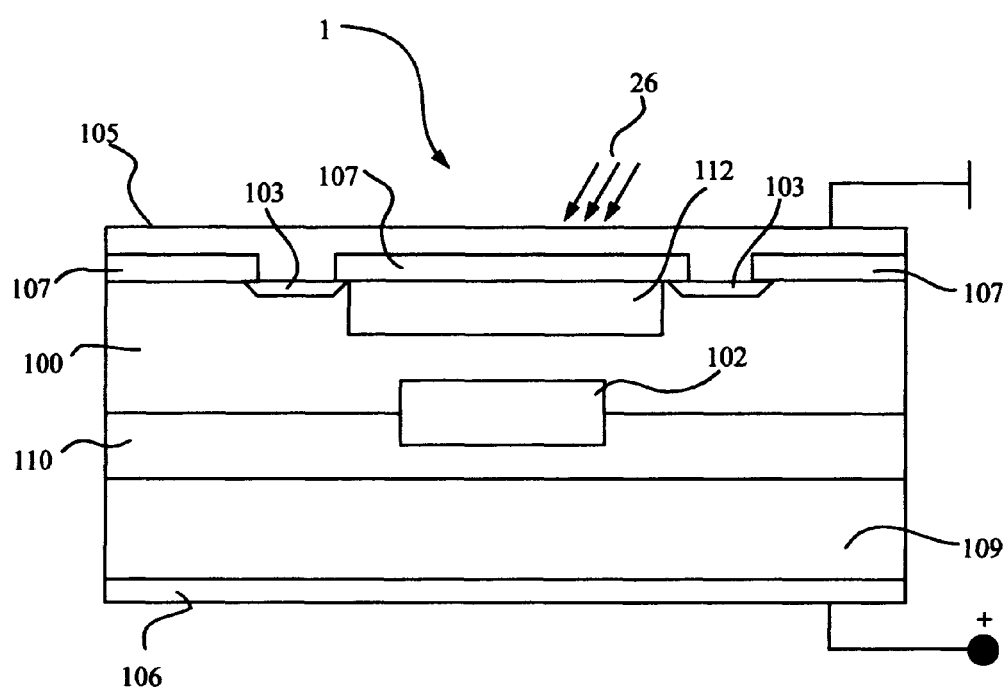
FIG. 3 shows a cross-sectional view of a reverse-bias avalanche amplifying structure with both hole and electron integrators, in accordance with an embodiment of the present invention.

Referring now to FIG. 3, a reverse-bias avalanche amplifying structure 1 with both hole and electron integrators is shown for one embodiment of the present invention. The device includes a transparent electrode 105, a segmented SiO$_2$ layer 107 (insulator), p$^+$-Si regions 103 (heavily doped region), a p-Si region 112, a p-Si layer 100, a p$^-$-Si layer 110, a n$^+$-Si layer 102, a n$^+$-Si layer 109, and an electrode 106. The thickness of the p-Si layer 100 should be sufficiently small so that it is fully depleted to increase shortwave sensitivity. Preferred embodiments of the p-Si layer 100 include a doping of 2-3 Ohm-cm and a thickness of 2.5-3 µm. The spectral range for such a device is from 300-400 nm (shortest wavelength depending on the electrode 105 material) and up to 700-800 nm. For longer wavelength spectral sensitivity up to 1060 nm, the width of the p-Si layer 100 is increased and the doping level decreased.

One or more p$^+$-Si regions 103 are included to block the injection of electrons from the transparent electrode 105 to the depleted p-Si layer 100. The p$^+$-Si regions 103 may be not necessary if the p-Si layer 100 is not fully depleted and the field does not reach the transparent electrode 105; however, generally, this would provide very low spectral sensitivity for short wavelengths that generate photo-carriers close to the top surface of the p-Si layer 100. If this area is not depleted, photocarriers will recombine and be lost. The resultant device is operable, but not optimal. However, where the field reaches the transparent electrode 105 (a more optimal variant), then p$^+$-Si regions 103 are required to block the injection of electrons. In preferred embodiments, the p-Si layer 100 is 2-4 µm thick with a resistivity of 10 Ohm-cm.

The p-Si region 112 is preferred to be composed of the same material, have the same active impurity doping, and have lower mobility for holes in the lateral direction along the Si—SiO$_2$ interface of the p-Si layer 100. The p-Si region 112 is formed by neutral impurities doping, irradiation, or p with n doping.

Figure 4:
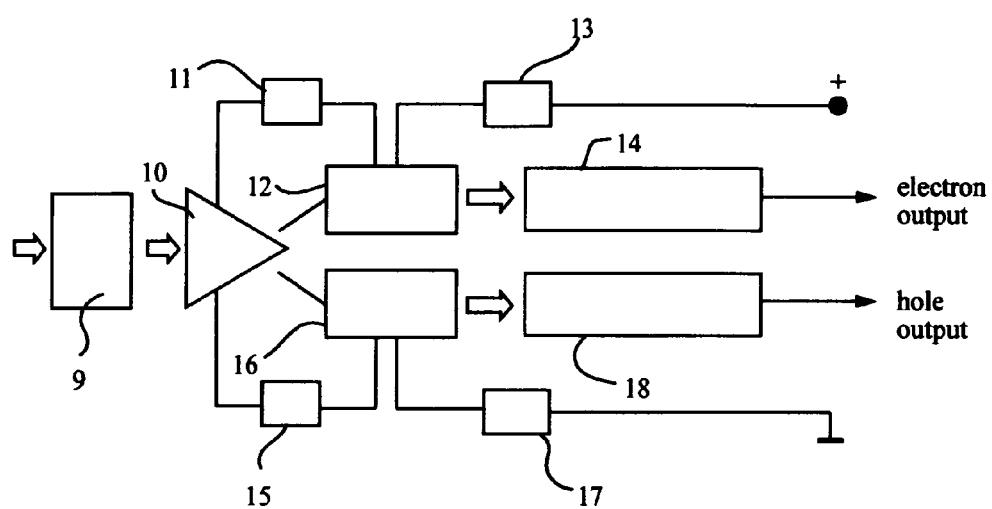
FIG. 4 depicts functional components of the avalanche amplifying structure shown in FIG. 3.

Referring now to FIG. 4, the functional scheme for the embodiment in FIG. 3 is shown. Unlike the device in FIG. 2A, the FIG. 3 device includes two integrators 12, 16 and two governors 13, 17, thus delaying the discharge of corresponding integrators 12, 16 to function as an electron governor, as described for the i-Si layer 110 in FIG. 2A, and to function as a hole governor corresponding to the p-Si region 112.

When the avalanche in the p-Si layer 100 is initiated by a free carrier, holes 64 are accumulated at the interface in the p-Si region 112 or hole integrator, thus increasing the potential of the top surface of the p-Si layer 100 in comparison to that of the transparent electrode 105. This potential increase is localized just above the n$^+$-Si layer 102. The voltage drop in the p-Si layer 100 (U$_{amp}$) decreases until the accumulated positive charge flows to the p$^+$-Si region 103 and then to the transparent electrode 105. It is readily apparent that the hole governor operates in a similar manner as the p$^-$-Si layer 110. The resultant delay time depends on mobility of the holes moving along the interface in the p-Si region 112.

Referring again to FIG. 4, the transporter 9, threshold amplifier 10, and quantifier 11 regulate the avalanche process, transferring the electron integrator 12 potential to the threshold amplifier 10 at the interface between the n$^+$-Si region 102 and p-Si layer 100. The quantifier 17 regulates the avalanche process, transferring the hole integrator potential to the threshold amplifier 10 at the interface between the Si and SiO$_2$ layer 107 above the n$^+$ Si region 102 and the electron integrator 12 is placed in the n$^+$ Si region 102. The hole integrator 16 is placed at the interface between the p-Si region 112 and SiO$_2$ layer 107 above the n$^+$-Si region 102. The electron governor 13 delays the discharge of the electron integrator 12 following the removal of the accumulated electron charge. The hole governor 17 delays the discharge of the hole integrator 17 following the removal of the accumulated hole charge, which corresponds to the p-Si region 112, electron reader 14 and hole reader 18.

The functional scheme in FIG. 2D changes to the functional scheme in FIG. 4 when the electric field reaches the p-Si region 112 and when the p-Si layer 100 and p-Si region 112 are fully depleted.

Figure 5:
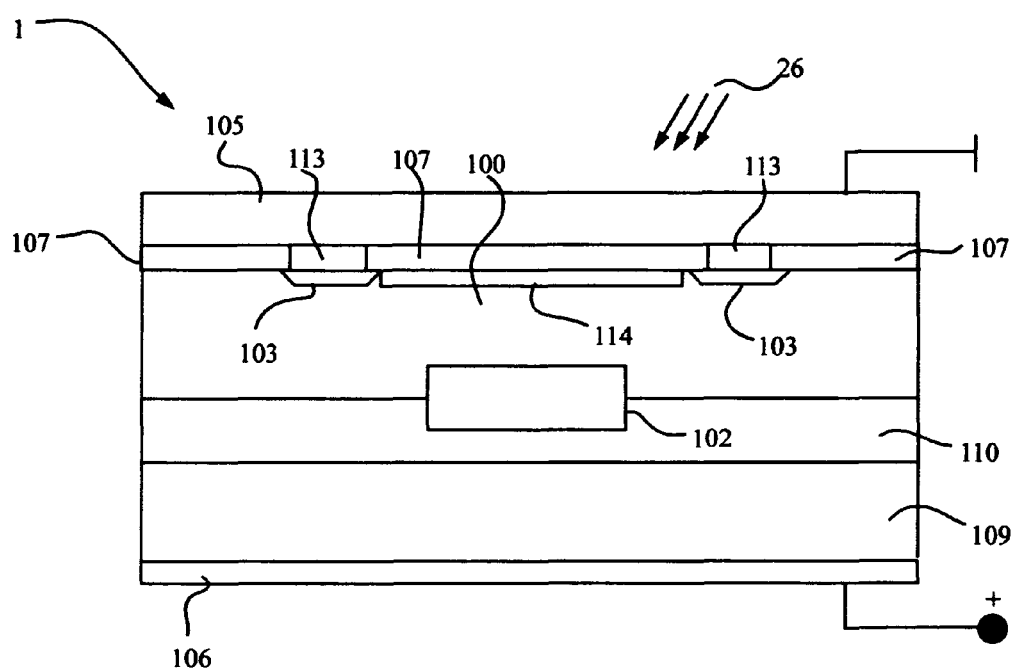
FIG. 5 shows a cross-sectional view of a reverse-bias avalanche amplifying structure with hole, electron integrators, and buried channel for holes, in accordance with an embodiment of the present invention.

Referring now to FIG. 5, an alternate embodiment of the device in FIG. 4 is shown wherein the p-Si region 112 is removed and replaced with a buried channel 114 for holes and an i-Si region 113 (second governor) is added to separate the p$^+$-Si region 103 from the transparent electrode 105. The second governor is composed of a high-impedance semiconductor material between the first or transparent electrode 105 and the p$^+$-Si regions 103 (heavily doped regions) and residing with the opening or cavity within the SiO$_2$ layer 107. A second integrator is formed at the interface between the avalanche region and said second governor. The buried channel 114 is a thin layer, preferably 0.3 µm, with n-doping and fabricated via methods known within the art. The buried channel 114 improves the mobility of holes along interface of the channel. The doping concentration within the buried channel should be sufficient so that it is fully depleted by field in the p-Si layer 100.

The buried channel 114 ensures that all the holes generated by the avalanche in the p-Si layer 100 quickly move along layer and are accumulated within p$^+$-Si region 103 or hole integrator. The result is a charging of the p$^+$-Si region 103 which increasing its potential with respect to the transparent electrode 105. The p$^+$-Si region 103 and i-Si region 113 operate in the same manner. The result is a voltage drop within the i-Si region 113 and a delay in discharging and switching of the threshold amplifier to the OFF state. The hole quantifier in this device is the interface between the buried channel 114 and the p-Si layer 100.

Charging of the p$^+$-Si region 103 causes a charge to the holes accumulating in buried channel 114 and a uniform increase of the potential within the buried channel 114, so that the buried channel 114 is included in the capacitance of the hole integrator.

Figure 6A:
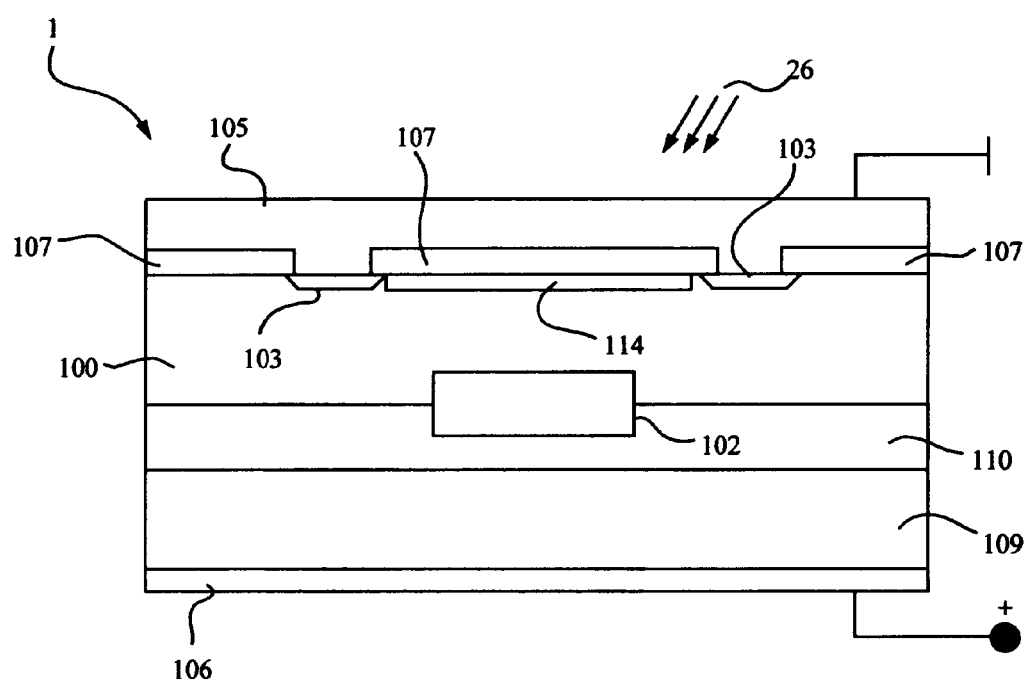
FIGS. 6A-6B shows a cross-sectional view of two reverse-bias avalanche amplifying structures, in accordance with embodiments of the present invention.
Figure 6B:
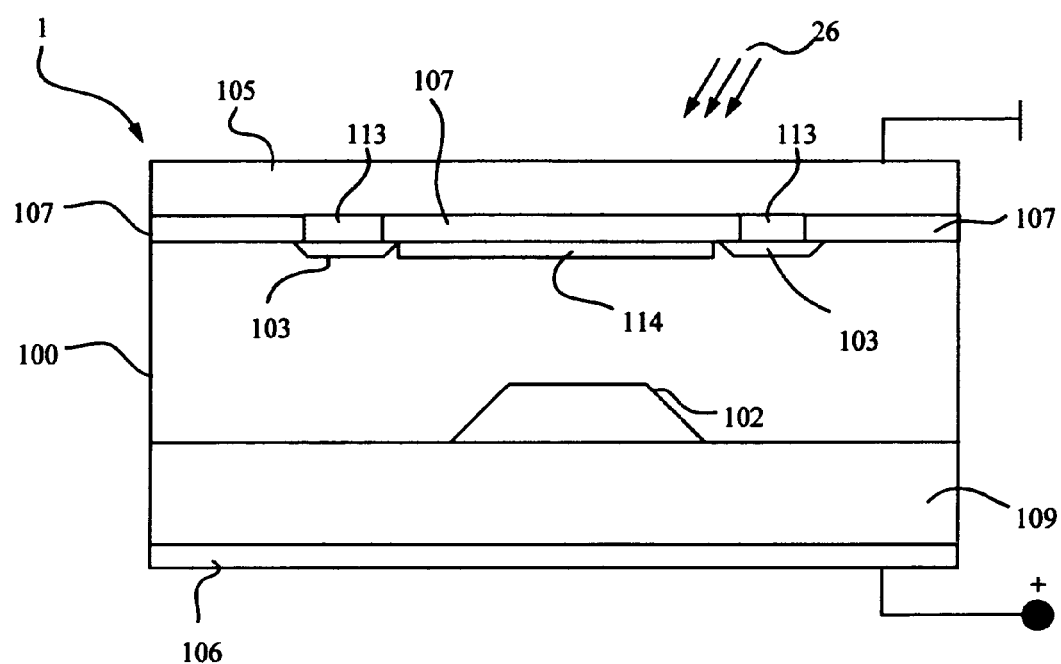

Alternate embodiments to the device in FIG. 5 are shown in FIGS. 6A-6B. For example in FIG. 6A, the i-Si region 113 is eliminated from FIG. 5. Whereas in FIG. 6B, the p$^-$-Si layer 110 is eliminated. Likewise, it is possible for the devices in FIGS. 6A-6B to be made without the buried channel 114.

Single Channel Devices—Normal Quantifier, Normal Bias

Figure 7A:
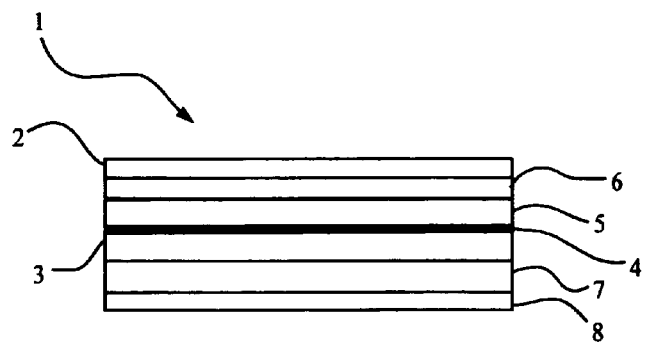
FIG. 7A-7C are schematic cross-section views for several illustrative embodiments of the present invention comprising an avalanche amplifying structure with normal direction of avalanche showing the positional relationship of electrodes, avalanche region, quantifier, integrator, governor, substrate, and optional signal transport layer.
Figure 7B:
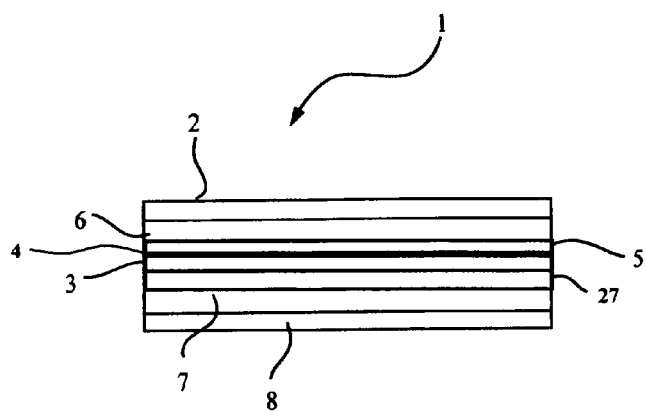
Figure 7C:
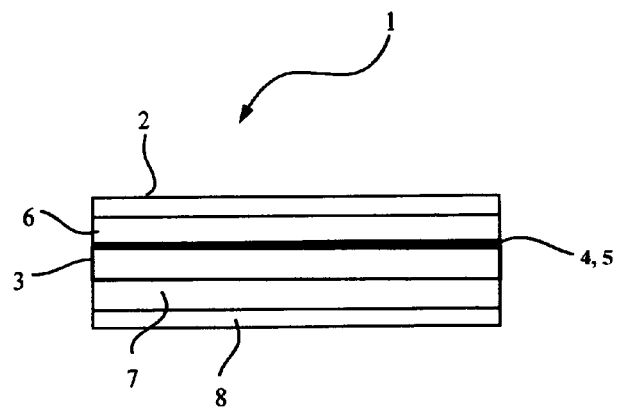

A variety of materials are applicable to the layers and regions in FIGS. 7A-7C. For example, each layer may be composed of the same or different semiconductor materials, examples including Si, SiC, GaN, GaAs and GaP, which are doped to provide the desired electrical properties. In other embodiments, the governor 6 may be composed of a material having a band gap wider than that of the other layers. In yet other embodiments, the signal transport layer 27 may be composed of a material having a band gap narrower than the other layers. In still other embodiments, the first electrode 2 and/or second electrode 8 may be composed of a conductive metal or light transmissive and conductive material, examples including without limitation transparent ITO and Al-doped ZnO. Furthermore, layers and regions may include two or more layers arranged to form a laminated structure with or without inclusions or regions with yet other non-doped and doped semiconductor materials. Layers and devices may include planar and non-planar shapes. Likewise, the sectional views may represent structures of planar and/or diametric extent. The SiO$_2$ layer may be composed of other comparable materials.

Referring now to FIG. 7A, a single channel element is shown for one embodiment of the avalanche amplifying structure 1 operating in the Geiger mode with a normal direction of avalanche. The avalanche amplifying structure 1 is a generally planar structure including a first electrode 2, a governor 6 for draining the charge from the integrator 5 and controlling the quantifier 4, an integrator 5 which accumulates a signal charge, a quantifier 4 for turning the avalanche process ON and OFF, an avalanche region 3, a substrate 7, and a second electrode 8 arranged in the order described. The quantifier 4 is formed at the interface between the integrator 5 and avalanche region 3. The integrator 5 may have limited conductance in directions parallel to the plane of the substrate 7. In some embodiments, all layers may be composed of the same material. In other embodiments, it is preferred for the governor layer to be made of a semiconductor material which has a band gap which is wider than that of the remaining semiconductor layers.

Referring now to FIG. 7B, another alternate embodiment of the single channel element is shown for the avalanche amplifying structure 1 operating in the Geiger mode with a normal direction of avalanche including a signal transport layer 27 disposed between and contacting the avalanche region 3 and substrate 7 in FIG. 7A. The signal transport layer 27 generates free charge carriers under the signal action and effects their transportation into the avalanche region 3.

Referring now to FIG. 7C, an alternate embodiment of the single channel element is shown for the avalanche amplifying structure 1 operating in the Geiger mode with a normal direction of avalanche including a first electrode 2, a governor 6, an avalanche region 3, a substrate 7, and a second electrode 8 arranged in the order described. The avalanche region 3 and governor 6 drain the charge from the integrator 5 and controlling the quantifier 4. The function of the integrator 5, which accumulates the signal charge, and the function of the quantifier 4, which turns the avalanche process ON and OFF, is performed at the interface between the avalanche region 3 and the governor 6. The interface between the avalanche region 3 and the governor 6 may have limited conductance in directions parallel to the plane of the substrate 7.

It is likewise possible for the amplifying avalanche structure 1 operating in the Geiger mode with a normal direction of avalanche to include an avalanche region 3, an integrator 5 for the accumulation of a signal charge, a quantifier 4 for turning the avalanche process ON and OFF, and a governor 6 for draining the charge from the integrator 5 and controlling the quantifier 4 collectively composing a planar laminated semiconductor structure disposed on a heavily doped substrate 7 between a pair of electrodes 2, 8. The avalanche region 3 may be composed of a material of the same conductivity but higher resistivity, an integrator 5 composed of a heavily doped semiconductor material having a conductivity opposite that of the substrate 7, a governor 6 composed of a high-impedance semiconductor material, and quantifier 4 provided at the interface between the avalanche region 3 and integrator 5.

Figure 8A:
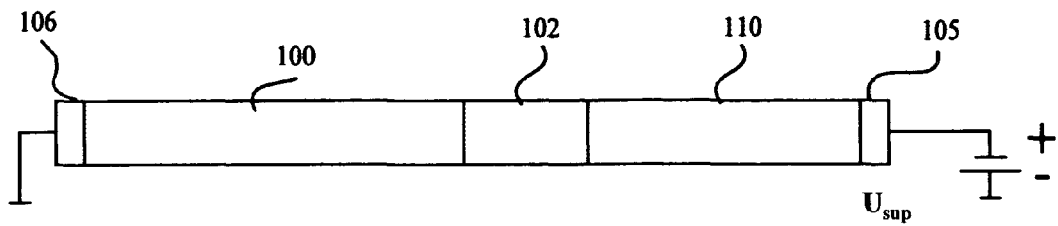
FIG. 8A shows a sequence of material layers corresponding to the structure of FIG. 7A.
Figure 8B:
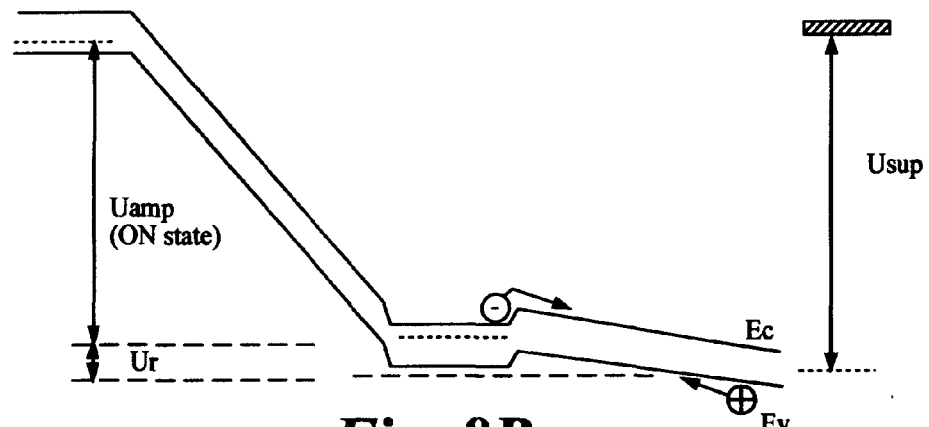
FIGS. 8B-8C depict energy band diagrams corresponding to the material layer structure shown in FIG. 8A during various operational conditions of the amplifier.
Figure 8C:
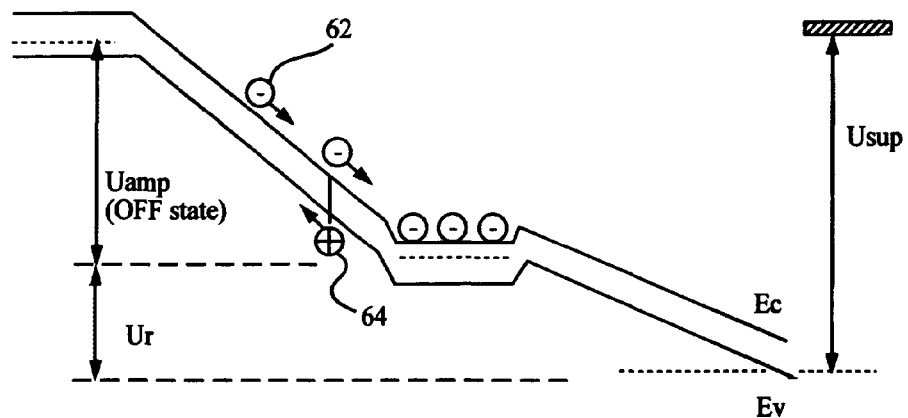

Referring now to FIG. 8A, a sequence of material layers are shown including an electrode 106, a p-Si layer 100, a n$^+$-Si region 102, an i-Si layer 110 and a transparent electrode 105. FIGS. 8B-8C show band diagrams describing the function aspects corresponding to the device layers in FIG. 8A Referring now to FIGS. 8B-8C, the device includes a silicon substrate with orientation [100] and resistivity of 10-100 Ohm-cm, thus having a wide depleted region. The n$^+$-Si region 102 is heavily doped and has a width less than 0.5 μm. The i-Si layer 110 has a width which is less than several μm's. The device is intended for red-infrared wavelengths, when it is possible to neglect light absorption in the n$^+$-Si region 102 and the i-Si layer 110. Alternate embodiments of the present invention may include an i-Si layer 110 composed of a semiconductor having band gap wider than silicon, one example being non-doped ZnO, to decrease the light absorption within the layer and to increase short wavelength sensitivity (green-blue). Such embodiments have an epitaxial p-Si layer 100 with a resistivity of 1-10 Ohm-cm.

Operation is nearly identical to a similar reverse bias design, as illustrated by the band diagrams for the ON and OFF states in FIGS. 8B-8C. The main difference being that electron and hole current may take part when discharging the n$^+$-Si layer 102 (integrator) through the i-Si layer 110 (governor).

FIGS. 9-12 and 14 refer to specific embodiments of the illustrative devices.

Figure 9:
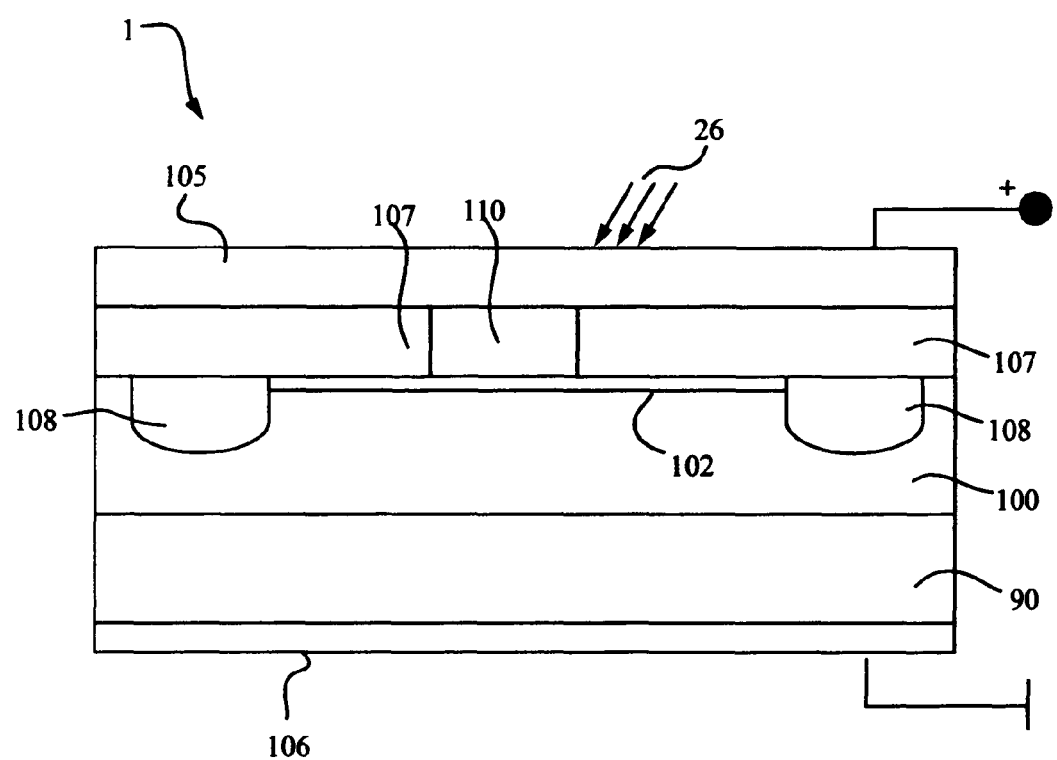
FIG. 9 shows a cross-sectional view of a normal-direction avalanche amplifying structure with ring guard region, in accordance with an embodiment of the present invention.

Referring now to FIG. 9, a cross-sectional view of a normal-direction avalanche amplifying structure 1 with ring guard region is shown and described including a transparent electrode 105, a SiO$_2$ layer 107, a i-Si layer 110, a n$^+$-Si guard ring 108, a n$^+$-Si layer 102, an epitaxial p-Si layer 100, a p$^+$-Si layer 90 (substrate), and an electrode 106. The i-Si layer 110 (governor) is dimensionally smaller than the device, preferably several μm's in diameter, to minimize light absorption. In some embodiments, the i-Si layer 110 may be composed of a semiconductor having a band gap wider than silicon, one example being non-doped ZnO. A signal light 26 enters the epitaxial p-Si layer 100 (avalanche region) through the n$^+$-Si layer 102 (integrator). As such, the n$^+$-Si layer 102 is thin, typically less than 0.4 μm, to minimize light absorption within the layer. The n$^+$-Si guard ring 108 suppresses edge effects and ensures the avalanche process is uniform over the area underlying the n$^+$-Si layer 102 (integrator). In blue-green embodiments, the epitaxial p-Si layer 100 has a resistivity of 1-2 Ohm-cm and a width of a few μm's to minimize thermogeneration current within the depleted region. In red-infrared embodiments, the epitaxial p-Si layer 100 has a higher width of tens of μm's and higher resistivity. The precise values of the width and resistivity for the epitaxial p-Si layer 100 are calculated via methods understood in the art to achieve the desired spectral sensitivity and other parameters of the device. Operation of the described device and its functional elements (integrator, quantifier, governor, substrate, and avalanche region) are as described above.

Figure 10:
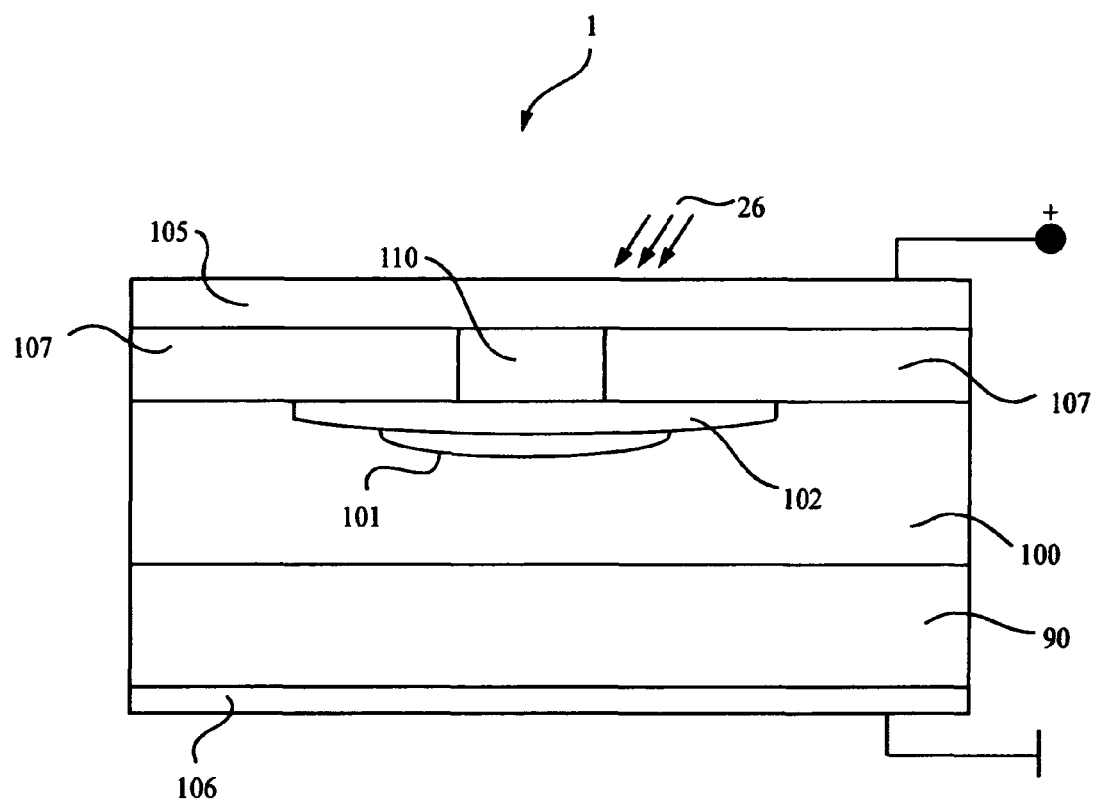
FIG. 10 shows a cross-sectional view of a normal-direction avalanche amplifying structure with high field implant, in accordance with an embodiment of the present invention.

Referring now to FIG. 10, a normal-direction avalanche amplifying structure 1 with high-field implant is shown and described including a transparent electrode 105, a SiO$_2$ layer 107, an i-Si layer 110, a n$^+$-Si region 102, a p-implantation layer 101, an epitaxial p-Si layer 100, a p$^+$-Si layer 90 (substrate), and an electrode 106. In this embodiment, the high field implant is used to suppress edge effects in place of the diffused guard ring in FIG. 9. This approach minimizes the unused area of the device where avalanche is not present. The p-implantation layer 101 is a thin region beyond the n$^+$-Si region 102. Avalanche multiplication is localized within the p-implantation layer 101. The i-Si layer 110 is a few μm's in diameter to minimize light absorption within the layer. In some embodiments, the i-Si layer 110 may be composed of a semiconductor having a band gap wider than silicon, one example being non-doped ZnO. Infrared embodiments of the device may operate with backside illumination (rich-through) where the field tail penetrates the low-doped epitaxial p-Si layer 100 so as to effectively gather photocarriers with high time resolution, while having a low operating voltage. The i-Si layer 110 (governor) has a small diameter, as described above for FIG. 9.

Figure 11:
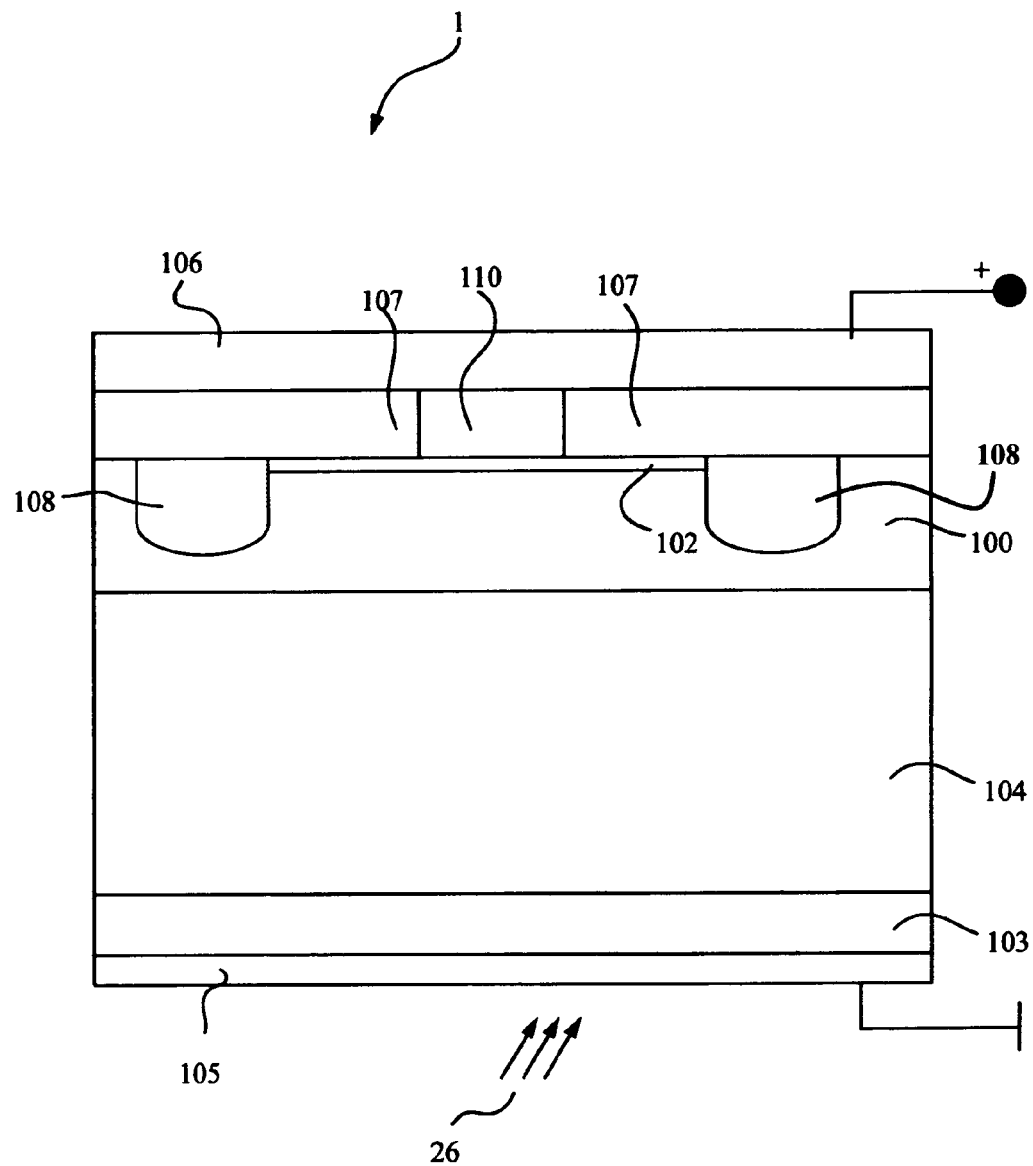
FIG. 11 shows a cross-sectional view of a normal-direction avalanche amplifying structure with backside illumination, in accordance with an embodiment of the present invention.

Referring now to FIG. 11, a normal-direction avalanche amplifying structure with backside illumination (rich-through) is shown and described including an electrode 106, a SiO$_2$ layer 107, an i-Si layer 110, a n$^+$-Si layer 102, a n$^-$-Si guard ring 108, an epitaxial p-Si layer 100, a p$^-$-Si layer 104, a p$^+$-Si layer 103, and a transparent electrode 105. Operation of the device is as described above in FIG. 9, except that the transporter-photoconverter is provided within the p$^-$-Si layer 104. Again, the i-Si layer 110 is a few μm's in diameter to minimize light absorption within the layer. In some embodiments, the i-Si layer 110 may be composed of a semiconductor having a band gap wider than silicon, one example being non-doped ZnO. The p$^-$-Si layer 104 (substrate) has a high resistivity (low doped) and is fully depleted at the operating voltage. The described device is capable of detecting infrared light with a wavelength up to 1.06 μm.

The avalanche event occurs within the p-Si layer 100 which has a higher doping in comparison to the transport-photoconversion region comprised by the p$^-$-Si layer 104. The width and doping of the p-Si layer 100 is selected so that the electric field does not fall to zero, but has a long tail which penetrates into the p$^-$-Si layer 104 stopped by the highly doped p$^+$-Si layer 103. The width of the p$^-$-Si layer 104 should be sufficient to provide structural strength to the device, preferably up to a few hundred μm's. Field strength in the p$^-$-Si layer 104 should be insufficient for avalanche, but high enough so that a free carrier may move within it at a saturated speed (104 V/cm), as calculated via methods understood in the art.

The p$^+$-Si layer 103 should be as thin as possible to minimize light absorption within the layer. However, the p$^+$-Si layer 103 should not be fully depleted and its width should be sufficient to block electron injections from the transparent electrode 105 to the p$^-$-Si layer 104. Various antireflection coating understood in the art may be added to the device via methods also understood in the art.

Figure 12:
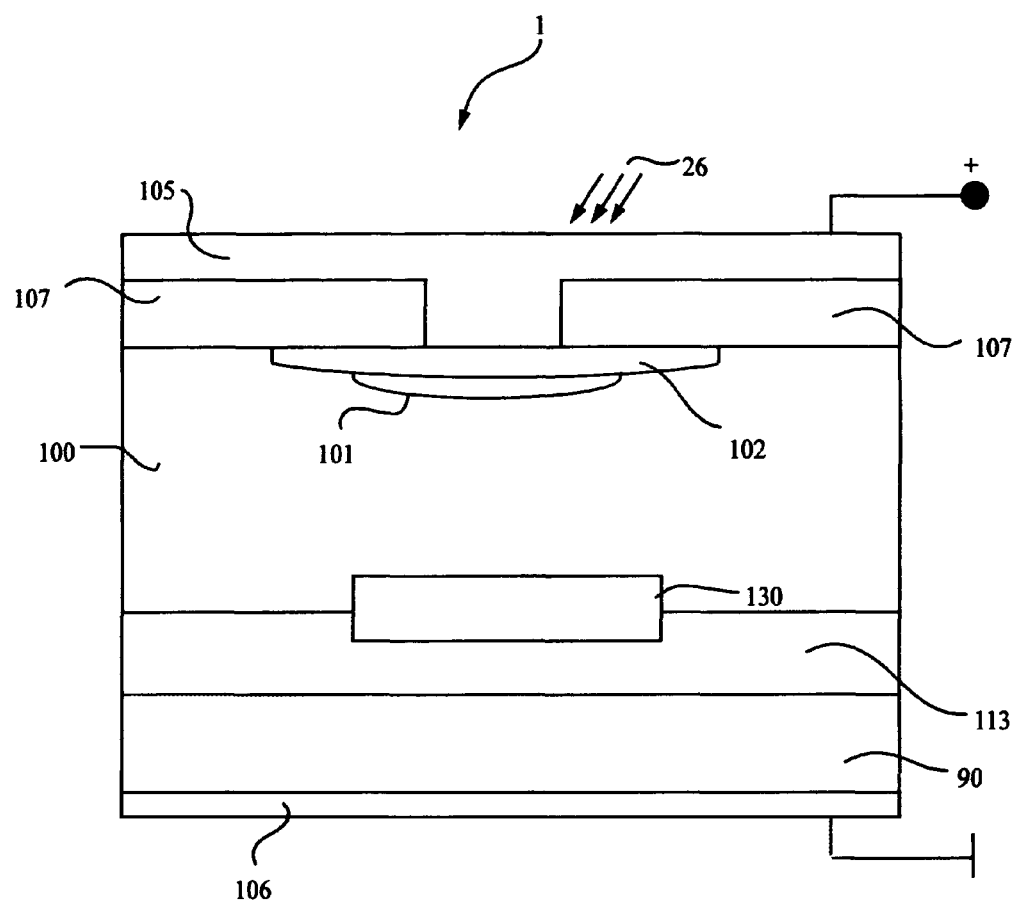
FIG. 12 shows a cross-sectional view of a normal-direction avalanche amplifying structure with high field implant and hole integrator, in accordance with an embodiment of the present invention.

Referring now to FIG. 12, a normal-direction avalanche amplifying structure 1 with high field implant and hole integrator is shown and described including a transparent electrode 105, a SiO$_2$ layer 107, a n$^+$ Si layer 102, a p-Si layer 101, an epitaxial p$^-$-Si layer 100, a p$^+$-Si region 130, an epitaxial i-Si layer 113, a p$^+$-Si layer 90 (substrate), and an electrode 106. The device differs from FIG. 10 in that a hole integrator is provided by the p$^+$-Si layer 130 and the epitaxial i-Si layer 113 is added as the hole governor, instead of the electron integrator. Furthermore, the i-Si layer 110 in FIG. 10 is removed and the n$^+$-Si layer 102 is coupled directly to the transparent electrode so as to avoid the accumulation of electrons.

Figure 13:
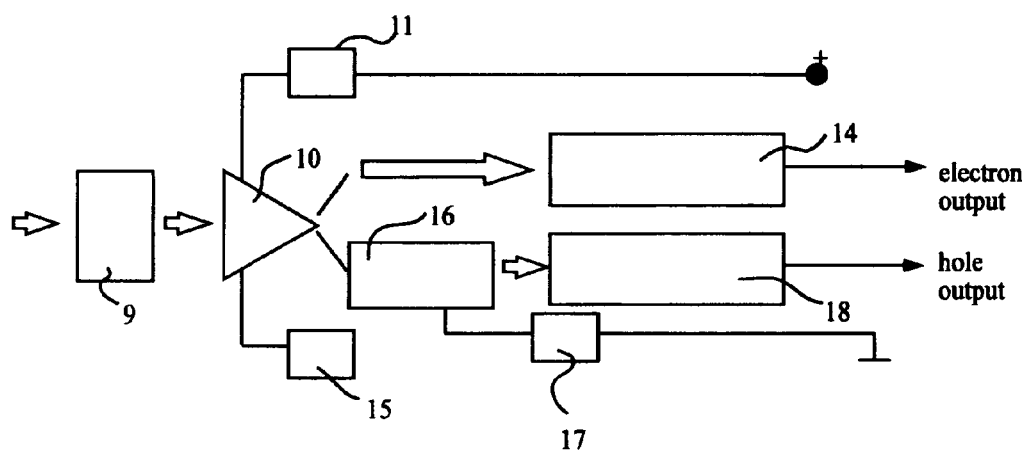
FIG. 13 depicts functional components of the normal-direction avalanche amplifying structure shown in FIG. 12.

Referring now to FIG. 13, the functional components of the normal-direction avalanche amplifying structure 1 from FIG. 12 are shown and described. The transporter 9 corresponds to the depleted part of the epitaxial p$^-$-Si layer 100, threshold amplifier 10 corresponds to the p-Si layer 101, electron quantifier 11 corresponds to the interface between the n$^+$-Si layer 102 and the p-Si layer 101, electron reader 14 corresponds to the transparent electrode 105, hole quantifier 15 corresponds to the interface between the Si layer 100 and the p$^+$-Si layer 130, hole integrator 16 corresponds to the p$^+$-Si layer 130, hole governor 17 corresponds to the epitaxial i-Si layer 113, hole reader 18 corresponds to the electrode 106 through capacitance comprised by the p$^+$-Si region 130, the epitaxial i-Si layer 113, and the p$^+$-Si layer 90 (HF part of the signal), and current through the epitaxial i-Si layer 113 to the electrode 106 (LF part of the signal). Operation of the hole integrator and hole governor does not differ from that described above, when the opposite polarity and carrier type are taken into account. The device switches the avalanche amplifier OFF following the removal of the accumulated charge in the integrator.

The width and doping level of the epitaxial p$^-$-Si layer 100 are designed so that the layer is fully depleted. The epitaxial i-Si layer 113 may be composed of a p-type or n-type material that regulates the barrier height for holes. The size, form of the p$^+$-Si layer 130, and distance of the p$^+$-Si layer 130 from the n$^+$-Si layer 102 are regulating parameters which influence timing, jitter, maximal overvoltage, gain at fixed over-voltage, and other performance characteristics.

The advantages of this embodiment are that there are no additional layers ahead of the avalanche region, unlike the conventional design of any avalanche Geiger photodetector or non-Geiger APD, and no additional light absorption. Furthermore, the quenching system is placed behind the working region allowing its use with Geiger photodetectors. The result is the ability to operate with DC voltage and a quenching system which is much more efficient than conventional passive and active quenching methods.

Figure 14:
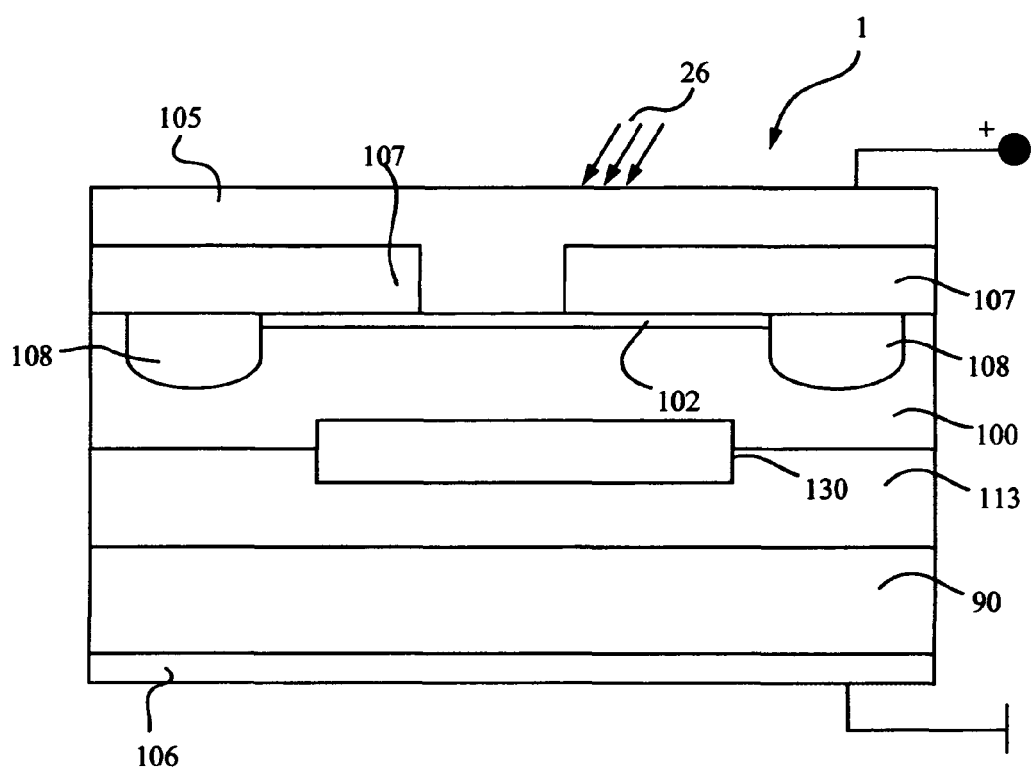
FIG. 14 shows a cross-sectional view of a normal-direction avalanche amplifying structure with ring guard and hole integrator, in accordance with an embodiment of the present invention.

Referring now to FIG. 14, a normal-direction avalanche amplifying structure 1 with ring guard and hole integrator is shown and described including a transparent electrode 105, a $SiO_2$ layer 107, an $n^+$-Si layer 102, a $n^-$-Si guard ring 108, an epitaxial $p^-$-Si layer 100, a $p^+$-Si region 130, an epitaxial i-Si layer 113, a $p^+$-Si layer 90 (substrate), and an electrode 106. The device differs from FIG. 12 in that the high field implant design is substituted with a guard ring design.

Single Channel Devices—Lateral Quantifier, Normal Bias

Figure 15A:
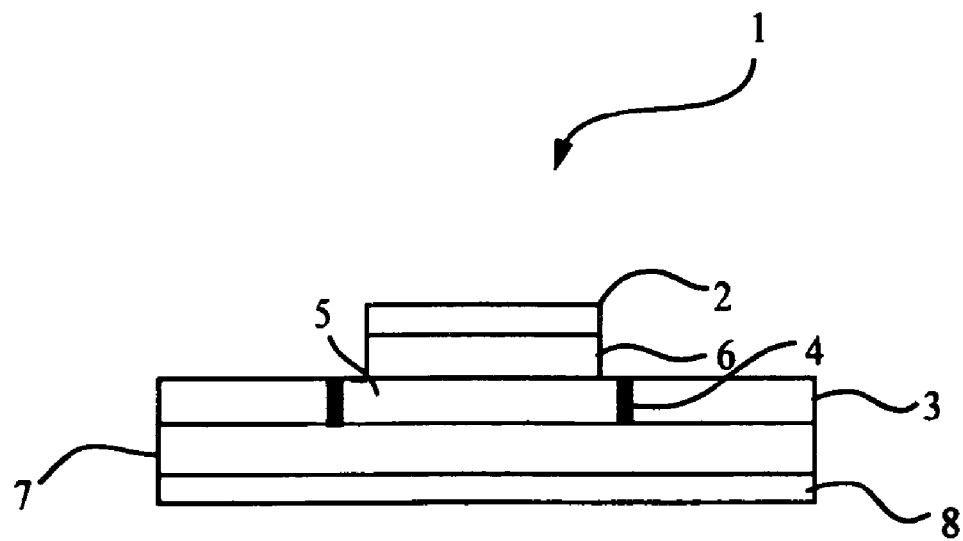
FIG. 15A-15O are schematic cross-section views for various illustrative embodiments of the present invention comprising an avalanche amplifying structure operating in the Geiger mode with a lateral direction of avalanche showing the positional relationship of electrodes, avalanche region, quantifier, integrator, governor, and substrate and optional dielectric layer, signal transport layer, blocking layer, contact region, and third electrode.
Figure 15B:
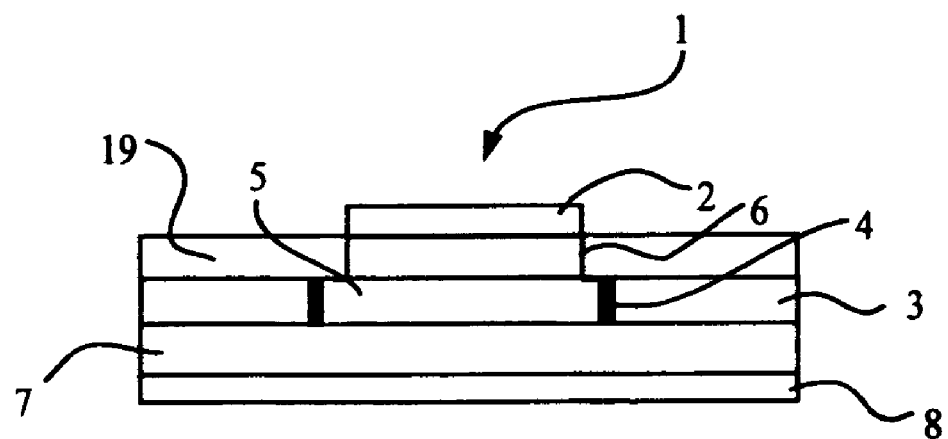
Figure 15C:
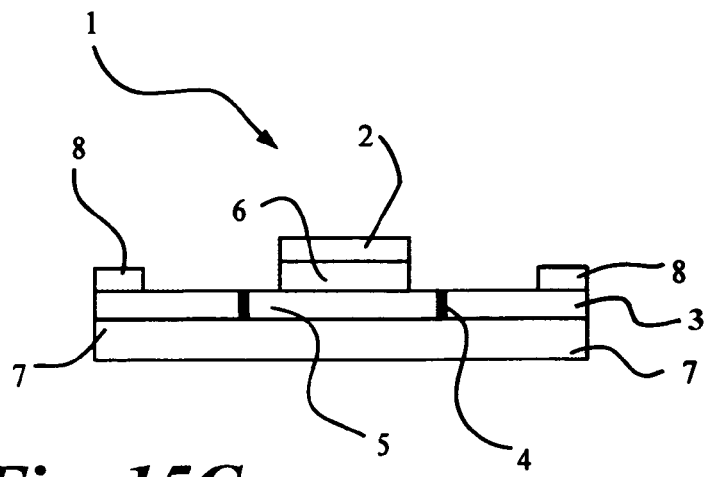
Figure 15D:
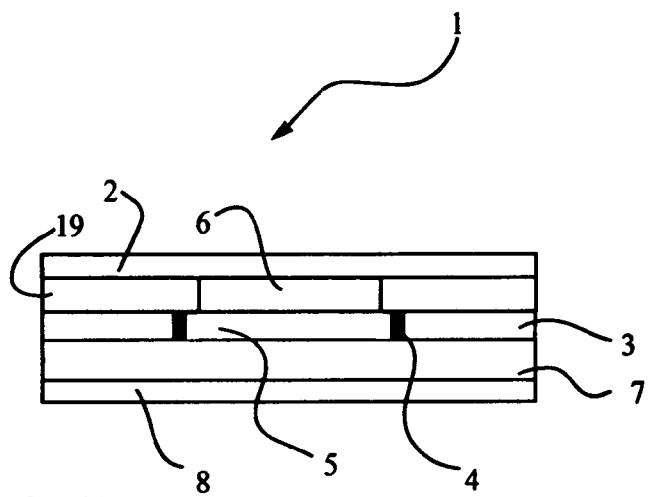
Figure 15E:
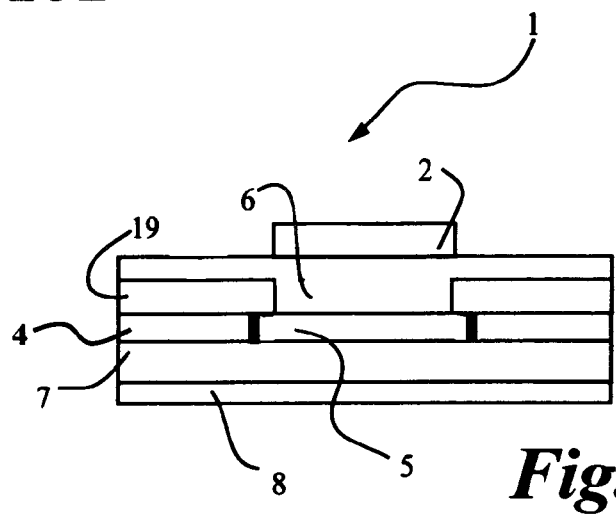
Figure 15F:
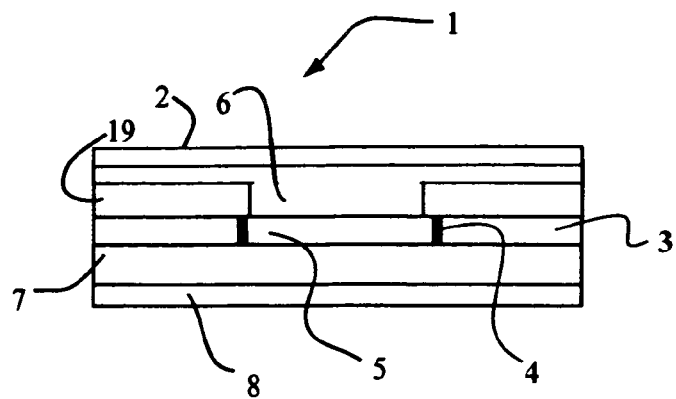
Figure 15G:
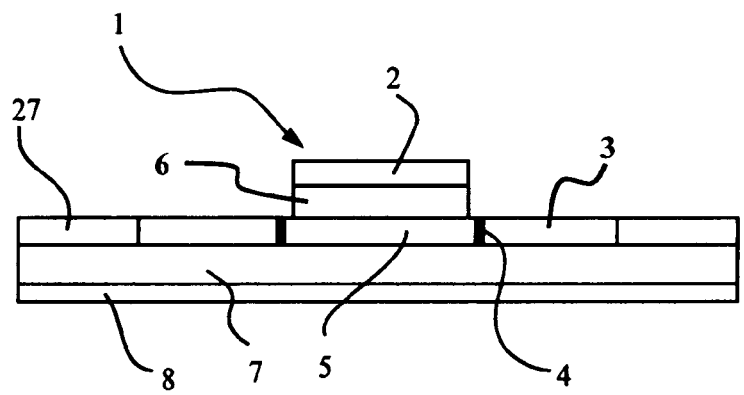
Figure 15H:
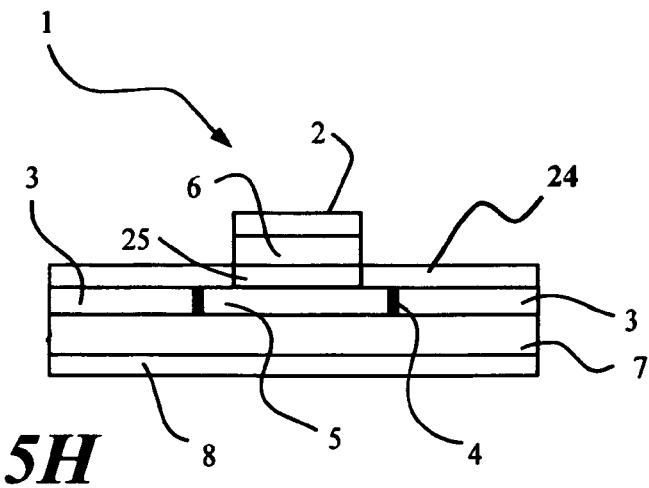
Figure 15I:
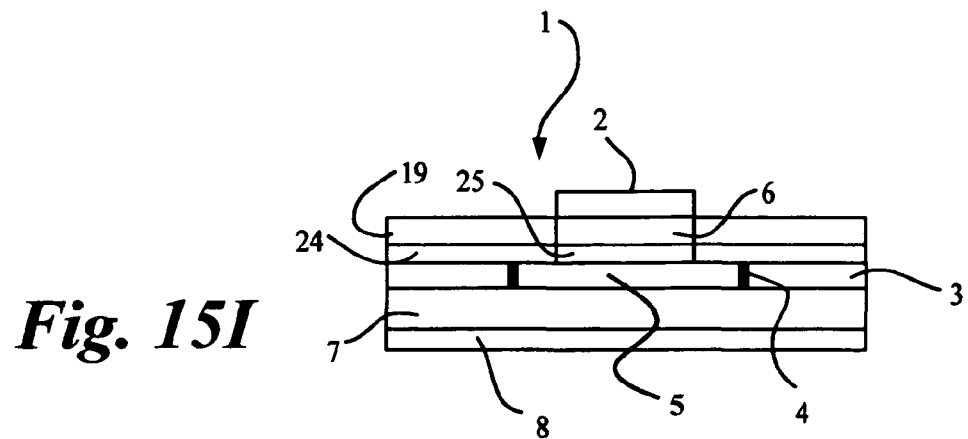
Figure 15J:
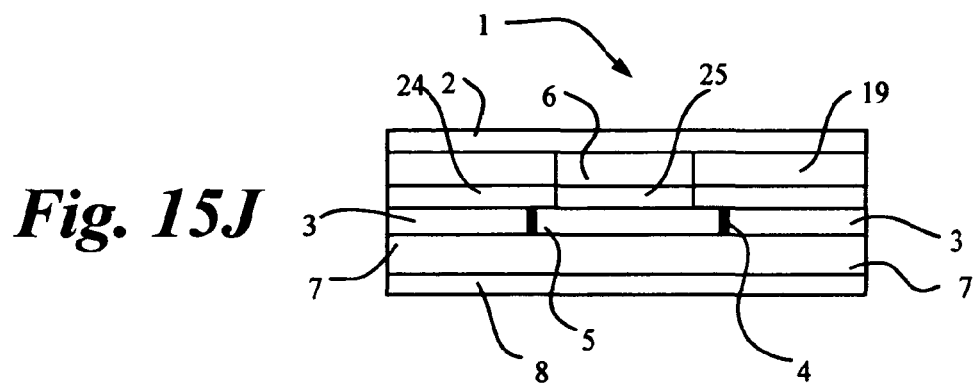
Figure 15K:
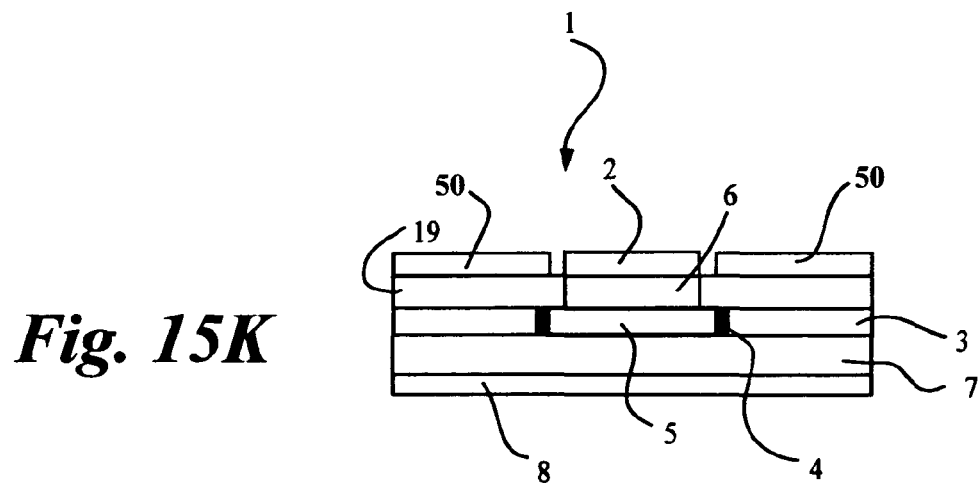
Figure 15L:
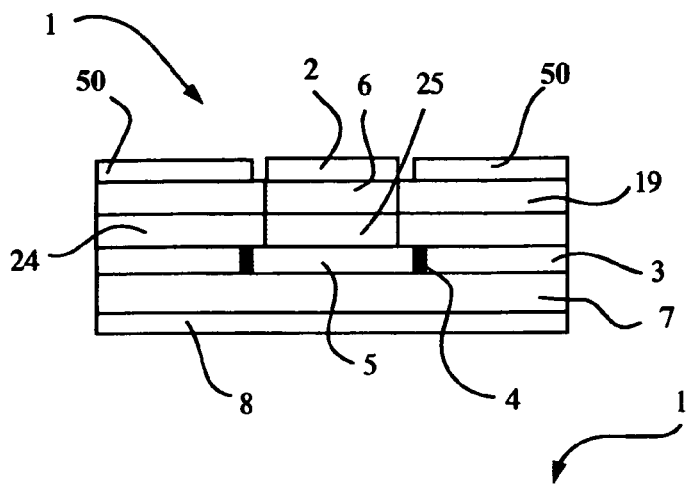
Figure 15M:
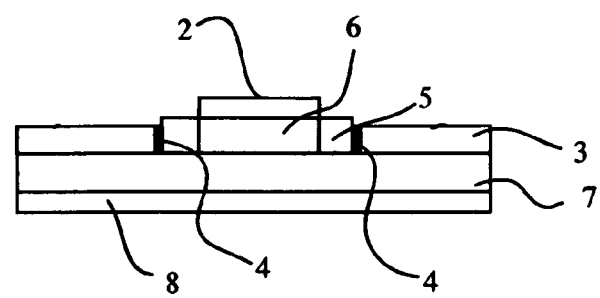
Figure 15N:
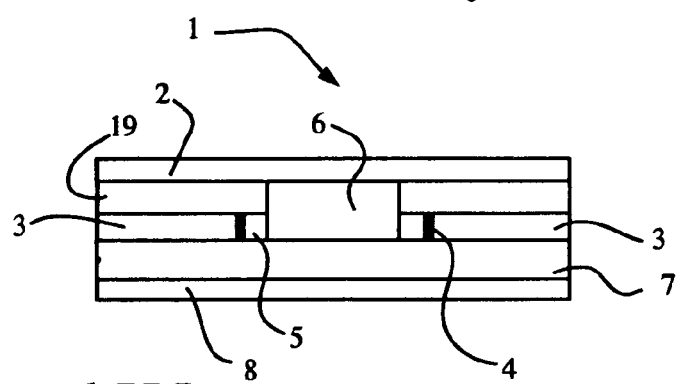
Figure 15O:
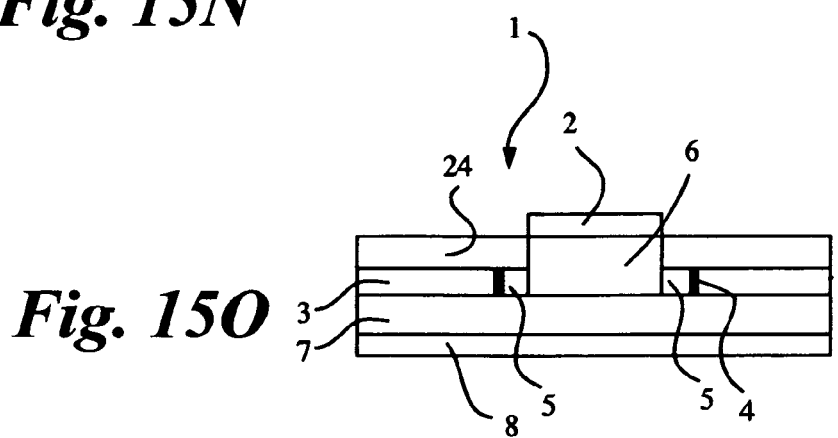

A variety of materials are applicable to layers and regions in FIGS. 15A-15O. For example, each layer may be composed of the same or different semiconductor materials, examples including Si, SiC, GaN, GaAs and GaP, which are doped to provide the desired electrical properties. In other embodiments, the governor 6 may be composed of a material having a band gap wider than that of the other layers. In yet other embodiments, the signal transport layer 27 may be composed of a material having a band gap narrower than the other layers. In still other embodiments, the first electrode 2 and/or second electrode 8 may be composed of a conductive metal or light transmissive and conductive material, examples including without limitation transparent ITO and Al-doped ZnO. Furthermore, layers and regions may include two or more layers arranged to form a laminated structure with or without inclusions or regions of yet other non-doped and doped semiconductor materials. Layers and devices may include planar and non-planar shapes. Likewise, the sectional views may represent structures of planar and/or diametric extent. The $SiO_2$ layer may be composed of other comparable materials.

Referring now to FIG. 15A, an avalanche amplifying structure 1 operating in the Geiger mode with a lateral direction of avalanche is shown and described including a first electrode 2, a governor 6, an integrator 5 and an avalanche region 3, a substrate 7, and a second electrode 8 in a layered arranged in the order described. It is preferred for the avalanche region 3, substrate 7, and second electrode 8 to be of comparable lateral extent. Likewise, it is preferred for the first electrode 2 and governor 6 to be slightly smaller in extent as compared to the integrator 5. The avalanche region 3 includes a hole through its thickness within which resides the integrator 5. The hole and integrator 5 should be sufficiently larger than the governor 6 to avoid contact direct contact between the governor 6 and the avalanche region 3. The periphery of the integrator 5 should directly contact the avalanche region 3 so that the interface between the two materials functions as a ring-shaped quantifier 4. The integrator 5 is responsible for accumulating a signal charge. The quantifier 4 controls the ON and OFF states of the avalanche process. The governor 6 drains the charge from the integrator 5 and controls the quantifier 4.

FIGS. 15B-15O represent variations of the device in FIG. 15A.

In FIG. 15B, a dielectric layer 19 composed of one or more materials understood in the art surrounds the periphery of the governor 6. The dielectric layer 19 is preferred to both cover and contact the integrator 5 and avalanche region 3 without providing an electrical conduit between the governor 6 and avalanche region 3.

In FIG. 15C, the second electrode 8 is removed from the substrate 7 and replaced with a ring-shaped structure. The second electrode now contacts the avalanche region 3 and is disposed about the governor 6 and electrode 2 which extend above the surface including the integrator 5 and avalanche region 3.

In FIG. 15D, the first electrode 2 in FIG. 15B is extended to now completely cover the both governor 6 and dielectric layer 19.

In FIG. 15E, the governor 6 extends above the dielectric layer 19 and has a T-shaped structure so as to cover the uppermost surface of the dielectric layer 19. The first electrode 2 contacts the T-shaped governor 6 about the integrator 5.

In FIG. 15F, the first electrode 2 in FIG. 15E is now extended to contact and cover the T-shaped governor 6 so as to have lateral extents as large as the second electrode 8.

In FIG. 15G, the substrate 7 and second electrode 8 are extended laterally beyond the edge of the avalanche region 3. A signal transport layer 27 is disposed about and contacts the periphery of the avalanche region 3. It is preferred for the signal transport layer 27 to be as thick as the avalanche region 3. The signal transport layer 27 is composed of a semiconductor material also comprising the avalanche region 3; however, a less doped composition.

In FIG. 15H, an electrically conductive contact region 25 is disposed between the governor 6 and integrator 5. The contact region 25 is of lesser lateral extent as compared to the integrator 5 so as to avoid direct electrical contact with the governor 6. A blocking layer 24 is disposed about and contacts the periphery of the contact region 25. Likewise, the blocking layer 24 covers the integrator 5 and avalanche region 3. The blocking layer 24 is composed of a semiconductor material of the same type as the avalanche region 3. The blocking region 24 does not contact the first electrode 2.

In FIG. 15I, a dielectric layer 19 is disposed about and contacts the periphery of the governor 6 in FIG. 15H. The dielectric layer 19 also completely contacts and covers the blocking layer 24 opposite of the avalanche region 3. The first electrode 2 contacts the governor 6 only.

In FIG. 15J, the first electrode 2 in FIG. 15I is extended laterally to now contact and cover both governor 6 and blocking layer 24.

In FIG. 15K, a third electrode 50 replaces a segment of the first electrode 2 from FIG. 15D with a gap there between. The first electrode 2 contacts the governor 6. The third electrode 50 contacts the dielectric layer 19.

In FIG. 15L, a third electrode 50 replaces a segmented of the first electrode 2 from FIG. 15J with a gap there between. The first electrode 2 contacts the governor 6. The third electrode 50 contacts the dielectric layer 19.

In FIG. 15M, the integrator 5 includes a hole within which the governor 6 resides so as to contact the integrator 5 about the periphery of the governor 6. The governor 6 now resides on the substrate 7. The first electrode 2 contacts the governor 6 only.

In FIG. 15N, a dielectric layer 19 is disposed about and contacts the periphery of the governor 6 from FIG. 15M which extends beyond the integrator 5. The first electrode 2 is extended laterally to now contact and cover the governor 6 and the dielectric layer 19.

In FIG. 15O, the first electrode 2 only covers and contacts the governor 6 in FIG. 15N.

FIGS. 16 and 18-27 refer to specific embodiments of the illustrative devices.

Figure 16:
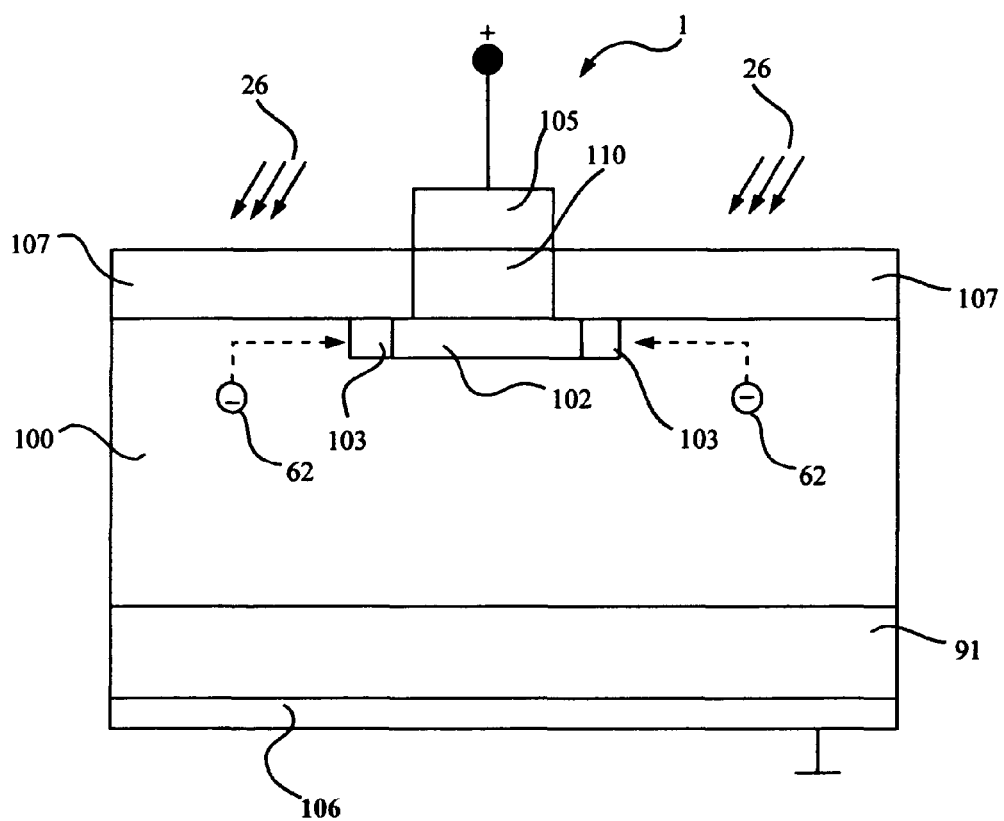
FIG. 16 shows a cross-sectional view of a lateral-direction avalanche amplifying structure, in accordance with an embodiment of the present invention.
Figure 17:
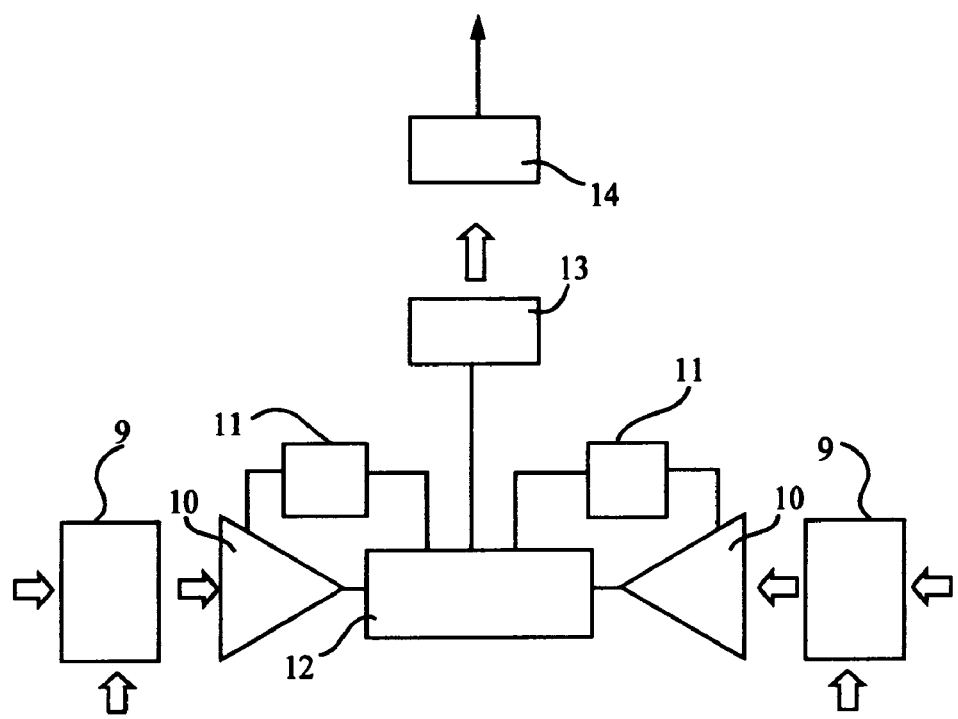
FIG. 17 depicts functional components of the lateral-direction avalanche amplifying structure shown in FIG. 16.

Referring now to FIG. 16, a lateral-direction avalanche amplifying structure 1 is shown and described including a transparent electrode 105, a $p^-$-Si layer 110, an $SiO_2$ layer 107, a $p^-$-Si layer 100, a $n^+$-Si region 102, a p-Si region 103, a $p^+$-Si layer 91 (substrate), and an electrode 106. FIG. 17 shows the functional components of the lateral-direction avalanche amplifying structure 1.

The components identified in FIG. 16, excluding electrodes 105, 106, may be composed of one or more semiconductor material, one example being Si having a doping type and concentration to achieve the desired electrical properties. The SiO$_2$ layer 107 may be composed of other comparable materials.

The transparent electrode 105 and p$^-$-Si layer 110 are preferred to be several μm's in diameter to minimize light absorption therein. The transparent electrode 105 and p$^-$-Si layer 110 may be composed of a semiconductor having a wider band gap than silicon, one example being non-doped ZnO. The n$^+$-Si region 102 (integrator) is fabricated to have a diameter as small as possible. The electrode 106 may be composed of a metal, examples including Al, Ni, NiCr, Mo or the like, or a transparent conductive material, examples including ITO or Al-doped ZnO.

ON and OFF switching of this embodiment is nearly the same as the device in FIGS. 8A-8C, except that the threshold amplifier 10 has a lateral orientation and the threshold amplifier 10, quantifier 11, integrator 12, and governor 13 are not arranged in a linear fashion.

The p-Si region 103 is preferred to have a higher doping concentration than the p$^-$-Si layer 100. Avalanche multiplication occurs only at the edges of the junction in the p-Si region 103 and both transporters 9 and threshold amplifiers 10 in FIG. 16B are oriented in the lateral direction, parallel to the p$^+$-Si layer 91. Accordingly the carriers generated at the top of p$^-$-Si layer 100 are effectively gathered by the threshold amplifiers 10. The other elements within the functional scheme operate as previously described.

The p-Si region 103 is preferred to have a width, typically 1 μm, and doping level, typically 1 Ohm-cm resistivity, so that the lateral field component exits the region (rich-through in lateral direction) and penetrates the p$^-$-Si layer 100 along Si—SiO$_2$ interface, thus gathering signal carriers and transporting them to the p-Si region 103 (threshold amplifier). In some embodiments, the p-Si region 103 may be composed of the same doping as in the p$^-$-Si layer 100; however, the n$^+$-Si region 102 (integrator) is preferred to be thin, typically, less than 0.4 μm. The lateral direction of avalanche is provided by the edge breakdown effect. In other embodiments, the p-Si region 103 may be used without rich-though and have a diameter equal to the device diameter so that it fully separates the SiO$_2$ layer 107 from the p$^-$-Si layer 100.

The lateral-direction devices described herein provide high sensitivity for short wavelength applications down to near UV and high gathering efficiency for longer wavelength applications up to 700-800 nm. Thus, the geometrical factor for such devices, representing the amplified photocarriers divided by the total number of generated photo-carriers, is rather close to unity.

Figure 18:
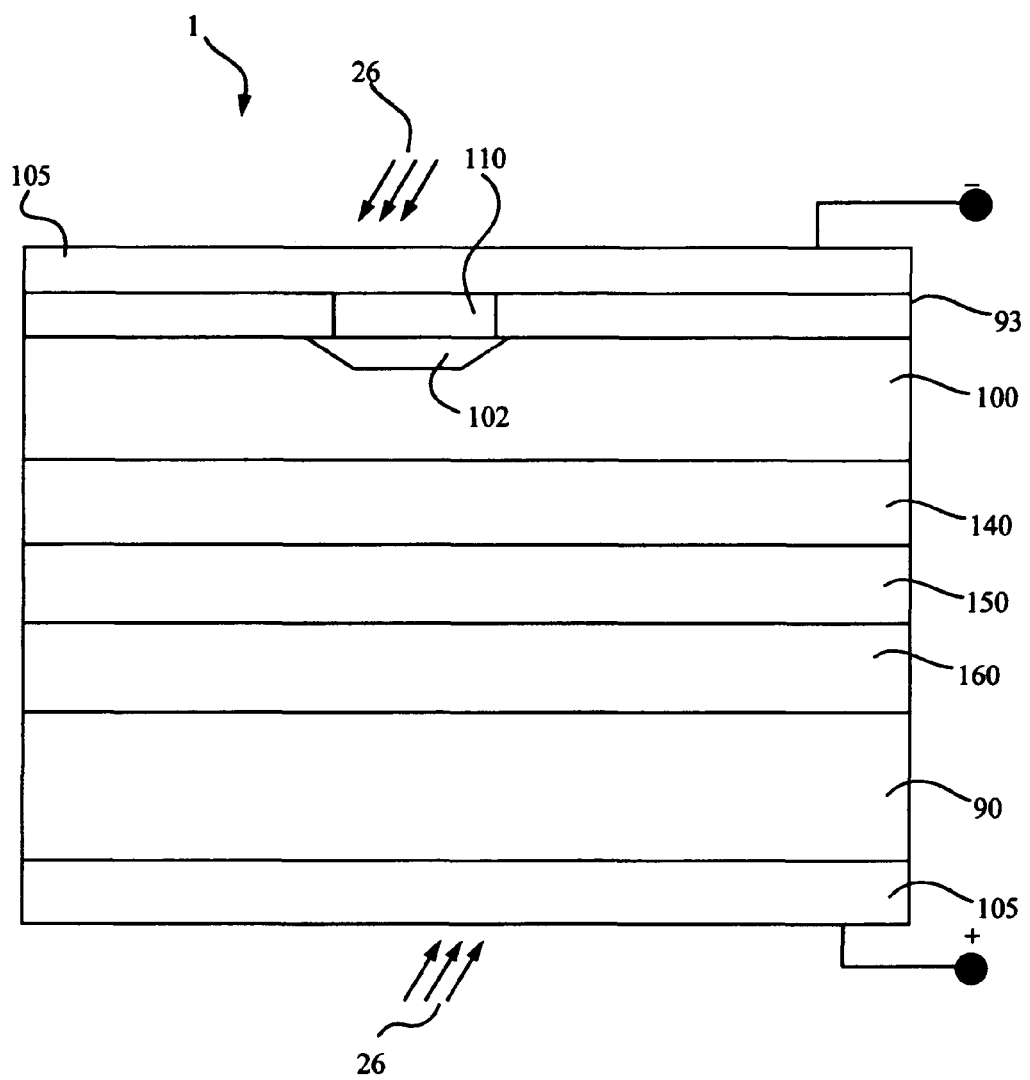
FIG. 18 shows a cross-sectional view of a lateral-direction avalanche amplifying structure including InGaAsP, in accordance with an embodiment of the present invention.

Referring now to FIG. 18, a lateral-direction avalanche amplifying structure 1 is shown and described including a pair of transparent electrodes 105, a Si$_3$N$_4$ layer 93 (insulator), an n$^-$ InP layer 110, a p$^+$ InP region 102, a n InP layer 100, a n InGaAsP layer 140 (buffer), a n InGaAs layer 150 (absorber), a n InP layer 160 (epitaxial), and a n$^+$ InP layer 90 (substrate, orientation [100]). Layers have a doping type and a polarity opposite of the embodiment above.

The application of InGaAsP does not affect the overall functional scheme (governor-integrator-quantifier-amplifier) of the device. The desired wavelength is defined by the absorption layer band gap and width, which has a range of 1.06-1.6 μm. The wide-band material from which the amplifier and substrate are composed (InP) is transparent for this wavelength. The separation of the amplifier from the absorber allows for increased quantum efficiency, since neither the amplifier nor the substrate enclose the absorber from light. The insulator or Si$_3$N$_4$ layer 93 replaces the SiO$_2$ layer 107 described above because it provides a better performance match with the InGaAs-InP layers. The additional buffer layer between absorber and n InP layer 100 improves their heterobarrier properties, specifically their frequency response. Transparent electrodes 105 may be composed of ITO or Al-doped ZnO. The device may be illuminated from any side and antireflection coatings added via methods understood in the art.

The p$^+$ InP region 102 operates as an integrator such that its interface with the neighboring n InP layer 100 functions as the quantifier. The n- InP layer 110 is the governor responsible for the delay in the integrator discharge (sufficient to turn OFF the threshold amplifier) and for returning the threshold amplifier to the initial stage by removing the accumulated charge from it. The avalanche region or threshold amplifier corresponds to the n InP layer 100.

The width and doping concentration of n InP layer 100, n InGaAsP layer 104, and n InGaAs layer 150 are fabricated via methods understood in the art. The field strength is sufficient for avalanche multiplication within the n InP layer 100 and to cause a field tail which is sufficiently low within the absorber to prevent tunneling and avalanche current. The field tail gathers the generated photocarriers from the absorber to amplifier, thus allowing the absorber to be fully depleted. The absorber width is sufficient for effective light absorption at the desired wavelength. In some embodiments, the absorber may be made with no field penetration from the n InP layer 100, but with varying band gap that allows photocarriers to reach the depleted n InP layer 100 while avoiding tunneling current in the absorber.

Figure 19:
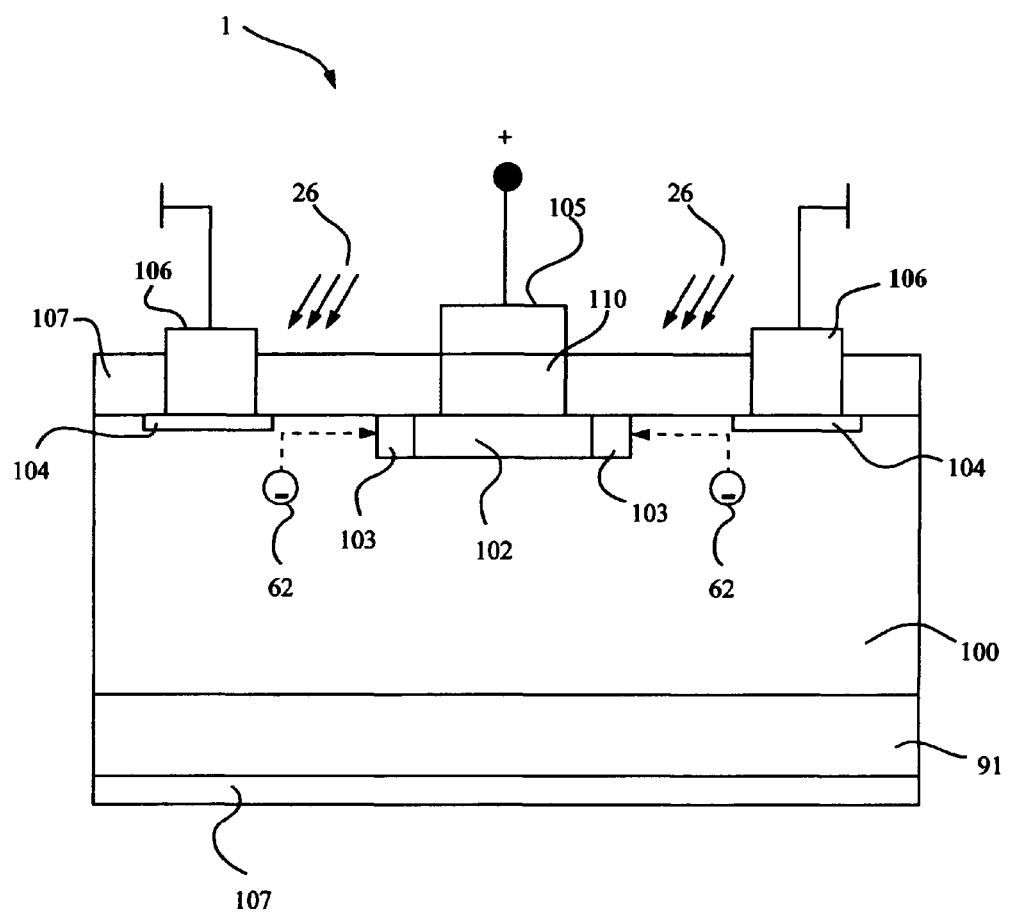
FIG. 19 shows a cross-sectional view of a lateral-direction avalanche amplifying structure with a pair of electrodes aligned along one side the device, in accordance with an embodiment of the present invention.

Referring now to FIG. 19, a lateral-direction avalanche amplifying structure 1 with transparent electrode 150 and electrode 106 aligned along one side the device is shown and described. The device is an alternate embodiment of the device in FIG. 16, wherein now a ring electrode 106 passes through the SiO$_2$ layer 107 and is attached to a p$^+$-Si region 104 embedded within the p$^-$-Si layer 100. Furthermore, the electrode 106 in FIG. 16 is replaced with a SiO$_2$ layer 107, as shown in FIG. 19. The electrodes 106 may be composed of a metal or transparent conductive material. The p$^+$-Si region 104 blocks injection of electrons from the electrode 106 into the p$^-$-Si layer 100. The doping depth for the p$^+$-Si region 104 is small, typically 0.3 μm. The width of the p$^+$-Si region 104 is minimized and preferred to extend slightly beyond the edge of the electrode 106. The distance between the n$^+$-Si region 102 and p$^+$-Si region 104 should be sufficient so that the lateral component of the field from the p-Si region 103 is small and does not cause tunnel currents within the p$^+$-Si region 104. Functionality of this device is as described above for FIG. 16.

Figure 20:
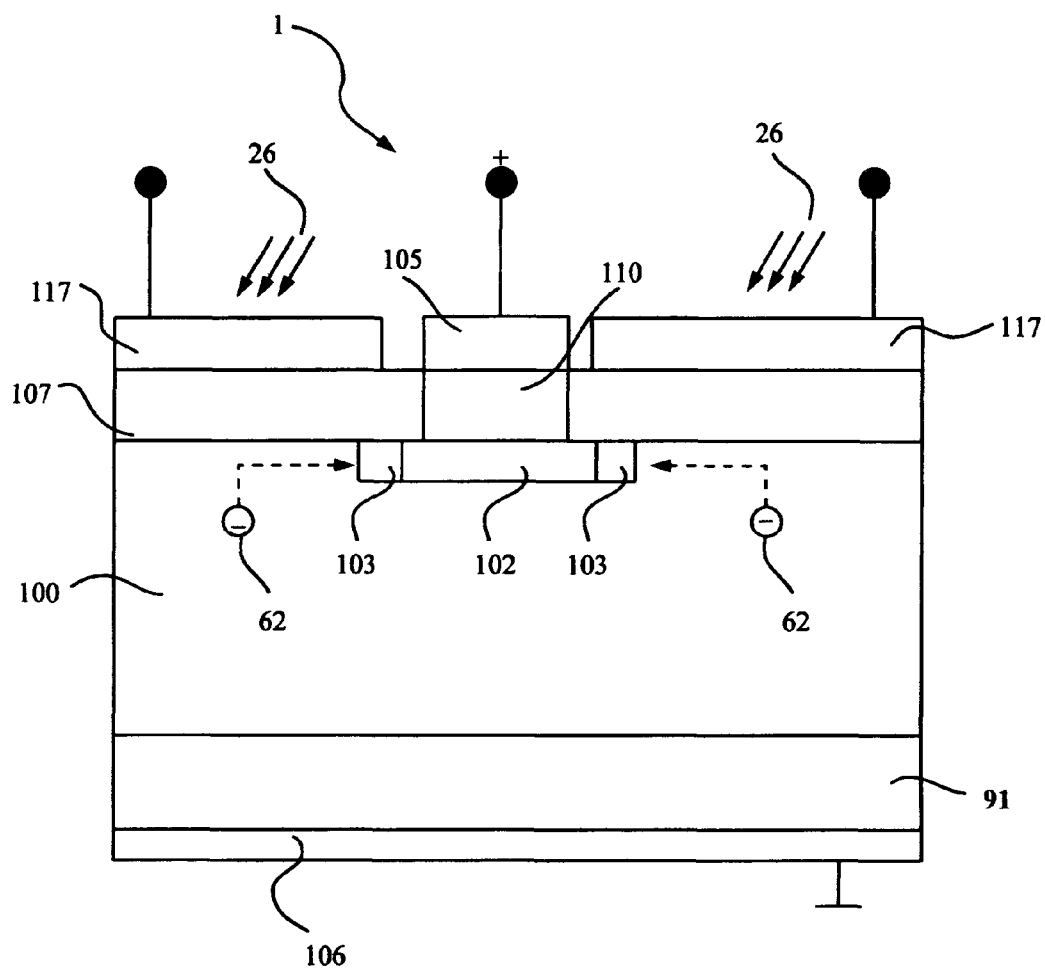
FIG. 20 shows a cross-sectional view of a lateral-direction avalanche amplifying structure with three electrodes, in accordance with an embodiment of the present invention.

Referring now to FIG. 20, a lateral-direction avalanche amplifying structure 1 with three electrodes is shown and described. The device is an alternate embodiment of the device in FIG. 16, wherein a ring-shaped electrode 117 is disposed about the transparent electrode 105 and contacting the SiO$_2$ layer 107. Electrode 117 is composed of a transparent conductive material examples of which are provided above. The electrode 117 allows additional tuning of the device characteristics, including but not limited to spectral sensitivity, response time for different wavelengths, and compensates the fixed charge in the protective oxide. A DC voltage is applied to the electrode 117 in a manner that allows optimization of the device. The protective SiO$_2$ layer 107 should be sufficiently thick, typically 0.7 μm, to prevent the avalanche process within the p or p$^-$ layer 100 and the p-Si layer 103 caused by the vertical component of the electric field from electrode 117. Functionality of this device is as described above for FIG. 16.

Figure 21:
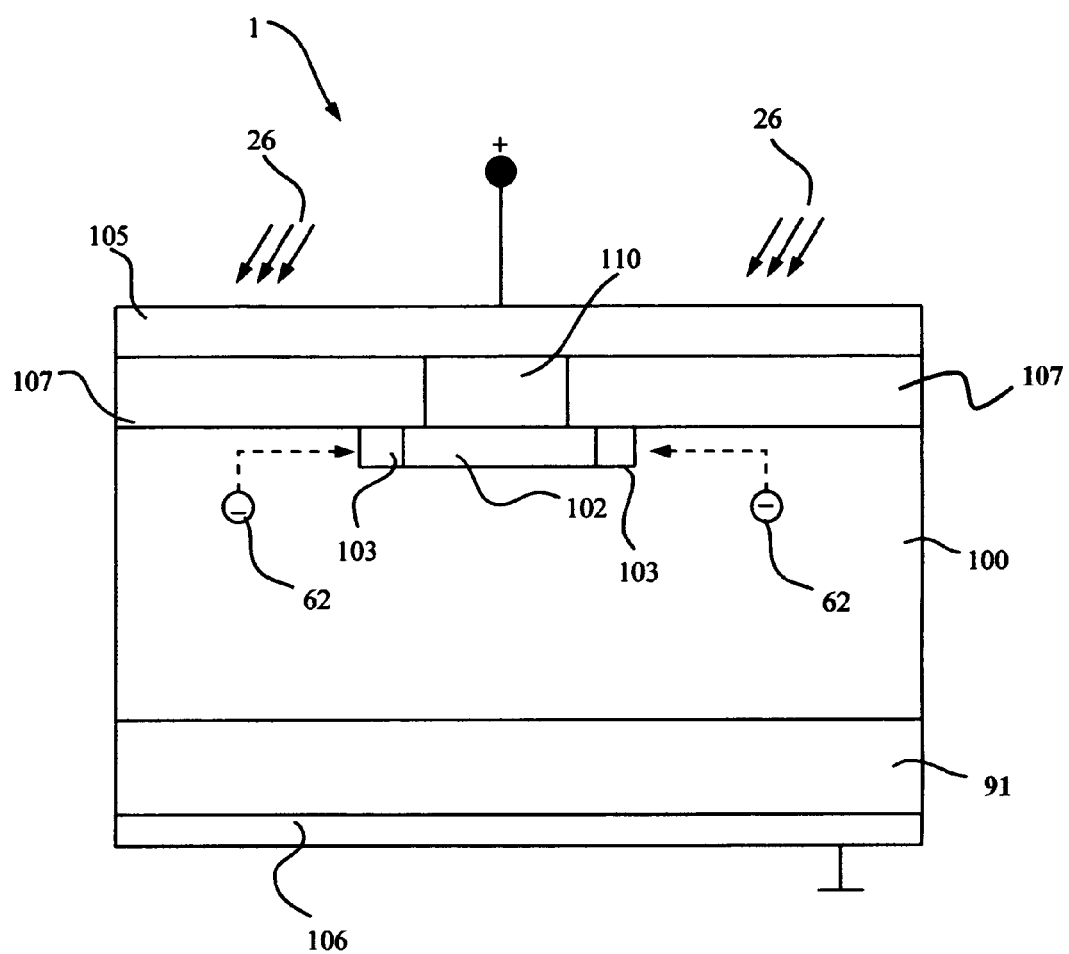
FIG. 21 shows a cross-sectional view of a lateral-direction avalanche amplifying structure with a single large electrode aligned along one side of the device, in accordance with an embodiment of the present invention.

Referring now to FIG. 21, a lateral-direction avalanche amplifying structure 1 with a single electrode aligned along one side of the device is shown and described. The device is an alternate embodiment of the device in FIG. 16, wherein the transparent electrode 105 completely covers the top surface of the SiO$_2$ layer 107. The primary advantage of this embodiment is that more volume of the p$^-$-Si layer 100 is depleted improving the collection of photocarriers and response time of the device. The protective SiO$_2$ layer 107 should be sufficiently thick, typically 0.7 μm, to prevent the avalanche process within the p or p$^-$-Si layer 100 and the p-Si layer 103 caused by the vertical component of the electric field from electrodes 105. Functionality of this device is as described above for FIG. 16.

Figure 22:
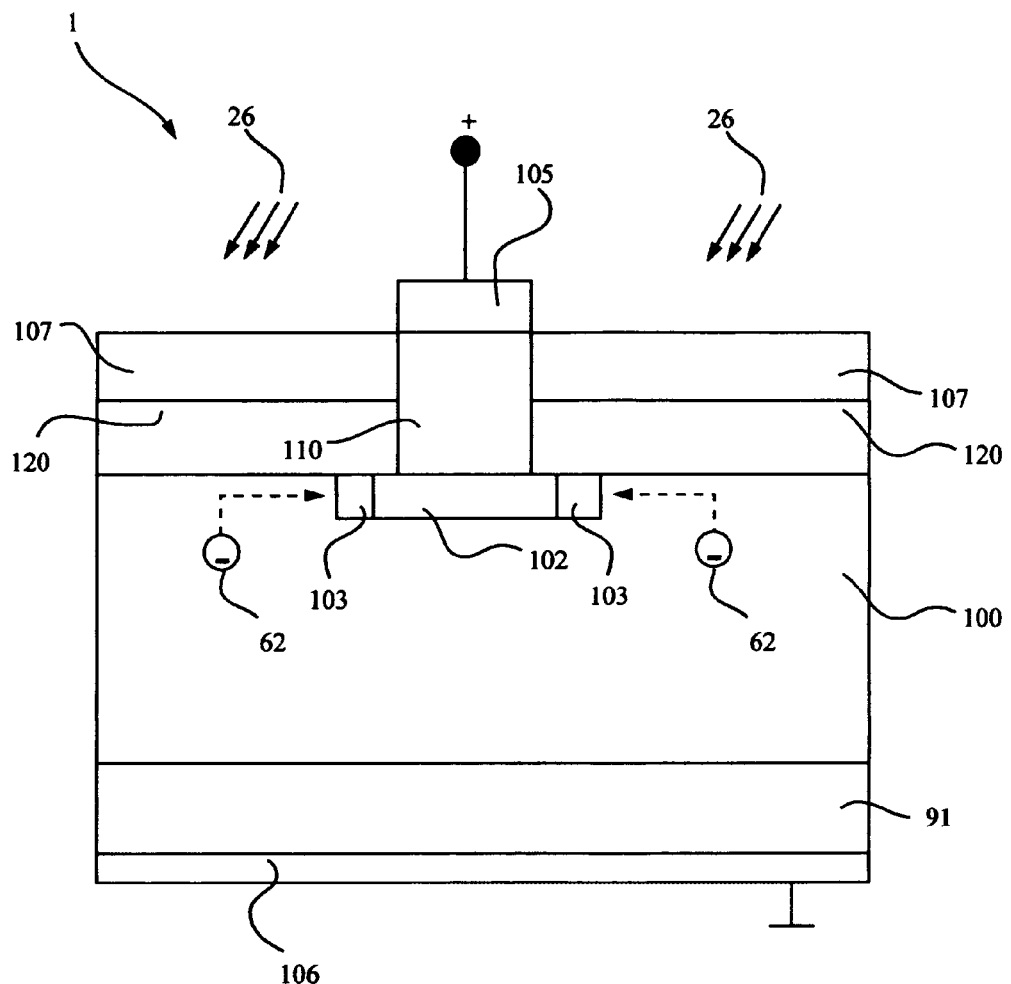
FIG. 22 shows a cross-sectional view of a lateral-direction avalanche amplifying structure with a blocking layer, in accordance with an embodiment of the present invention.
Figure 23:
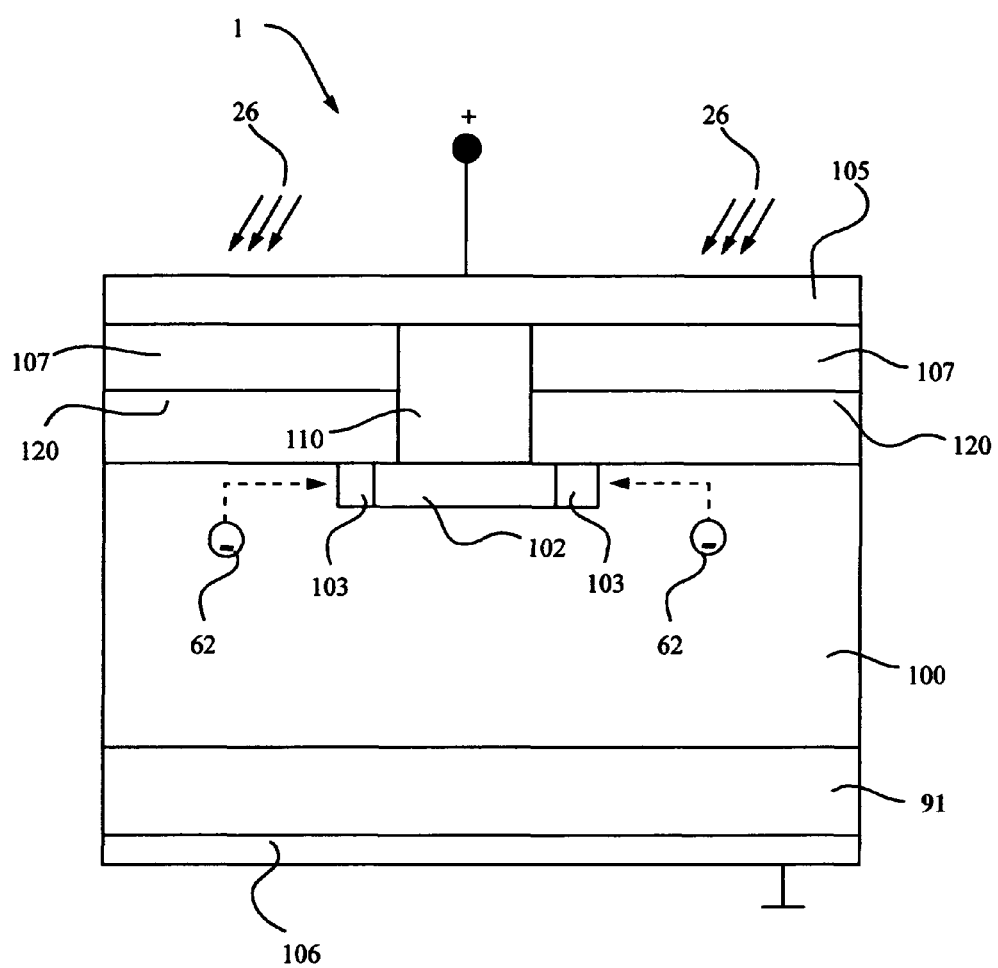
FIG. 23 shows a cross-sectional view of a lateral-direction avalanche amplifying structure with a buried channel and a single large electrode along the upper side of the device, in accordance with an embodiment of the present invention.
Figure 24:
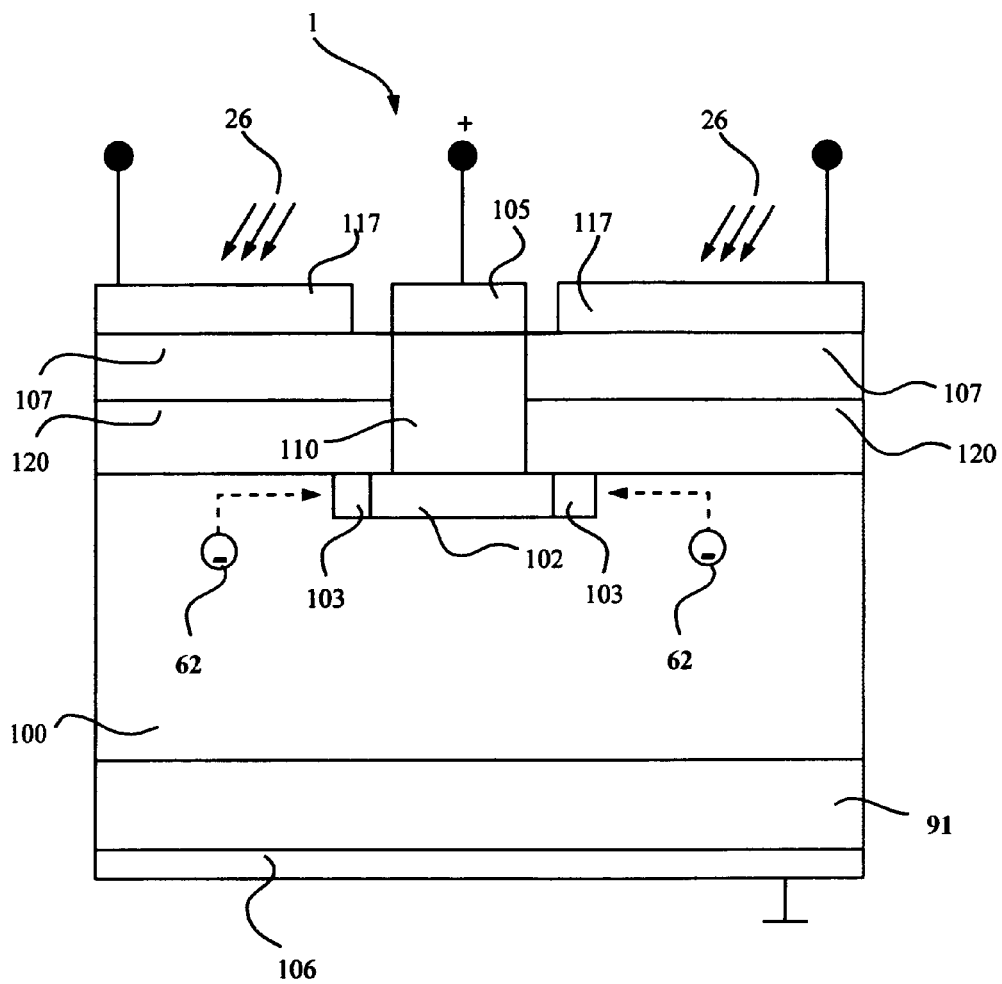
FIG. 24 shows a cross-sectional view of a lateral-direction avalanche amplifying structure with a buried channel and three electrodes, in accordance with an embodiment of the present invention.

Referring now to FIG. 22, a lateral-direction avalanche amplifying structure 1 with blocking layer is shown and described. The device is an alternate embodiment of the device in FIG. 16, wherein the blocking layer is a n-Si layer 120 disposed between the SiO$_2$ layer 107 and the p or p$^-$-Si layer 100. The n-Si layer 120 is preferred to be thin, typically 0.3 μm, with doping type opposite to that of p or p$^-$-Si layer 100. The p or p$^-$-Si layer 100 forms a buried channel under the Si—SiO$_2$ interface to improve the transport of photocarriers along the interface. The blocking layer is fabricated via methods understood in the art. An advantage of this device includes improved stability because the avalanche process is moved away from interface and injection of hot carriers into SiO$_2$ is thereby suppressed. FIG. 23 shows an alternate embodiment to this design wherein the transparent electrode 105 completely covers the p$^-$-Si layer 110 and SiO$_2$ layer 107. FIG. 24 shows an alternate embodiment to this design wherein the transparent electrode 105 separately contacts the p$^-$ Si layer 110 and a third electrode 117 separately contacts SiO$_2$ layer 107. Functionality of these devices is as described above for FIG. 16.

Figure 25:
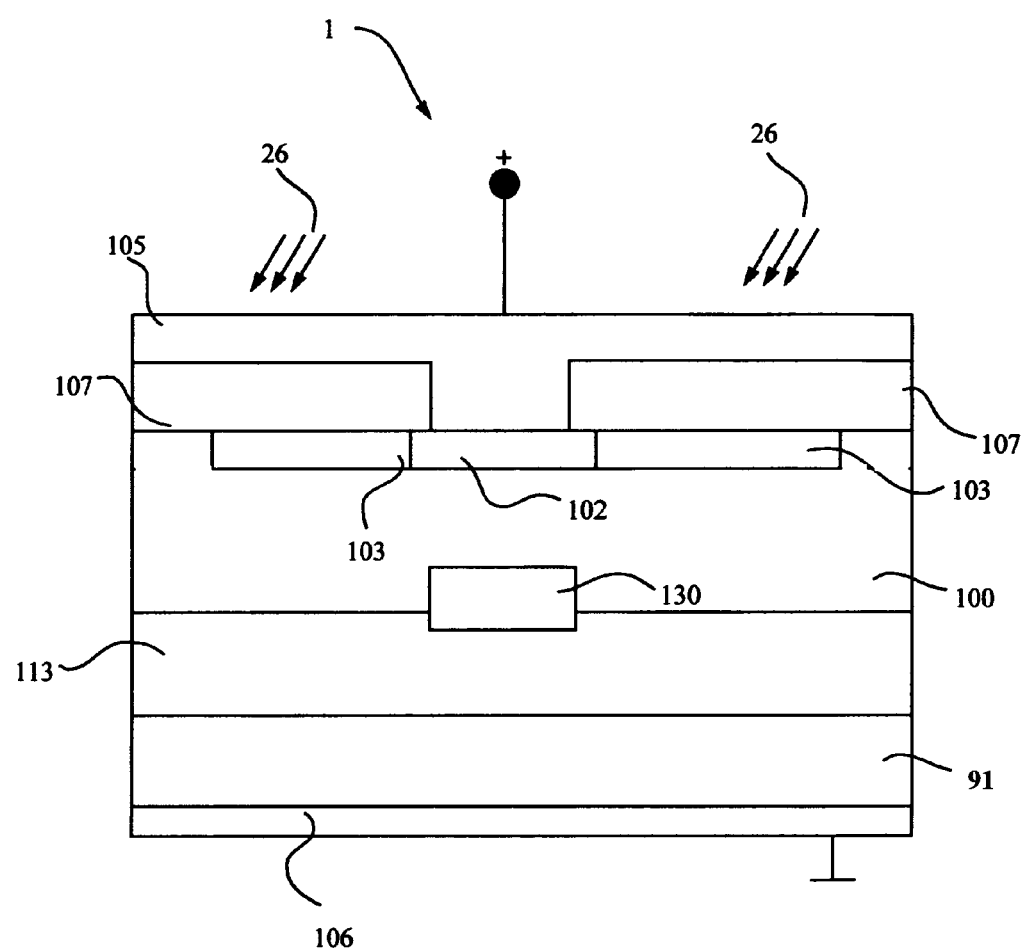
FIG. 25 shows a cross-sectional view of a lateral-direction avalanche amplifying structure with a hole integrator and a single large electrode along the upper side of the device, in accordance with an embodiment of the present invention.

Referring now to FIG. 25, a lateral-direction avalanche amplifying structure 1 with a hole integrator and a single electrode along one side of the device is shown and described. The device differs from the device in FIG. 21 in that the transparent electrode 105 now fills the volume occupied by the p--Si layer 110 and an i-Si layer 113 is provided between the p or p$^-$ Si layer 100 and the p$^+$-Si layer 91 (substrate). The p-Si layer 103 is wider than previous embodiments.

Figure 26:
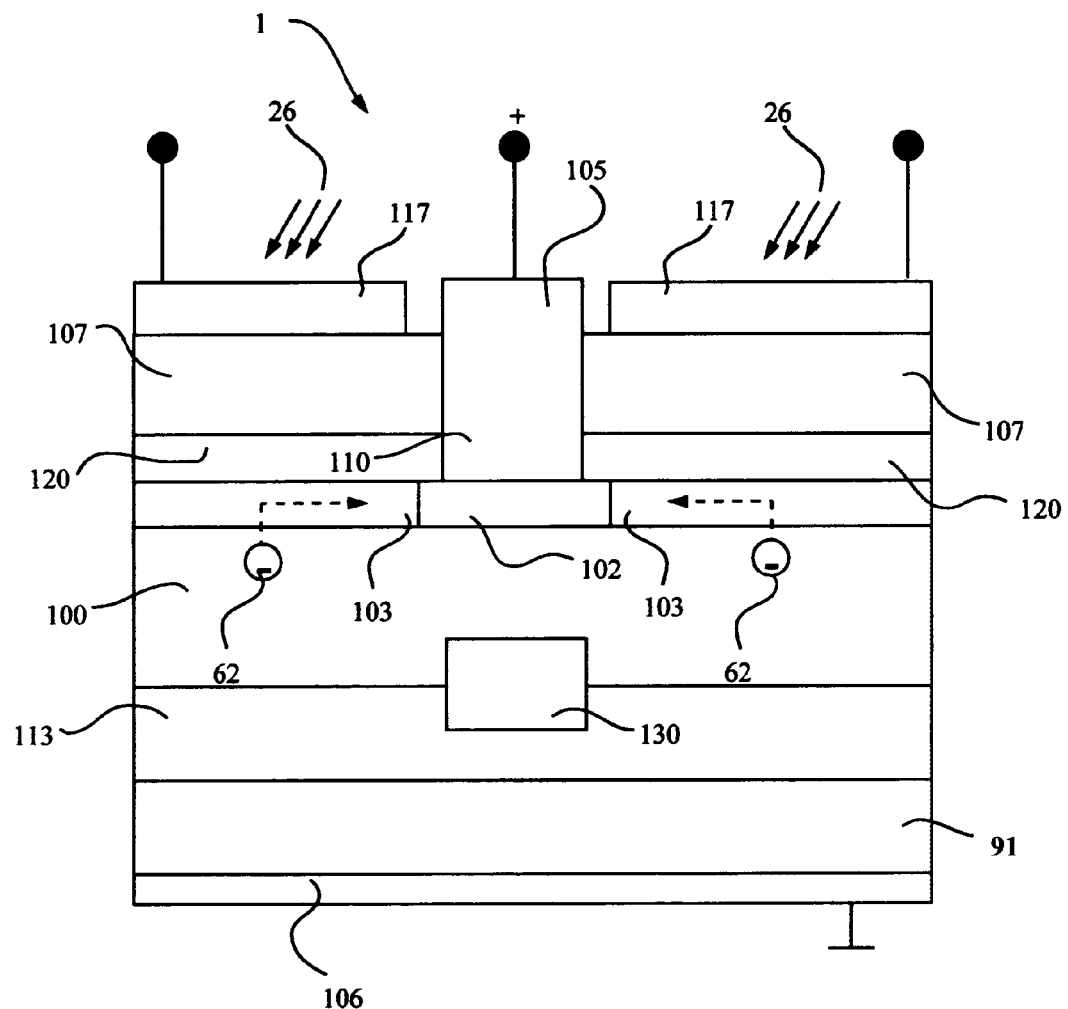
FIG. 26 shows a cross-sectional view of a lateral-direction avalanche amplifying structure with a buried channel, hole integrator, and three electrodes, in accordance with an embodiment of the present invention.
Figure 27:
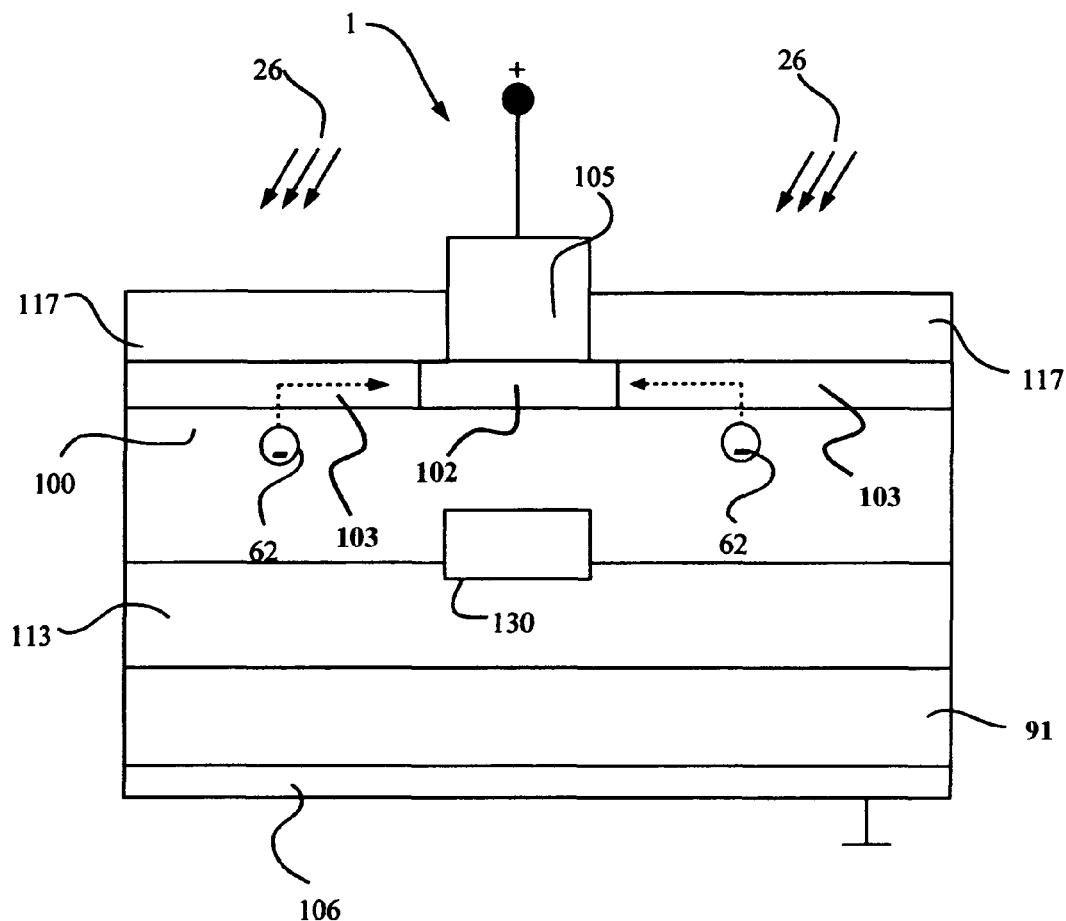
FIG. 27 shows a cross-sectional view of a lateral-direction avalanche amplifying structure with a hole integrator and a pair of electrodes oppositely disposed about the device, in accordance with an embodiment of the present invention.

Referring now to FIG. 26, a lateral-direction avalanche amplifying structure 1 with a blocking layer, hole integrator, and two electrodes along one side of the device is shown and describe. The device differs from the device in FIG. 24, wherein the transparent electrode 105 now fills the volume once occupied by the p$^-$-Si layer 110 (electron integrator), the p-Si layer 103 is wider, and a i-Si layer 113 (hole governor) and p$^+$-Si layer 130 are disposed between the p-Si layer 100 and the p$^+$-Si layer 91. FIG. 27 eliminates the electrode 117 and n-Si layer 120 shown in FIG. 26.

Single Channel Devices—Changeable Quantifier, Normal Bias

Figure 28A:
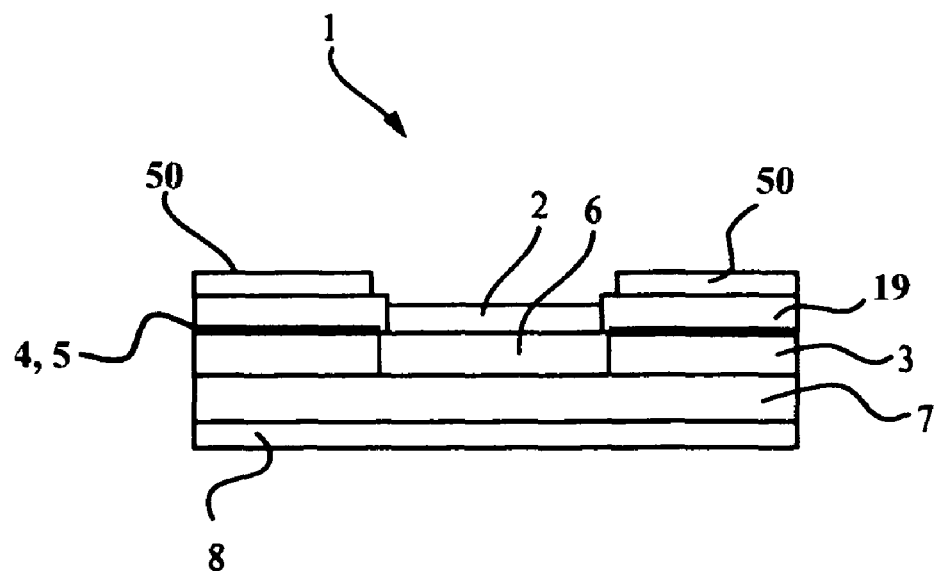
FIG. 28A-28B are schematic cross-section views for two illustrative embodiments of the present invention comprising an avalanche amplifying structure with a normal direction of avalanche, MIS-based with drain, and three electrodes showing the positional relationship of electrodes, avalanche region, quantifier, integrator, governor, substrate, and dielectric layer.
Figure 28B:
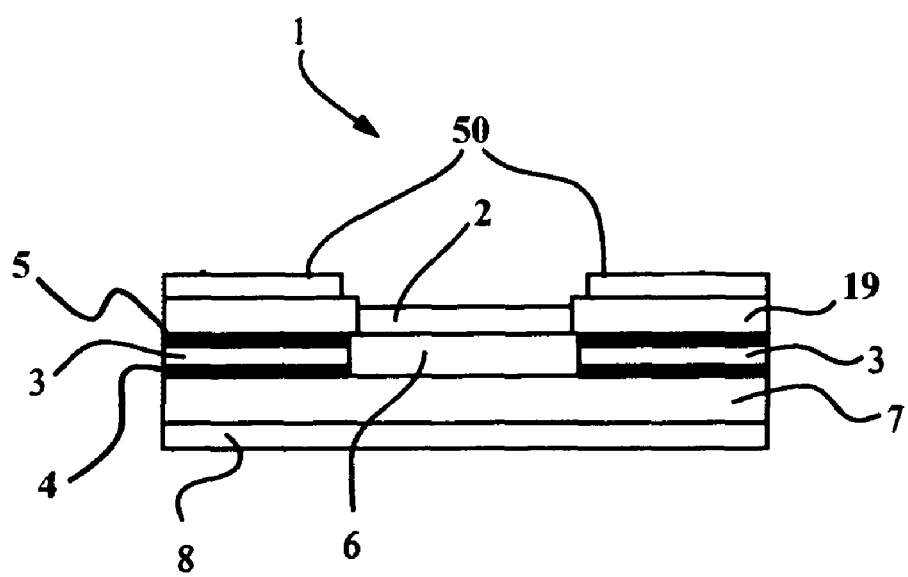

A variety of materials are applicable to layers and regions in FIGS. 28A-28B. For example, each layer may be composed of the same or different semiconductor materials, examples including Si, SiC, GaN, GaAs and GaP, which are doped to provide the desired electrical properties. In other embodiments, the governor 6 may be composed of a material having a band gap wider than that of the other layers. In yet other embodiments, the signal transport layer 27 may be composed of a material having a band gap narrower than the other layers. In still other embodiments, the first electrode 2 and/or second electrode 8 may be composed of a conductive metal or light transmissive and conductive material, examples including without limitation transparent ITO and Al-doped ZnO. Furthermore, layers and regions may include two or more layers arranged to form a laminated structure with or without inclusions or regions of yet other non-doped and doped semiconductor materials. Layers and devices may include planar and non-planar shapes. Likewise, the sectional views may represent structures of planar and/or diametric extent. The SiO$_2$ layer may be composed of other comparable materials.

Referring now to FIG. 28A, an avalanche amplifying structure 1 with a normal direction of avalanche, MIS-based with drain, and two electrodes is shown and described including a third electrode 50 contacting a dielectric layer 19, a first electrode 2 contacting a governor 6, an avalanche region 3, a substrate contacting both avalanche region 3 and governor 6, and an second electrode 8 contacting the substrate 7. The dielectric layer 19 contacts both avalanche region 3 and governor 6. The avalanche region 3 contacts the side periphery of the governor 6. The quantifier 4 and integrator 5 are provided at the interface between the dielectric layer 19 and avalanche region 3 when an electric potential is applied between the first and second electrodes 2, 8 and the Geiger (over breakdown) avalanche mode is created in the avalanche region 3, and the third electrode 50 with an applied voltage at which the charge stored on the integrator 5 drains through the governor 6 to the first electrode 2. FIG. 28B shows the device from FIG. 28A wherein the integrator 5 is provided at the interface between the dielectric layer 19 and the avalanche region 3 and the quantifier 4 is provided between the avalanche region 3 and the substrate 7.

Figure 29:
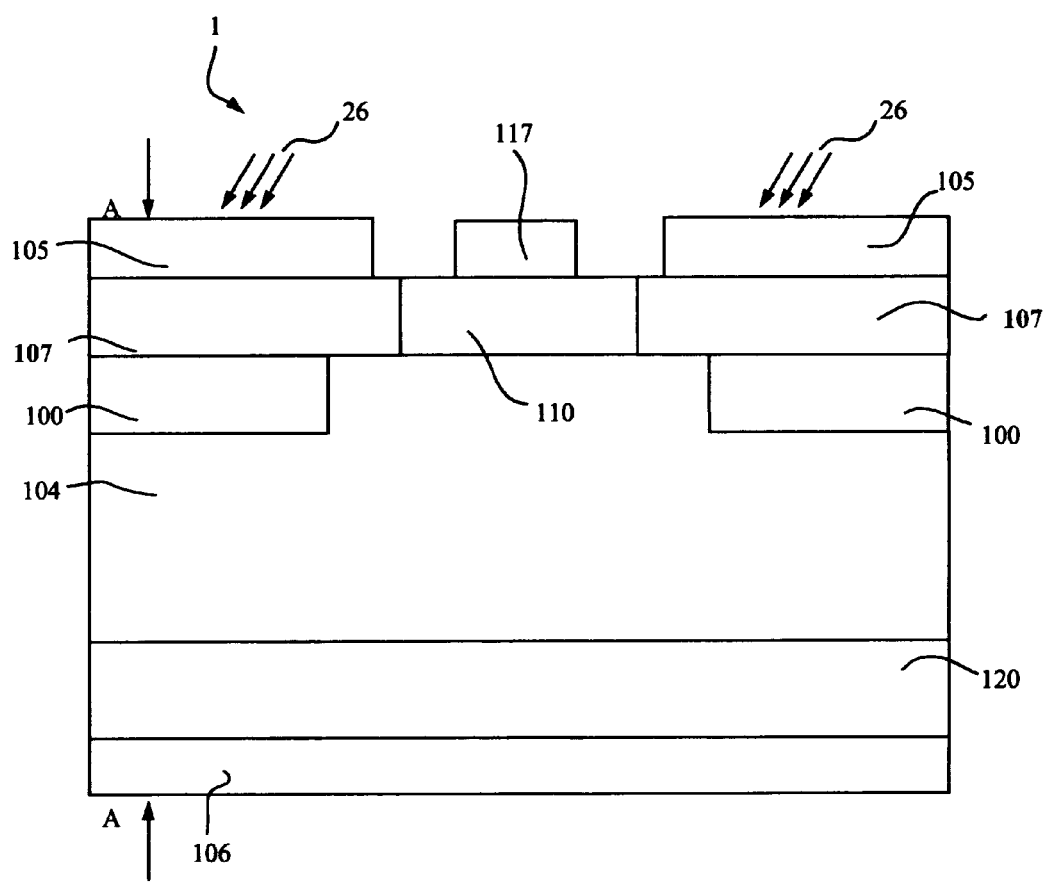
FIG. 29 shows a cross-sectional view of a lateral-direction avalanche amplifying structure with a normal direction of avalanche, MIS-based with drain, and three electrodes, in accordance with an embodiment of the present invention.
Figure 31:
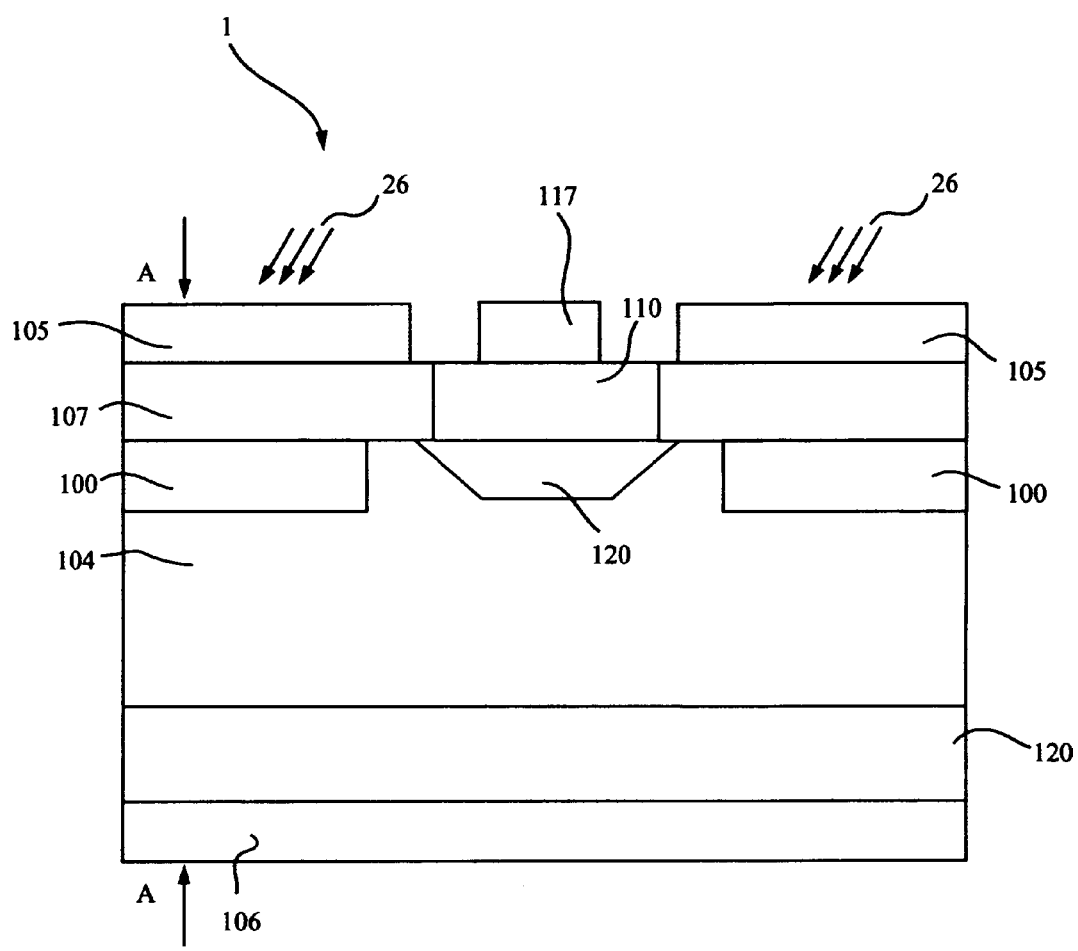
FIG. 31 shows a cross-sectional view of a lateral-direction avalanche amplifying structure with a normal direction of avalanche, MIS-based with drain, and three electrodes, in accordance with an embodiment of the present invention.

FIGS. 29 and 31 refer to specific embodiments of the illustrative devices.

Referring now to FIG. 29, the amplifying structure 1 with a normal direction of avalanche, MIS-based with drain, and electrodes is shown and described. The device includes a transparent electrode 105, an electrode 117, a SiO$_2$ layer 107, an i-Si layer 110, a p-Si layer 100, a p$^-$ Si layer 104 (epitaxial), a p$^+$ Si layer 120 (substrate), and an electrode 106. While the present device operates in the Geiger mode, it differs from the previous examples described above.

The p-Si layer 100, with an exemplary resistivity of 1 Ohm-cm, along with the SiO$_2$ layer 107 and the electrode 105 operate as a MIS structure which is fully depleted because the minority carriers drain current from p-Si layer 100 along the Si—SiO$_2$ interface to the i-Si layer 110 and then to electrode 117. Voltage to the electrode 105 should be sufficiently high to provide a Geiger mode avalanche in the p-Si layer 100. Voltage applied to electrode 117 should be sufficient to drain current from p-Si layer 100 to the i-Si layer 110, but smaller than is necessary for avalanche breakdown in the i-Si layer 110. Avalanche within the p$^-$-Si layer 104 is absent, even though it has a higher potential than p-Si layer 100, due to its lower doping. Contact between the electrode 117 and i-Si layer 110 is preferred to be non-injecting, thus including a Shottky barrier to block injection of electrons. In some embodiments, a thin n$^+$ layer may be provided along the top of i-Si layer 110 to block electron injection. The transparent electrode 105 may be composed of ITO or ZNO with a high conductivity. The electrodes 106 and 107 may be composed of a metal or transparent conductive material. The oxide thickness in the SiO$_2$ layer 107 is small, typically, 0.1 μm, to provide effective avalanche within the p-Si layer 100.

Figure 30A:
FIG. 30A shows a sequence of material layers corresponding to the structure of FIG. 29.
Figure 30B:
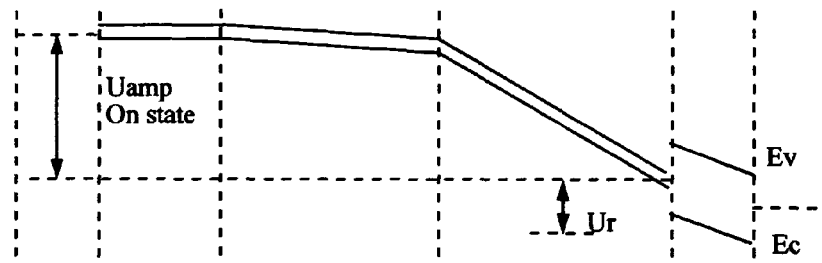
FIGS. 30B-30C depict energy band diagrams corresponding to the material layer structure shown in FIG. 30A during various operational conditions of the amplifier.
Figure 30C:
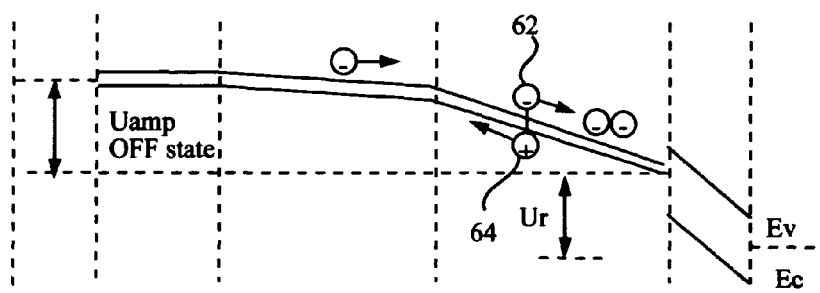

Referring now to FIGS. 30A-30C, FIG. 30A shows a sequence of material layers corresponding to the structure of FIG. 29 and FIGS. 30B-30C depict energy band diagrams corresponding to the material layer structure shown in FIG. 30A during various operational conditions of the amplifier.

Figure 30D:
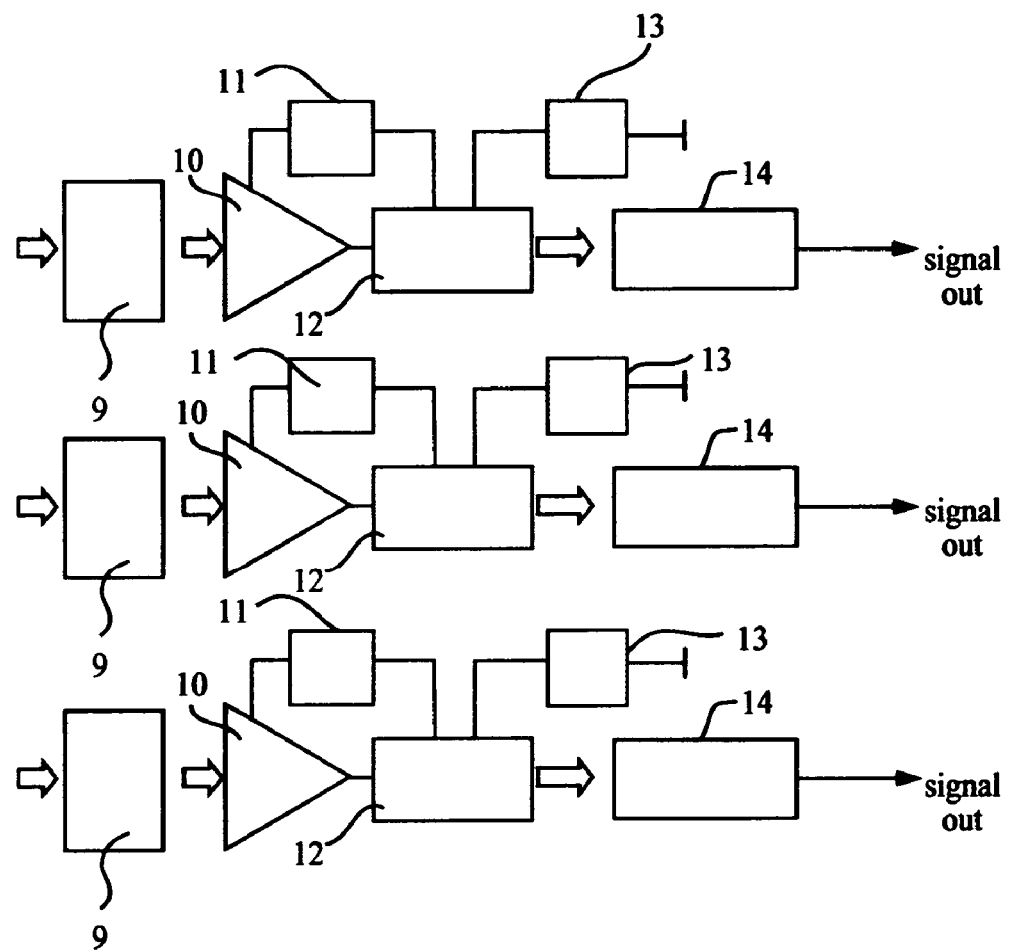
FIG. 30D depicts functional components of the avalanche amplifying structure shown in FIG. 29.

FIG. 30D graphically depicts the functional components of the avalanche amplifying structure shown in FIG. 29.

In the initial state, the electric field strength within the p-Si layer 100 is sufficient for impact ionization when a positive voltage is applied to transparent electrode 105. The normal operating voltage should exceed the breakdown voltage, thus initiating the Geiger mode.

During amplification, avalanche multiplication occurs near the Si—SiO$_2$ interface within the p-Si layer 100, as shown in FIG. 28C by the free carriers or electrons 62. The process is self-sustaining due to the avalanche multiplication, wherein the current filament with current density grows exponentially in time. Filament electrons are accumulated at the Si—SiO$_2$ interface. The mobility of these electrons is not high so they are accumulated locally, thus screening the electric field within the filament area and terminating the avalanche process. The Si—SiO$_2$ interface operates as a HF integrator with a time constant, defined by the mobility of electrons spreading along the interface.

After amplification, the initial electrons 62 result in a calibrated charge package or FIRST package, as shown in FIG. 30D. The appearance of this package at the interface results from the oxide capacitance and corresponds to the charge package at the electrode 105 (HF reader), where it may be detected.

After termination of the current filament, the resultant charge flow along the interface to the LF integrator and the region where the current filament occurred is restored to the initial state. The interface lead, also the HF governor, removes charge from the HF integrator with a delay sufficient to turn the threshold amplifier OFF. The Si—SiO$_2$ interface functions as the quantifier as it is defined by the field within the p-Si layer 100.

Each current filament occupies a rather small area, typically less than several square μm's. Therefore, several filaments may exist within the p-Si layer 100 simultaneously producing several charge packages. As such, the device operates as a multi-channel photon counter if the p-Si layer 100 is large enough in comparison to the charge spots resulting from the filaments.

Referring now to FIG. 31, the amplifying structure 1 with a normal direction of avalanche, MIS-based with drain, and electrodes is shown and described. In this embodiment, a n$^+$-Si layer 120 is provided immediately between the i-Si layer 110 and the p$^-$-Si layer 104, as compared to FIG. 29.

The p-Si layer 100, with an exemplary resistivity of 1 Ohm-cm, and SiO$_2$ layer 107 operate as a MIS structure which is fully depleted because the minority carriers drain current from the p-Si layer 100 along the Si—SiO$_2$ interface to the p$^+$-Si layer 120. In the absence of avalanche multiplication in the p-Si layer 100, current charging to the LF integrator (p$^+$-Si layer 120) is negligible and the LF integrator is in a steady-state due to the discharge current (both holes 64 and electrons 62) through the LF governor (i-Si layer 110). The charge-discharge mechanism of the LF integrator is the same as described for FIG. 9. The oxide thickness for the SiO$_2$ layer 107 is small, typically 0.1 μm, to provide effective avalanche within the p-Si layer 100.

Figure 32A:
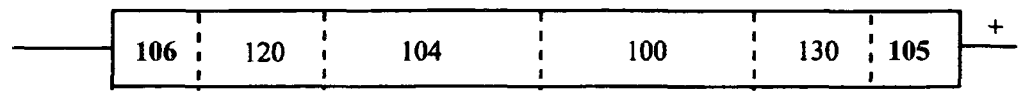
FIG. 32A shows a sequence of material layers corresponding to the structure of FIG. 31.
Figure 32B:
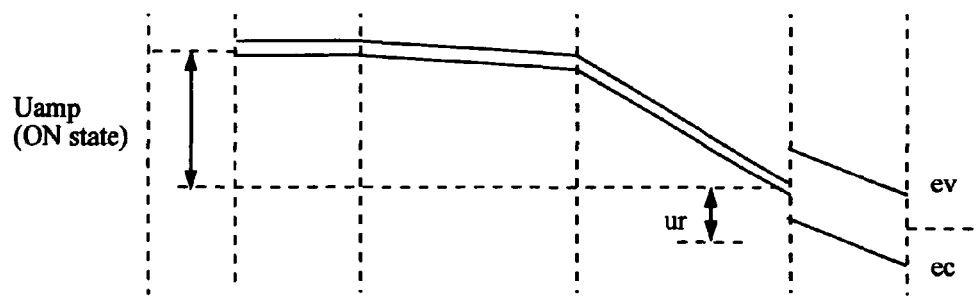
FIGS. 32B-32C depict energy band diagrams corresponding to the material layer structure shown in FIG. 32A during various operational conditions of the amplifier.
Figure 32C:
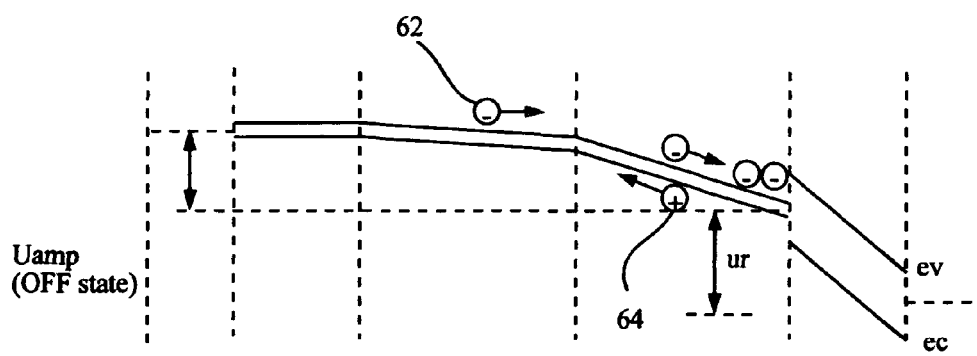
Figure 32D:
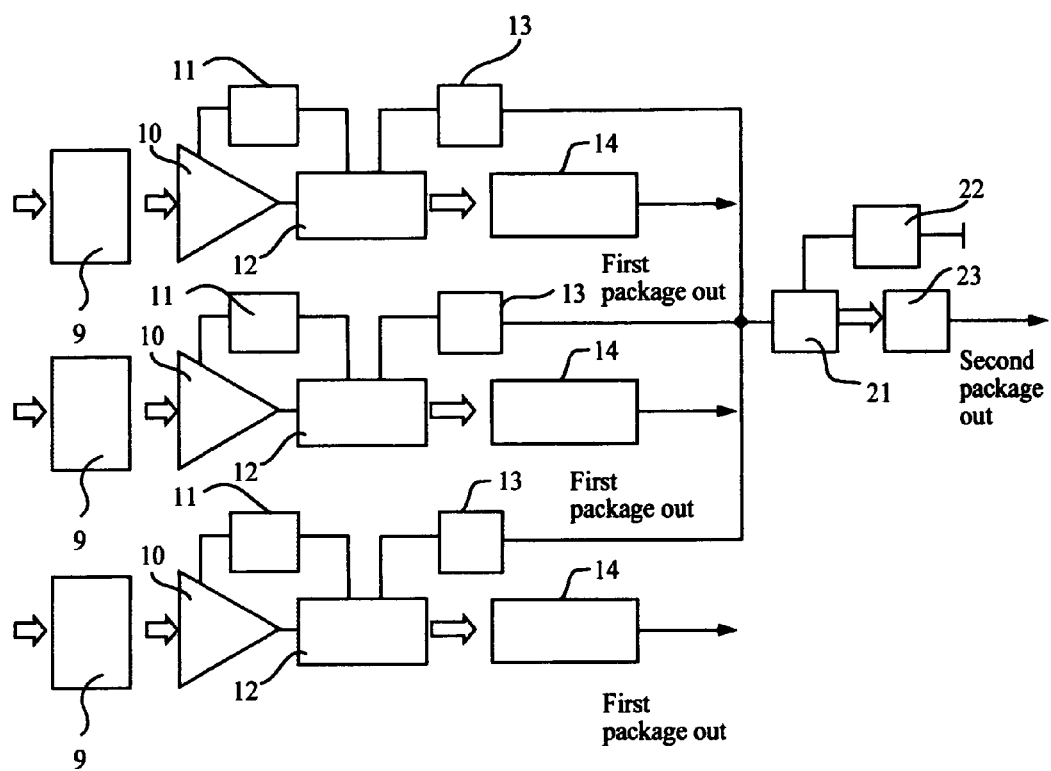
FIG. 32D depicts functional components of the avalanche amplifying structure shown in FIG. 31.

Referring now to FIGS. 32A-32C, FIG. 32A shows a sequence of material layers corresponding to the structure of FIG. 31 and FIGS. 32B-32C depict energy band diagrams corresponding to the material layer structure shown in FIG. 32A during various operational conditions of the amplifier. FIG. 32D graphically depicts the functional components of the avalanche amplifying structure shown in FIG. 31.

In the initial state, the electric field strength within the p-Si layer 100 is sufficient for impact ionization when a positive voltage is applied to transparent electrode 105. The normal operating voltage should exceed the breakdown voltage, thus initiating the Geiger mode.

During amplification, avalanche multiplication occurs near the Si—SiO$_2$ interface within the p-Si layer 100, as shown in FIG. 32C by the free carriers or electrons 62. The process is self-sustaining due to the avalanche multiplication, wherein the current filament with current density grows exponentially in time. The filament electrons are accumulated at the Si—SiO$_2$ interface. The mobility of these electrons is not high so they are accumulated locally, thus screening the electric field within the filament area and terminating the avalanche process. The Si—SiO$_2$ interface operates as a HF integrator with a time constant, defined by the mobility of electrons spreading along the interface.

After amplification, the initial electrons result in a calibrated charge package or FIRST package, as shown in FIG. 32D. The appearance of this package at the interface results from the oxide capacitance and corresponds to the charge package at the electrode 105 (HF reader), where it may be detected.

After termination of the current filament, the resultant charge flow along the interface to the n$^+$-Si layer 102 (LF integrator) and the region where the current filament occurred is restored to the initial state. The interface lead, also the HF governor, removes charge from the HF integrator with a delay sufficient to turn the threshold amplifier OFF. The Si—SiO$_2$ interface functions as the quantifier as it is defined by the field within the p-Si layer 100.

Each current filament occupies a rather small area, typically less than several square μm's. Therefore, several filaments may exist within the p-Si layer 100 simultaneously producing several FIRST charge packages. The capacity and discharge current of the LF integrator should be sufficient so that the LF integrator does not change its state after the collection of the FIRST charge package; however, the integrating-relaxation time of the LF integrator will be higher than that of HF integrator. The integration time is regulated by the voltage applied to the electrode 117. Several charge packages may be gathered within the integration time and the field is decreased in the p-Si layer 100 because charge is not removed from it. Thus, the LF integrator accumulates a SECOND charge package, also shown in FIG. 32D, consisting of a predefined number of FIRST packages.

As represented in FIG. 32D, several amplification channels may exist simultaneously within the p-Si layer 100 depending on the number of free carriers, each initiating the multiplication process where they hit. Three such processes or virtual channels are shown in FIG. 32D. Each virtual channel has the same set of functional elements, including reader 9, threshold amplifier 10, quantifier 11, HF (high frequency) integrator 12, HF governor 13, and HF reader 14. All HF governors within the virtual channels are connected to a single LF (low frequency) integrator 21 which accumulates FIRST packages after they are drained through the HF governors 13. This second stage of the discrete amplifier functional scheme, forming the SECOND calibrated packages, includes a LF integrator 21, a LF governor 22, a LF reader 23, all shown in FIG. 32D.

It is readily apparent that the described device allows one to detect a few-photon pulses as a digital or calibrated or signal on the electrode 117 while non-signal pulses caused by thermogeneration at the same electrode 117 are easily discriminated. Voltage regulation of the LF integration time at the electrode 117 allows the device to detect the pulse length of light with PET applicability. Also, one can count single-photon events with high time resolution by reading the signal at the electrode 105, with photon counter applicability.

Multi-Channel Devices

The single-channel avalanche amplifying devices described above may be integrated into a variety of multi-channel devices, providing full functionality for a photodetector with discrete amplification as described in U.S. Pat. No. 6,885,827. The following examples illustrate exemplary arrays and are in no manner intended to be limiting. Thus, the present invention includes all avalanche amplifying devices wherein the interface between two layers within a semiconductor laminate disposed between two or more electrodes function as either a quantifier, an integrator, or a quantifier and integrator either separately or in combination.

Figure 33:
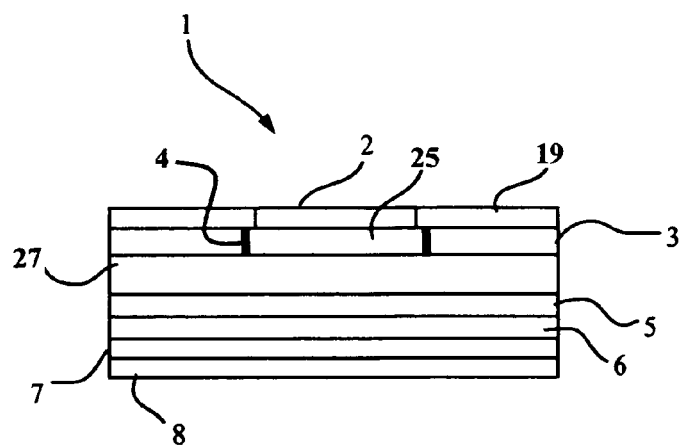
FIG. 33 is a schematic cross-sectional view for one exemplary embodiment of the present invention comprising an avalanche amplifying structure with a lateral direction of avalanche and hole integrator showing the positional relationship of electrodes, avalanche region, quantifier, integrator, governor, substrate, dielectric layer, and signal transport layer.

Referring now to FIG. 33, an avalanche amplifying structure 1 with a lateral direction of avalanche and hole integrator is shown and described. The device includes a first electrode 2, a contact layer 25, an avalanche region 3, a signal transport layer 27, a dielectric layer 19, an integrator 5, a governor 6, a substrate 7, and a second electrode 8.

Figure 34:
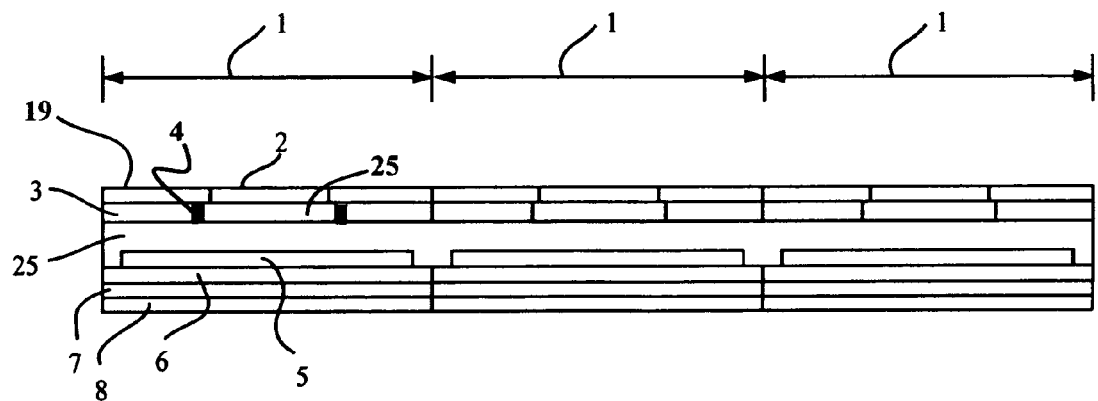
FIG. 34 is a schematic cross-sectional view of an exemplary multi-channel device composed of the lateral-direction avalanche amplifying structure shown in FIG. 33.

Referring now to FIG. 34, the structure from FIG. 33 is shown arranged to form an array comprised of three avalanche amplifying structures 1. For purposes of the present invention, array means two or more avalanche amplifying structures 1 arranged in a geometric pattern. Abutting pairs of avalanche amplifying structures 1 are preferred to be separated by a gap not less than 0.5 µm. The gap between integrators 5 may be filled with a semiconductor material which also composes the avalanche region, a lightly doped semiconductor material of same conductivity type as the integrator 5, or a dielectric material. It is preferred for avalanche amplifying structures 1 to be geometrically and dimensionally identical. Avalanche amplifying structures 1 may include a variety of regular and arbitrary shapes including triangles, rectangles, squares, polygons, and circles. In some embodiments, a third electrode 50 may be added to the structure as described above. First electrodes 2, second electrodes 8, and third electrodes 50, and substrates 7 may be comprised of separate single continuous sheets onto which other layers within the avalanche amplifying structures 1 are attached. First electrodes, second electrodes, and third electrodes may be composed of a transparent. In other embodiments, a dielectric layer 19, blocking layer 24, or conductive region 25 may be added to the structure to enhance the performance of the avalanche amplifying structure 1, as described above.

Figure 35:
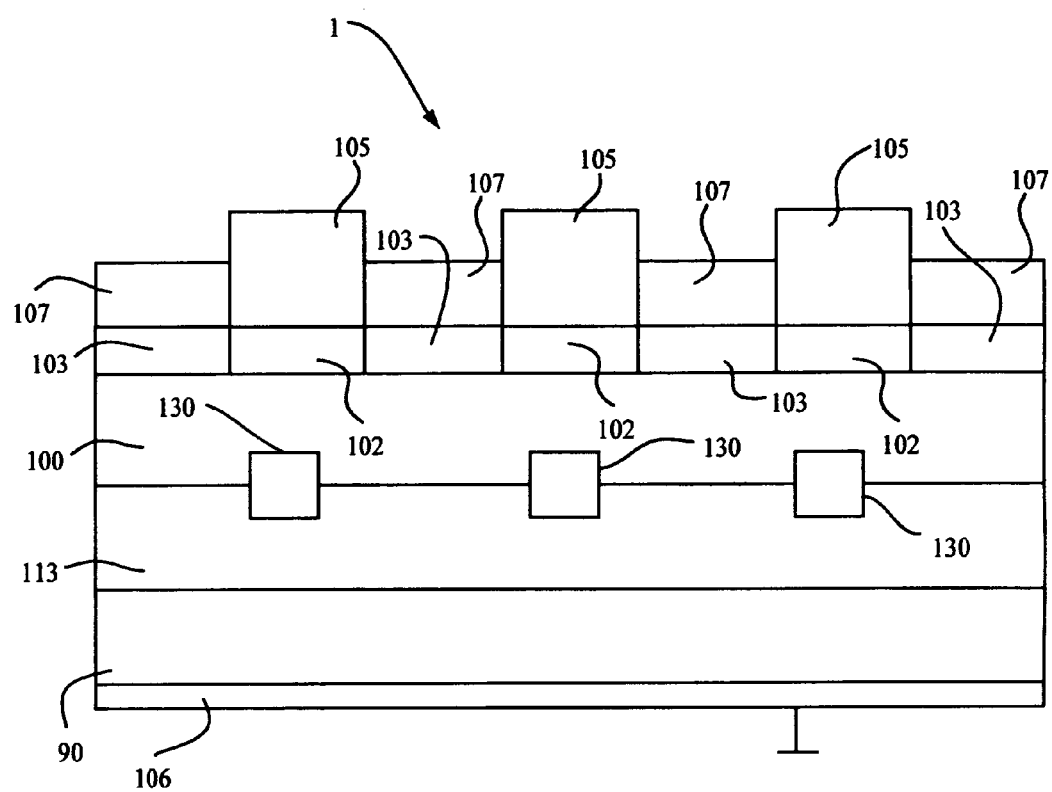
FIG. 35 shows a cross-sectional view of the multi-channel device shown in FIG. 34 composed of the lateral-direction avalanche amplifying structure shown in FIG. 33, in accordance with an embodiment of the present invention.

Referring now to FIG. 35, a schematic illustration of the multi-channel device in FIG. 34 including the single channel element from FIG. 33 is shown and described. The device includes three transparent electrodes 105, $n^+$-Si regions 102, a p-Si layer 103, $p^+$ regions 130, a p-Si layer 100, an i-Si layer 113, a $p^+$-Si layer 90, and an electrode 106. The device is fabricated on a silicon substrate with doping having a resistivity of 0.01 Ohm-cm, an orientation [100] and a thickness of 350 µm. The i-Si layer 113 is an epitaxial silicon without doping with a width so that the distance between $p^+$-Si regions 130 and $p^+$-Si layer 90 is 2 µm. The $p^+$-Si regions 130 include $p^+$ type doping is the first epitaxial layer and are dimensionally sized to be small. The second epitaxial layer or p-Si layer 100 has a width so that the distance between $n^+$-Si regions 102 and $p^+$-Si regions 130 is 5 µm. The p-Si layer 100 layer is p-doped with a resistance of 7-10 Ohm-cm. The third p-doped epitaxial layer has resistance of 1 Ohm-cm and a width of 2 µm. The $n^+$-Si layer 102 is fabricated by diffusion with a n-type impurity. The top surface is oxidized with a thickness of 0.5 µm, then ITO is deposited and etched (via lithography) to form electrodes 105. The electrodes 105 have a diameter of 2 µm and all are connected with each other and the metal contact plate by a transparent conductor 105. The metal electrode 106 is fabricated via methods understood in the art.

Channels may be packed to form a variety of patterns and shapes. The distance between channels is typically 10-14 µm. This distance may be in the range 8-30 µm in order to optimize quantum efficiency at a desired wavelength, timing resolution, and minimize channel interaction or cross-talk. Lower interaction is achieved with larger distances; however, larger distances decrease the quantum efficiency. Thus, the optimum distance depends on end use of the device.

Figure 36:
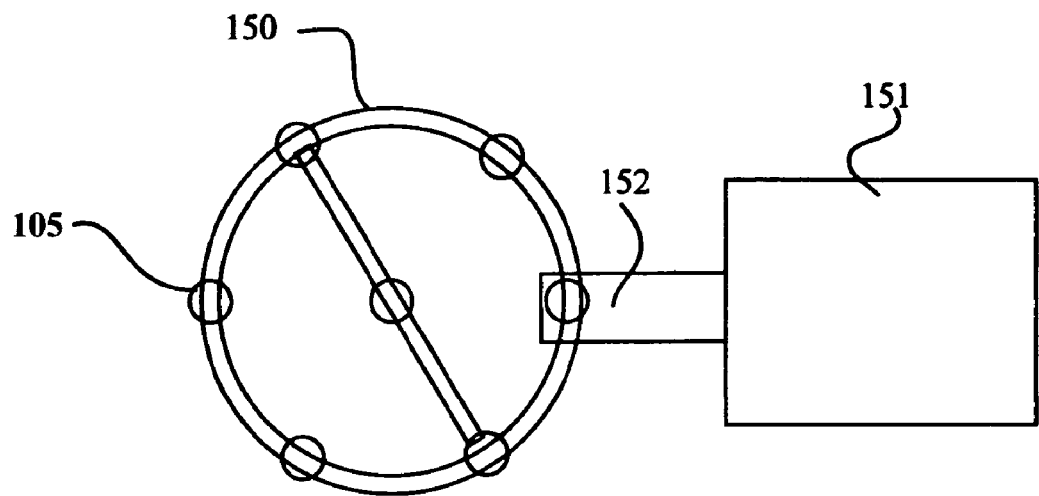
FIG. 36 is a top plan view of a multi-channel device shown in FIG. 37, in accordance with an embodiment of the present invention.
Figure 37:
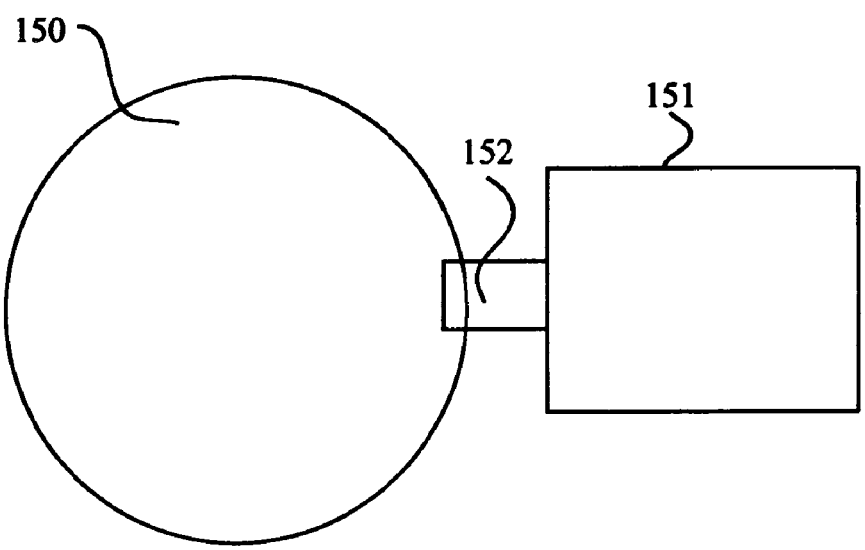
FIG. 37 is a top plan view of a multi-channel device with a single electrode, in accordance with an embodiment of the present invention.

FIG. 36 shows an exemplary top plan view of a multi-channel device wherein seven transparent electrodes 105 are disposed about a device having a transparent cover 150. A pair of wires 152 from the device to a contact plate 151 is shown so as to communicate signals to a recording device. FIG. 37 shows a device having a single transparent cover 150.

Referring now to FIGS. 38A-38E, several additional exemplary multi-channel devices are shown and described.

Figure 38A:
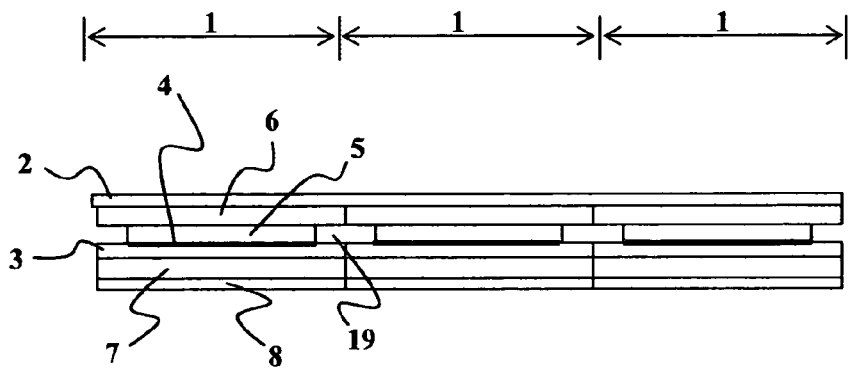
FIGS. 38A-38E are cross-sectional views of several exemplary multi-channel devices, in accordance with several embodiments of the present invention.

In FIG. 38A, the multi-channel device is composed of three avalanche amplifying structures 1 with a normal direction of avalanche, as provided in FIG. 7A above. The avalanche amplifying structures 1 include a first electrode 2, a governor 6, an integrator 5, a quantifier 4, an avalanche region 3, a substrate 7, and a second electrode 8 arranged in the order described. Individual integrators 5 and quantifiers 4 are separated by a distance not less than 0.5 µm. The space between integrators 5 includes a dielectric layer 19 composed of a semiconductor material, preferably lightly doped, of which the avalanche region 3 is composed. The integrators 5 and quantifiers 4 are preferred to be equidistant from each other having a distance not less than 0.5 µm. Furthermore, the integrators 5 and quantifiers 4 may be shaped in the form of a regular polygon, a square, a hexagon, or a circle. The first electrodes 2 may be disposed over the whole working area of the multi-channel device. The first electrode may be a mesh electrode which contacts the governor 6 above all of the individual integrators 5.

Figure 38B:
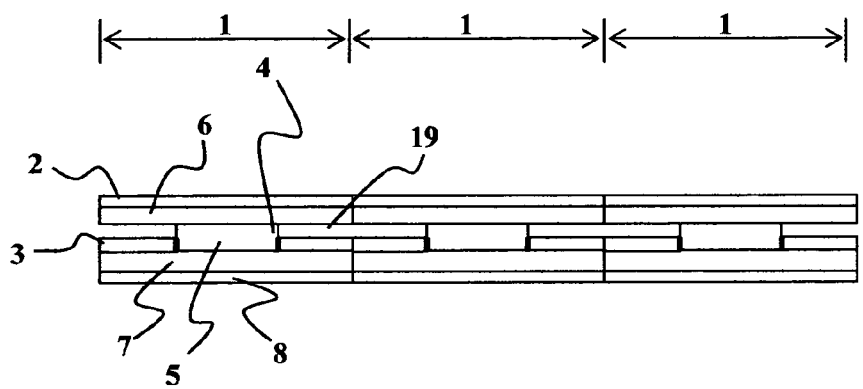

In FIG. 38B, the multi-channel device is composed of three avalanche amplifying structures with a lateral direction of avalanche, as provided in FIG. 15D. The avalanche amplifying structures 1 include a first electrode 2, a governor 6, an integrator 5, a substrate 7 and a second electrode 8, arranged in the order described. The integrator 5 is disposed within a hole along the avalanche region 3 so that contact between the two elements provides a ring-shaped quantifier 4. First electrode 2, second electrode 8, integrators 5 and governor 6 are separated from other each by a distance not less than 0.5 µm. The space between integrators 5 includes a dielectric layer 19 composed of a semiconductor material, preferably lightly doped, of which the avalanche region 3 is composed. The integrators 5 and quantifiers 4 are preferred to be equidistant from each other having a distance not less than 0.5 µm. The first electrodes 2 may include a solid electrode which covers the entire working area of the structure. Likewise, it is possible for the first electrodes 2 to be composed of a mesh electrode which provides electrical contact with the governor 6 above the individual integrators 5. The governor 6 may be disposed exclusively under the mesh structure of the first electrode 2. The integrators 5 may be spaced equidistant from each other having a distance no less than 0.5 µm. The integrators 5 and quantifiers 4 may be shaped in the form of a regular polygon, a square, a hexagon, or a circle.

Figure 38C:
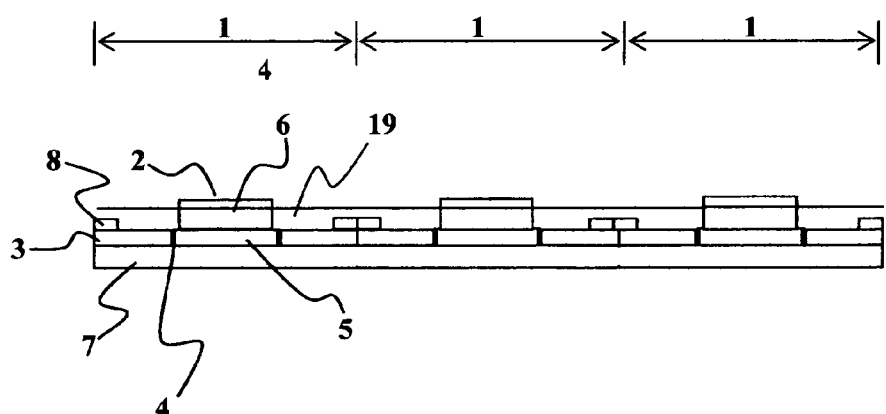

In FIG. 38C, the multi-channel device is composed of three avalanche amplifying structures 1 with a lateral direction of avalanche, as provided in FIG. 15C above. The avalanche amplifying structures 1 include a first electrode 2, a governor 6, an integrator 5, an avalanche region 3, and a substrate 7, arranged in the order described. The second electrode 8 is a ring-shaped structure which contacts the avalanche region 3 opposite of the substrate 7. The quantifier 4 is vertically disposed and between the integrator 5 and avalanche region 3 so that the contact region between the two elements provides a ring-shaped quantifier 4. The second electrode 8 is a mesh-type element so that its electric contact with the governor 6 and integrator 5 is avoided. The avalanche regions 3 and second electrodes 8 are covered by a dielectric layer 19 so that the first electrode 2 electrically contacting the governor 6 within each avalanche amplifying structure 1 has no electrical contact with the second electrode 8, avalanche region 3, and integrator 5.

Figure 38D:
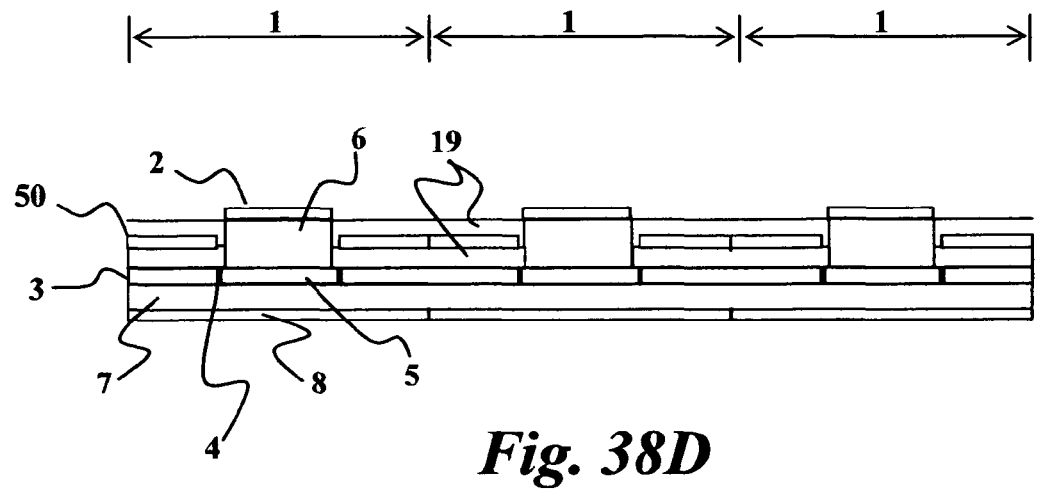

In FIG. 38D, the multi-channel device is composed of three avalanche amplifying structures 1 with a lateral direction of avalanche. The avalanche amplifying structures 1 include a first electrode 2, a governor 6, an integrator 5, a substrate 7, and a second electrode 8, arranged in the order described. The quantifier 4 is vertically disposed and between the integrator 5 and avalanche region 3 which surrounds the integrator 5 so that the contact region between the two elements provides a ring-shaped quantifier 4. A dielectric layer 19 is provided between a third electrode 50 and the avalanche region 3. A second dielectric layer 19 is also provided above the third electrode 50 and contacts the governors 6. The dielectric layers 19 electrically isolate the first electrode 2 and third electrode 50 from elements composing the structure. The third electrode 50 does not contact the governors 6. Integrators 5 and governors 6 are equidistance from each other at a distance no less than 0.5 μm.

Figure 38E:
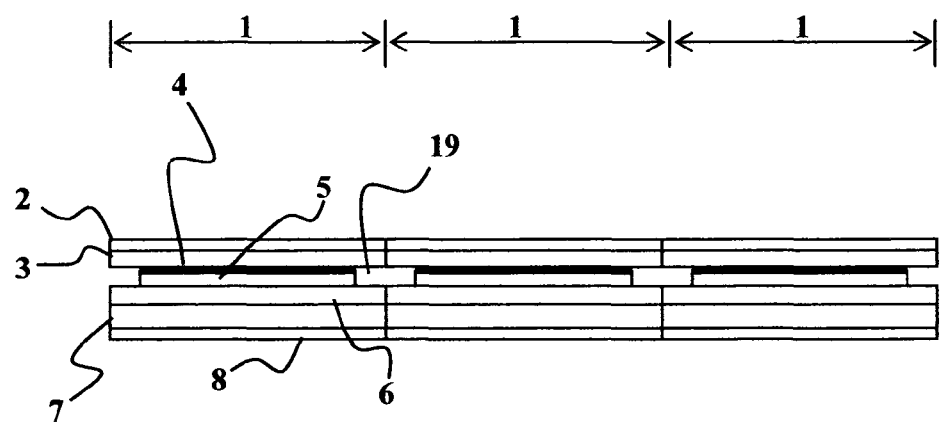

In FIG. 38E, the multi-channel device is composed of three avalanche amplifying structures 1 with a normal direction of avalanche, as provided in FIG. 1. The avalanche amplifying structures 1 include a first electrode 2, an avalanche region 3, a quantifier 4 disposed between the interface of the avalanche region 3 and integrator 5, an integrator 5, a governor 6, a substrate 7, and a second electrode 8, arranged in the order described. First electrode 2, second electrode 8, integrators 5 and governor 6 are separated from other each by a distance not less than 0.5 μm. The space between integrators 5 includes a dielectric layer 19 composed of a semiconductor material, preferably lightly doped, of which the avalanche region 3 is composed. The integrators 5 and quantifiers 4 are preferred to equidistant from each other having a distance not less than 0.5 μm. The first electrodes 2 may include a solid electrode which covers the entire working area of the structure. Likewise it is possible for the first electrodes 2 to be composed of a mesh electrode which provides electrical contact with the governor 6 above the individual integrators 5. The governor 6 may be disposed exclusively under the mesh structure of the first electrode 2. The integrators 5 may be spaced equidistant from each other having a distance no less than 0.5 μm. The integrators 5 and quantifiers 4 may be shaped in the form of a regular polygon, a square, a hexagon, or a circle.

The description above indicates that a great degree of flexibility is offered in terms of the present invention. Although the present invention has been described in considerable detail with reference to certain preferred versions thereof, other versions are possible. Therefore, the spirit and scope of the appended claims should not be limited to the description of the preferred versions contained herein.

What is claimed is:

1. An avalanche amplifying structure operating in the Geiger mode comprising:
    (a) a heavily doped substrate;
    (b) a laminated semiconductor structure including:
        (i) an avalanche region with conductance opposite said substrate;
        (ii) an integrator layer which accumulates a signal charge comprised of a heavily doped material with conductance same as said substrate, said integrator layer contacting said avalanche region along an interface which functions as a quantifier to regulate the avalanche process; and
        (iii) a governor layer which drains said integrator and controls said quantifier, said governor layer contacting said integrator layer opposite said avalanche region, said governor layer contacting said substrate;
    (c) a first electrode communicating with said avalanche region opposite said integrator; and
    (d) a second electrode communicating with said substrate opposite said governor layer.

2. The avalanche amplifying structure of claim 1, wherein said governor is comprised of a high impedance material.

3. The avalanche amplifying structure of claim 1, wherein said governor has a first energy barrier for a plurality of first carriers which accumulate on said integrator layer for transport into said governor layer from the direction of said integrator and a second energy barrier for a plurality of second carriers of conductivity type opposite said first carriers for transport into said governor from the direction of said substrate.

4. The avalanche amplifying structure of claim 1, wherein said governor has a high impedance in the direction normal to the governor layer.

5. The avalanche amplifying structure of claim 1, wherein said governor is comprised of a low doped material.

6. The avalanche amplifying structure of claim 1, wherein said substrate, said avalanche region, said integrator layer, and said governor layer are comprised of the same semiconductor material.

7. The avalanche amplifying structure of claim 1, wherein said substrate, said avalanche region, and said integrator layer are comprised of the same semiconductor material and said governor layer is comprised of a material having a band-gap which is wider than said avalanche region, said integrator layer and said substrate.

8. The avalanche amplifying structure of claim 1, further comprising:
    (e) an insulator having at least one opening that allows said first electrode to contact said avalanche region.

9. The avalanche amplifying structure of claim 8, further comprising:
    (f) a heavily doped region having the same conductance as said avalanche region disposed within said avalanche region between said avalanche region and said insulator at each said opening so as to prevent direct electrical contact between said avalanche region and said first electrode.

10. The avalanche amplifying structure of claim 9, further comprising:
    (g) a second governor comprised of a high-impedance semiconductor material between said first electrode and said heavily doped region and residing within said opening, a second integrator formed at the interface between said avalanche region and said second governor.

11. The avalanche amplifying structure of claim 9, further comprising:
    (g) a buried layer comprised of a semi-conductor material having the same conductance as said substrate and adjacent to said heavily doped regions.

12. The avalanche amplifying structure of claim 9, further comprising:

(g) a semiconductor layer with lower mobility for holes in the lateral direction, said semiconductor layer comprised of a doped material having a conductance opposite said substrate and disposed along said avalanche region adjacent to said heavily doped regions.

13. The avalanche amplifying structure of claim 1, further comprising:
(e) a signal transport layer comprised of a low-doped semiconductor material having a conductance similar to said avalanche region and disposed between and contacting said first electrode and said avalanche region, said signal transport layer generating a plurality of free charge carriers and transporting said free charge carriers into said avalanche region.

14. The avalanche amplifying structure of claim 13, wherein said substrate, said avalanche region, said integrator layer, said governor layer and said transport layer are comprised of the same semiconductor material.

15. The avalanche amplifying structure of claim 13, wherein said substrate, said avalanche region, said integrator layer, said governor layer and said transport layer are comprised of Si.

16. The avalanche amplifying structure of claim 13, wherein said substrate, said avalanche region, said integrator layer, said governor layer and said transport layer are comprised of SiC, GaN, GaAs or GaP.

17. The avalanche amplifying structure of claim 13, wherein said substrate, said avalanche region, said integrator layer, and said governor layer are comprised of the same semiconductor material and said signal transport layer is comprised of a material having a band gap which is narrower than said substrate, said avalanche region, said integrator layer, and said governor layer.

18. An avalanche amplifying structure operating in the Geiger mode comprising:
(a) a heavily doped substrate;
(b) a laminated semiconductor structure including:
(i) a governor layer; and
(ii) an avalanche region with conductance opposite said substrate, said avalanche region contacting said governor layer along a first interface which functions as an integrator, said avalanche region contacting said substrate opposite said governor layer along a second interface which functions as a quantifier to regulate the avalanche process, said integrator accumulates a signal charge, said governor drains said integrator and controls said quantifier;
(c) a first electrode communicating with said governor layer opposite said avalanche region; and
(d) a second electrode communicating with said substrate opposite said substrate.

19. The avalanche amplifying structure of claim 18, wherein said governor is comprised of a high impedance material.

20. The avalanche amplifying structure of claim 18, wherein said governor has a first energy barrier for a plurality of first carriers which accumulate on said integrator layer for transport into said governor layer from the direction of said integrator and a second energy barrier for a plurality of second carriers of conductivity type opposite said first carriers for transport into said governor from the direction of said substrate.

21. An avalanche amplifying structure operating in the Geiger mode comprising:
(a) a heavily doped substrate;
(b) a laminated semiconductor structure including:
(i) an avalanche region contacting said substrate; and
(ii) an governor layer contacting said avalanche region opposite said substrate along an interface which functions as a quantifier to regulate the avalanche process and functions as an integrator to accumulate a signal charge, said avalanche region and said governor layer drains said integrator and controls said quantifier;
(c) a first electrode communicating with said governor layer opposite said avalanche region; and
(d) a second electrode communicating with said substrate opposite said avalanche region.

22. The avalanche amplifying structure of claim 21, wherein said governor is comprised of a high impedance material.

23. The avalanche amplifying structure of claim 21, wherein said governor has a first energy barrier for a plurality of first carriers which accumulate on said integrator layer for transport into said governor layer from the direction of said integrator and a second energy barrier for a plurality of second carriers of conductivity type opposite said first carriers for transport into said governor from the direction of said first electrode.

24. The avalanche amplifying structure of claim 21, wherein said interface has limited conductance parallel to the plane of said substrate.

* * * * *